(12) United States Patent
Hong et al.

(10) Patent No.: US 11,647,625 B2
(45) Date of Patent: May 9, 2023

(54) MEMORY DEVICE HAVING A CHANNEL PROVIDED ON A MEMORY UNIT

(71) Applicant: SAMSUNG ELECTRONICS CO., LTD., Suwon-si (KR)

(72) Inventors: Jaeho Hong, Hwaseong-si (KR); Kyunghwan Lee, Seoul (KR); Hyuncheol Kim, Seoul (KR); Huijung Kim, Seongnam-si (KR); Hyunmog Park, Seoul (KR); Kiseok Lee, Hwaseong-si (KR); Minhee Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 154 days.

(21) Appl. No.: 17/191,308

(22) Filed: Mar. 3, 2021

(65) Prior Publication Data
US 2022/0028859 A1 Jan. 27, 2022

(30) Foreign Application Priority Data
Jul. 22, 2020 (KR) .......................... 10-2020-0091255

(51) Int. Cl.
*H01L 27/108* (2006.01)
*G11C 5/06* (2006.01)
*H01L 29/24* (2006.01)

(52) U.S. Cl.
CPC .......... *H01L 27/1082* (2013.01); *G11C 5/063* (2013.01); *H01L 27/10858* (2013.01); *H01L 27/10873* (2013.01); *H01L 27/10885* (2013.01); *H01L 27/10888* (2013.01); *H01L 27/10891* (2013.01); *H01L 29/24* (2013.01)

(58) Field of Classification Search
CPC .............. H01L 27/108; H01L 27/1082; H01L 27/10858; H01L 27/10885; H01L 27/10888; H01L 27/10891; H01L 29/24; G11C 5/063
USPC ......................................................... 257/296
See application file for complete search history.

(56) References Cited

U.S. PATENT DOCUMENTS

| 8,274,106 | B2 | 9/2012 | Abbott et al. |
| 9,698,272 | B1 | 7/2017 | Ikeda et al. |
| 9,806,082 | B2 | 10/2017 | Tanaka et al. |
| 9,842,839 | B1 * | 12/2017 | Sills ................. H01L 21/31144 |
| 2019/0067375 | A1 | 2/2019 | Karda et al. |
| 2019/0237581 | A1 | 8/2019 | Saito et al. |

(Continued)

FOREIGN PATENT DOCUMENTS

| TW | 201145497 A | 12/2011 |
| TW | 201232701 A | 8/2012 |
| TW | 202011571 A | 3/2020 |

OTHER PUBLICATIONS

Communication dated Oct. 29, 2021 issued by the Taiwanese Patent Office in Taiwanese Application No. 110115023.

*Primary Examiner* — Hoai V Pham
(74) *Attorney, Agent, or Firm* — Sughrue Mion, PLLC

(57) ABSTRACT

A memory device is provided. The memory device includes: a substrate; a memory unit provided on the substrate; a channel provided on the memory unit; a word line surrounded by the channel and extending in a first horizontal direction; a gate insulating layer interposed between the channel and the word line; and a bit line contacting an upper end of the channel and extending in a second horizontal direction that crosses the first horizontal direction.

20 Claims, 95 Drawing Sheets

(56) References Cited

U.S. PATENT DOCUMENTS

| | | |
|---|---|---|
| 2019/0295626 A1 | 9/2019 | Ikeda et al. |
| 2019/0296155 A1 | 9/2019 | Sawabe et al. |
| 2020/0098930 A1 | 3/2020 | Le et al. |

* cited by examiner

MEMORY DEVICE HAVING A CHANNEL PROVIDED ON A MEMORY UNIT

CROSS-REFERENCE TO RELATED APPLICATION

This application is based on and claims priority under 35 U.S.C. § 119 to Korean Patent Application No. 10-2020-0091255, filed on Jul. 22, 2020, in the Korean Intellectual Property Office, the disclosure of which is incorporated by reference herein in its entirety.

BACKGROUND

Devices, methods and systems consistent with example embodiments relate to a memory device and a semiconductor device including a vertical transistor.

A memory device may include a plurality of memory cells. As the sizes of electronic devices are reduced, an increase in the degree of integration of the memory device is required. To provide the increased integration, the size of the memory cells needs to be reduced. Each of the memory cells may include a selection unit and a memory unit. The selection unit may include a transistor. A size of a transistor having a planar (2D) structure may restrict a reduction in the size of a memory cell.

SUMMARY

One or more example embodiments provide a highly integrated memory device including a vertical transistor.

According to an aspect of an example embodiment, there is provided a memory device, the memory device including a substrate; a memory unit provided on the substrate; a channel provided on the memory unit; a word line surrounded by the channel and extending in a first horizontal direction; a gate insulating layer interposed between the channel and the word line; and a bit line contacting an upper end of the channel and extending in a second horizontal direction that crosses the first horizontal direction.

According to an aspect of an example embodiment, there is provided a memory device, the memory device including: a substrate; a lower electrode provided on the substrate; an upper electrode provided on the lower electrode; a dielectric layer provided between the lower electrode and the upper electrode; a memory unit contact provided on the upper electrode; a channel comprising a first portion and a second portion, each of the first portion and the second portion extending from the memory unit contact in a vertical direction perpendicular to a first horizontal direction; a word line extending in the first horizontal direction and passing between the first portion and the second portion of the channel; a gate insulating layer interposed between the channel and the word line; and a bit line contacting upper ends of the first portion and the second portion of the channel and extending in a second horizontal direction perpendicular to the vertical direction.

According to an aspect of an example embodiment, there is provided a memory device, the memory device including: a substrate; a lower electrode provided on the substrate; a dielectric layer provided on the lower electrode; a plurality of upper electrodes provided on the dielectric layer; a plurality of channels respectively provided on the plurality of upper electrodes and extending in a vertical direction; a plurality of word lines respectively provided on sides of the plurality of channels and extending in a first horizontal direction perpendicular to the vertical direction; a plurality of gate insulating layers respectively interposed between the plurality of channels and the plurality of word lines; and a bit line contacting upper ends of the plurality of channels and extending in a second horizontal direction that crosses the first horizontal direction and is perpendicular to the vertical direction.

According to an aspect of an example embodiment, there is provided a memory device, the memory device including: a substrate; a first interlayer insulating layer provided on the substrate and having a hole formed therein; a lower electrode provided on a side of the hole and on a bottom of the hole; an upper electrode provided on the lower electrode; a dielectric layer interposed between the lower electrode and the upper electrode; a memory unit contact provided on the upper electrode; a second interlayer insulating layer provided on the first interlayer insulating layer and surrounding the memory unit contact; a third interlayer insulating layer provided on the second interlayer insulating layer; an etch stop layer provided on the third interlayer insulating layer; a fourth interlayer insulating layer provided on the etch stop layer; a channel including a first portion, a second portion, a third portion and a fourth portion, each of the first portion and the second portion extending from the memory unit contact in a vertical direction and passing through the third interlayer insulating layer, the etch stop layer, and the fourth interlayer insulating layer, the third portion connecting lower ends of the first portion and the second portion, and the fourth portion connecting upper ends of the first portion and the second portion; a word line surrounded by the channel and extending in a first horizontal direction; a gate insulating layer surrounding the word line, between the channel and the word line; and a bit line contacting the fourth portion of the channel and extending in a second horizontal direction.

According to an aspect of an example embodiment, there is provided a memory device, the memory device including: a substrate; a first interlayer insulating layer provided on the substrate and having a hole formed therein; a lower electrode provided on a side of the hole and on a bottom of the hole; an upper electrode provided on the lower electrode; a dielectric layer interposed between the lower electrode and the upper electrode; a channel extending from the upper electrode in a vertical direction; a gate insulating layer provided on a side of the channel; a word line contacting a side surface of the gate insulating layer and extending in a first horizontal direction; a capping layer provided on a side of the word line; a second interlayer insulating layer interposed between the capping layer and the first interlayer insulating layer; and a bit line contacting an upper end of the channel and extending in a second horizontal direction that crosses the first horizontal direction.

According to an aspect of an example embodiment, there is provided a memory device, the memory device including: a first structure including: a substrate; a first memory unit provided on the substrate; a first channel provided on the first memory unit and extending in a vertical direction; a first word line provided on a side of the first channel and extending in a first horizontal direction; a first gate insulating layer interposed between the first channel and the first word line; and a first bit line contacting the first channel and extending in a second horizontal direction that crosses the first horizontal direction; and a second structure including: a second memory unit; a second channel provided on the second memory unit and extending in the vertical direction; a second word line provided on a side of the second channel and extending in the first horizontal direction; a second gate insulating layer provided between the second channel and the second word line; and a second bit line contacting the second channel and extending in the second horizontal direction, wherein the second structure is stacked on the first structure such that the first bit line is in contact with the second bit line.

BRIEF DESCRIPTION OF THE DRAWINGS

The above and other aspects will be more clearly understood from the following detailed description of example embodiments, taken in conjunction with the accompanying drawings in which.

DETAILED DESCRIPTION

Figure 1:
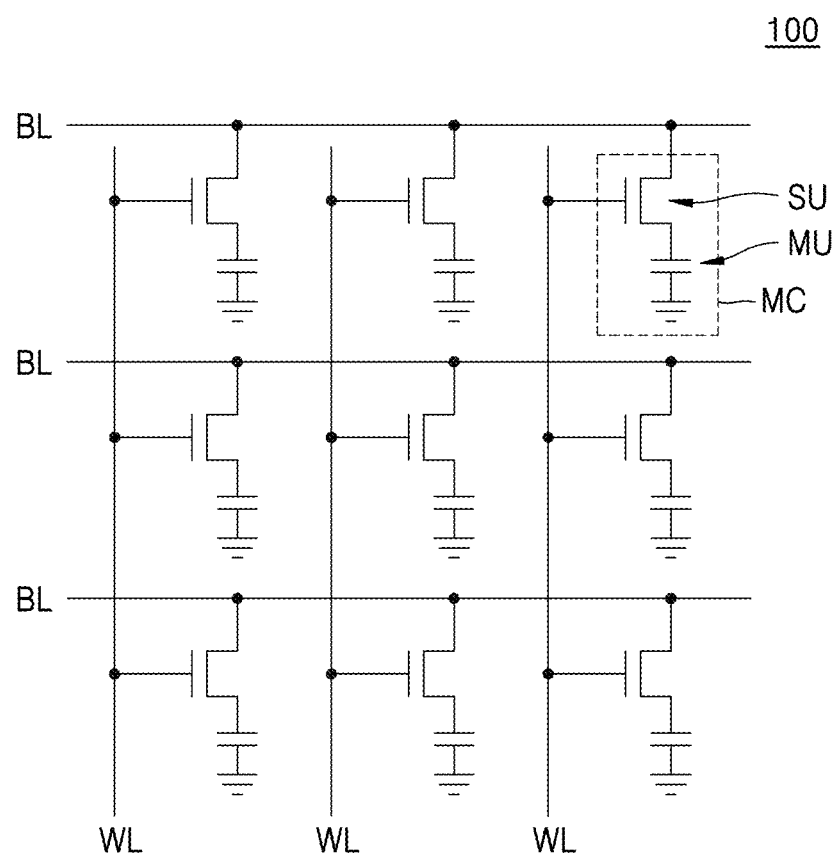
FIG. 1 is a circuit diagram of a memory device according to an example embodiment.

FIG. 1 is a circuit diagram of a memory device 100 according to an example embodiment.

Referring to FIG. 1, the memory device 100 may include a memory cell array including a plurality of memory cells MC. Each of the memory cells MC may include a memory unit MU (e.g., a storage element) and a selection unit SU (e.g., a selection circuit). The memory unit MU may be configured to store data. For example, the memory unit MU may include a capacitor configured to store electric charges. A lower electrode of the memory unit MU may be grounded. An upper electrode of the memory unit MU may be connected to the selection unit SU.

The selection unit SU may be configured to selectively control the movement of electric charges in the memory unit MU. The selection unit SU may include, for example, a transistor. The selection unit SU may selectively connect a bit line BL to the memory unit MU through the control of a word line WL. As will be described in more detail below, the selection unit SU may be a vertical transistor in which a channel extends in a vertical direction. Because the vertical transistor may occupy a smaller planar area than a planar transistor, the planar area of the memory cell MC may be reduced, and thus the degree of integration of the memory device 100 may increase.

Figure 2A:
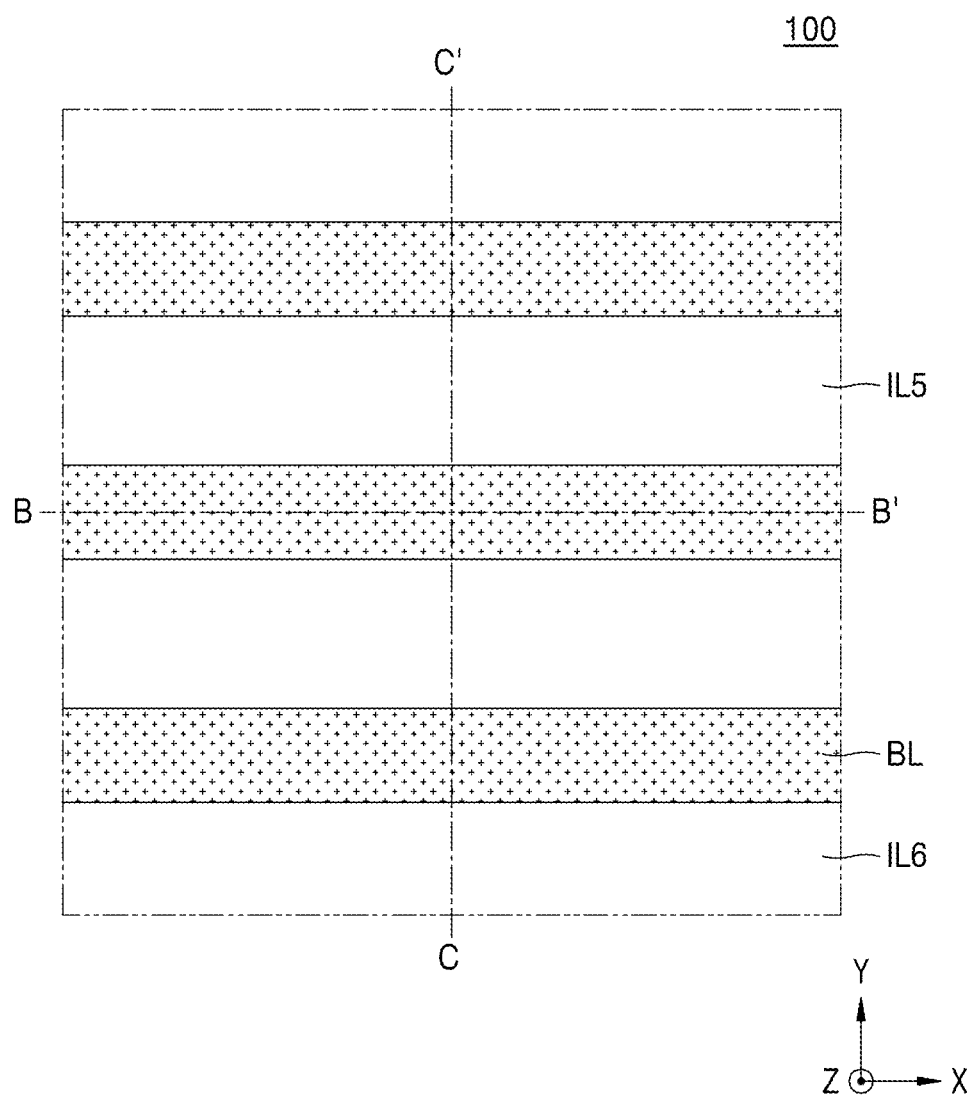
FIG. 2A is a plan view illustrating a memory device according to an example embodiment.
Figure 2B:
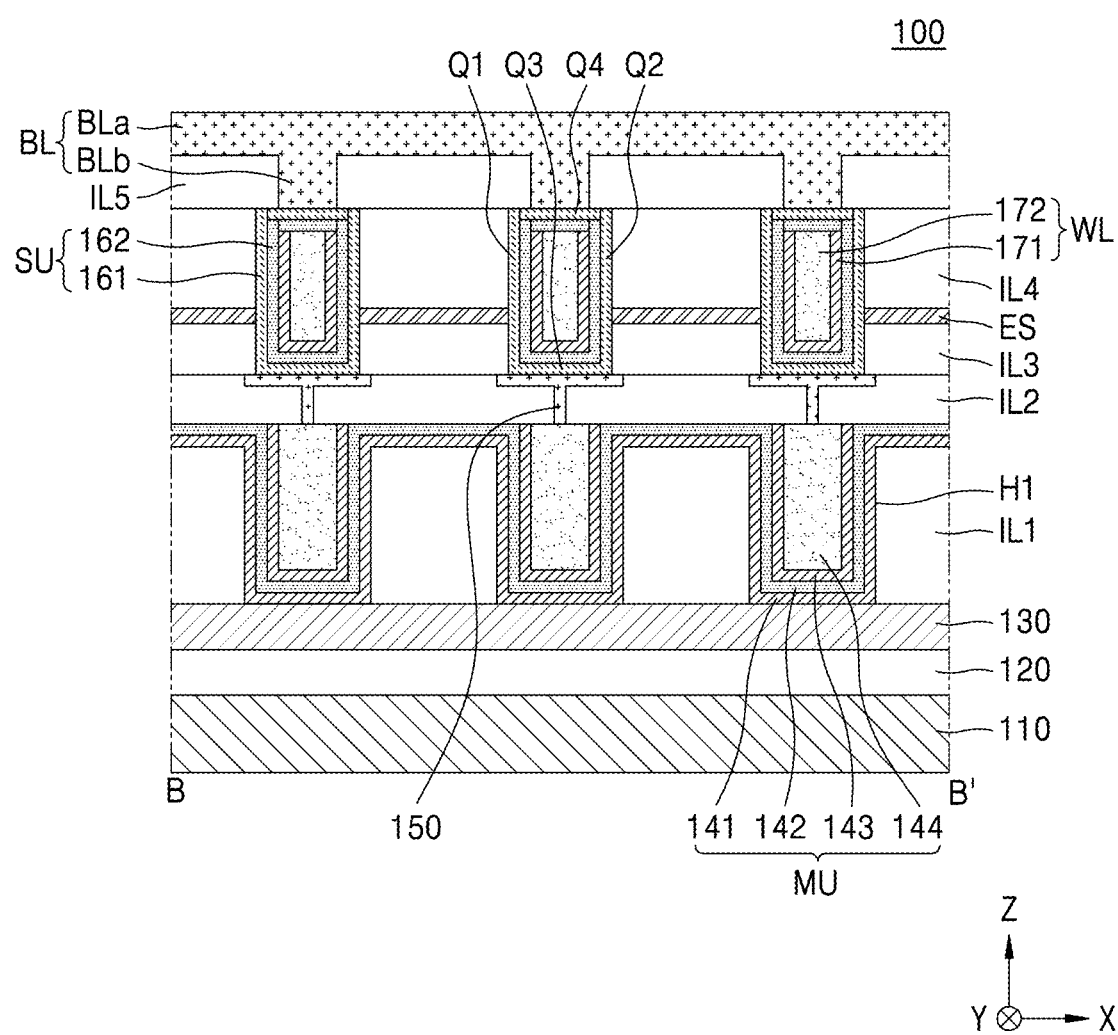
FIG. 2B is a cross-sectional view taken along line B-B' of FIG. 2A.
Figure 2C:
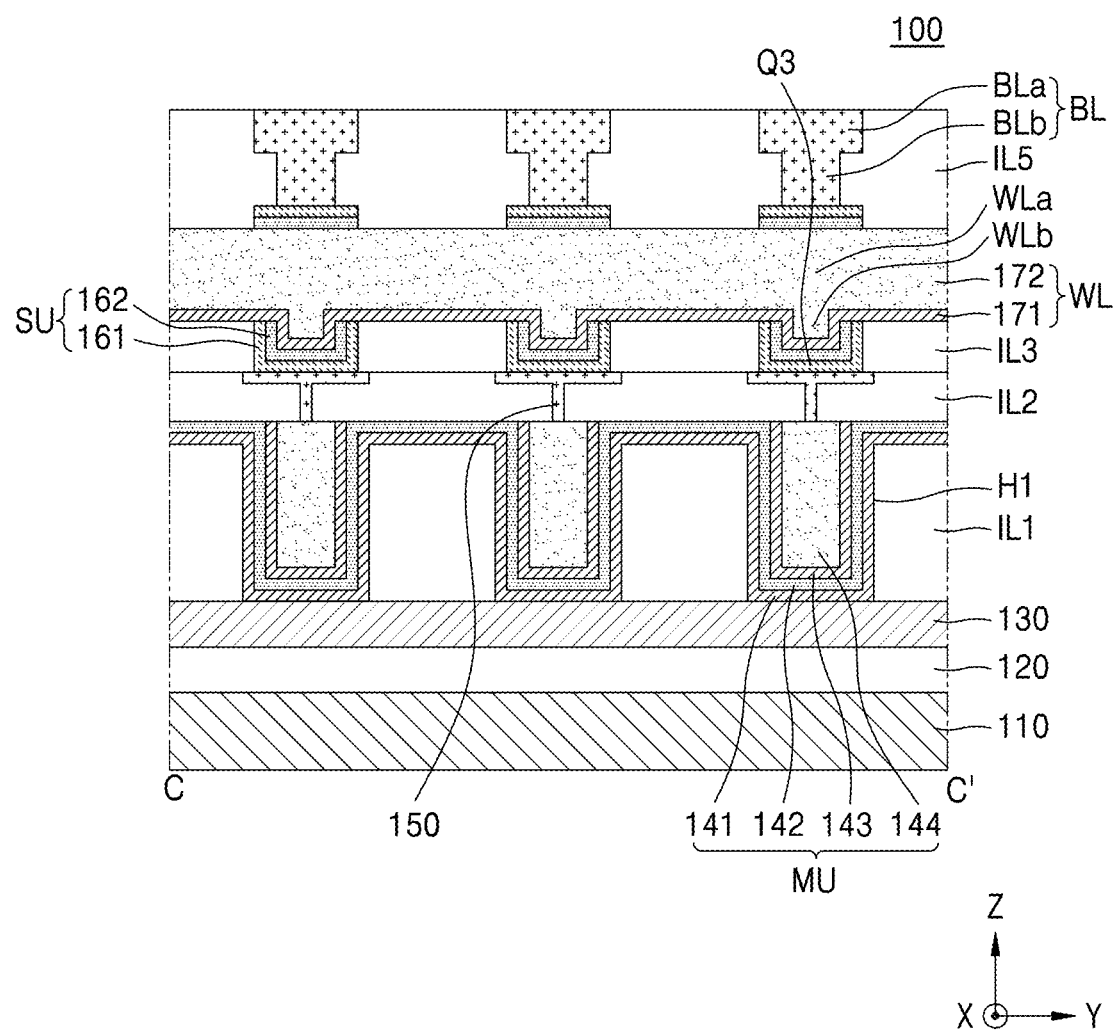
FIG. 2C is a cross-sectional view taken along line C-C' of FIG. 2A.

FIG. 2A is a plan view illustrating a memory device 100 according to an example embodiment. FIG. 2B is a cross-sectional view taken along line B-B' of FIG. 2A. FIG. 2C is a cross-sectional view taken along line C-C' of FIG. 2A.

Referring to FIGS. 2A to 2C, the memory device 100 may include a substrate 110, a plurality of memory units MU on the substrate 110, and a plurality of selection units SU on the plurality of memory units MU.

The substrate 110 may include a semiconductor material. The substrate 110 may include a group IV semiconductor material, a group III-V semiconductor material, a group II-VI semiconductor material, or a combination thereof. The group IV semiconductor material may include, for example, silicon (Si) or germanium (Ge). The group III-V semiconductor material may include, for example, gallium arsenide (GaAs), indium phosphorus (InP), gallium phosphorus (GaP), indium arsenic (InAs), indium antimony (InSb), or indium gallium arsenide (InGaAs). The group II-VI semiconductor material may include, for example, zinc telluride (ZnTe) or cadmium sulfide (CdS).

Each of the memory units MU may include a lower electrode 141, a dielectric layer 142 on the lower electrode 141, and an upper electrode 144 on the dielectric layer 142. In some example embodiments, the plurality of memory units MU may share one lower electrode 141. That is, a plurality of upper electrodes 144 may correspond to one lower electrode 141. The lower electrodes 141 of the plurality of memory units MU may be formed as one layer. Also, the plurality of memory units MU may share one dielectric layer 142. That is, a plurality of upper electrodes 144 may correspond to one dielectric layer 142. The dielectric layer 142 of the plurality of memory units MU may be formed as one layer. The upper electrode 144 of each memory unit MU may be separated from upper electrodes 144 of other memory units MU.

In some example embodiments, the upper electrode 144 may have a column shape. The dielectric layer 142 may be located on the side and lower surfaces of the upper electrode 144. In some example embodiments, the memory unit MU may further include an upper barrier layer 143 between the upper electrode 144 and the dielectric layer 142. The upper barrier layer 143 of each memory unit MU may be separated from another upper barrier layer 143 of another memory unit MU.

Each of the lower electrode 141 and the upper barrier layer 143 may include a metal, a metal nitride, or a combination thereof. The metal may include, for example, titanium (Ti) or tantalum (Ta). The metal nitride may include, for example, titanium nitride (TiN), tantalum nitride (TaN), or tungsten nitride (WN). The dielectric layer 142 may include silicon oxide or a high dielectric material. The high dielectric material may include, for example, aluminum oxide ($Al_2O_3$), hafnium oxide ($HfO_2$), lanthanum oxide (LaO), zircon oxide ($ZrO_2$), tantalum oxide ($Ta_2O_5$), titanium oxide ($TiO_2$), strontium titanium oxide ($SrTiO_3$), or barium strontium titanium oxide ($BaSrTiO_3$). The upper electrode 144 may include a metal. The metal may include, for example, aluminum (Al), tungsten (W), ruthenium (Ru), platinum (Pt), iridium (Ir), cobalt (Co), titanium (Ti), nickel (Ni), molybdenum (Mo), or a combination thereof A ground plate 130 may be arranged between the substrate 110 and the lower electrode 141. The ground plate 130 may electrically ground the lower electrode 141. In some example embodiments, a plurality of ground lines may be formed on the substrate 110 instead of the ground plate 130. The ground plate 130 may include a conductive material. The conductive material may include, for example, copper (Cu), gold (Au), silver (Ag), W, Ti, or Al.

In some example embodiments, a lower insulating layer 120 may be arranged between the substrate 110 and the ground plate 130. The lower insulating layer 120 may include silicon oxide or a low dielectric material. The low dielectric material may include, for example, undoped silicate glass (USG), phospho silicate glass (PSG), borosilicate glass (BSG), fluoride silicate glass (FSG), spin on glass (SOG), or tonen silazene (TOSZ).

A first interlayer insulating layer IL1 may be arranged on the ground plate 130. A plurality of holes H1 may be formed through the first interlayer insulating layer IL1. The lower electrode 141 may be arranged on the upper surface of the first interlayer insulating layer IL1 and on the side and bottom of each of the holes H1 of the first interlayer insulating layer IL1. The plurality of upper electrodes 144 and the plurality of upper barrier layers 143 may be respectively located in the plurality of holes H1. That is, the first interlayer insulating layer IL1 may surround each of the plurality of memory units MU. The first interlayer insulating layer IL1 may include silicon oxide or a low dielectric material. The low dielectric material may include, for example, USG, PSG, BSG, FSG, SOG, or TOSZ.

In some example embodiments, a memory unit contact 150 may be further included to connect the memory unit MU to the selection unit SU. The memory unit contact 150 may include metal. The metal may include, for example, Cu, Ag, Au, Al, Ti, W, or Ta.

In some example embodiments, a second interlayer insulating layer IL2 surrounding the memory unit contact 150 may be provided. The second interlayer insulating layer IL2 may be arranged on the upper surface of the upper electrode 144 and the upper surface of the dielectric layer 142. The lower electrode 141 and the dielectric layer 142 may extend between the first interlayer insulating layer IL1 and the second interlayer insulating layer IL2. The upper surface of the second interlayer insulating layer IL2 may be on the same plane as the upper surface of the memory unit contact 150. The second interlayer insulating layer IL2 may include silicon oxide or a low dielectric material. The low dielectric material may include, for example, USG, PSG, BSG, FSG, SOG, or TOSZ.

The selection unit SU may include a channel 161 and a gate insulating layer 162 on the channel 161. The channel 161 may extend from the memory unit contact 150 in a vertical direction (Z direction). That is, the selection unit SU may include a vertical transistor. Because the selection unit SU includes a vertical transistor, the selection unit SU may be stacked on the memory unit MU, and thus the cross-sectional area of the memory cell may be reduced. Accordingly, the memory device 100 may have a high degree of integration.

The channel 161 may include a first portion Q1 located on a first side of the word line WL and extending in the vertical direction (Z direction), and a second portion Q2 located on a second side of the word line WL opposite to the first side of the word line WL and extending in the vertical direction (Z direction). In some example embodiments, the channel 161 may further include a third portion Q3 on the lower surface of the word line WL and a fourth portion Q4 on the upper surface of the word line WL. The third portion Q3 of the channel 161 may be arranged between the memory unit contact 150 and the word line WL, and the fourth portion Q4 of the channel 161 may be arranged between the word line WL and the bit line BL. The third portion Q3 of the channel 161 may extend in a second horizontal direction (X direction) between a lower end of the first portion Q1 of the channel 161 and a lower end of the second portion Q2 of the channel 161. The fourth portion Q4 of the channel 161 may extend in the second horizontal direction (X direction) between an upper end of the first portion Q1 of the channel 161 and an upper end of the second portion Q2 of the channel 161. Boundaries are illustrated in FIG. 1 between the first portion Q1 and the fourth portion Q4 of the channel 161 and between the second portion Q2 and the fourth portion Q4 of the channel 161. However, because the first portion Q1, the fourth portion Q4, and the second portion Q2 of the channel 161 include the same material, the boundary may be indistinguishable by an electron microscope.

The first to fourth portions Q1 to Q4 of the channel 161 may surround the word line WL. When the channel 161 has a structure surrounding the word line WL, a cross-sectional area of the word line WL on an X-Z plane may increase. Accordingly, the resistance of the word line WL may be reduced.

The channel 161 may include a semiconductor material. In some example embodiments, the channel 161 may include an oxide semiconductor. The oxide semiconductor may include, for example, tin oxide (SnO), zinc oxide (ZnO), zinc-tin oxide (ZTO), gallium oxide (GaO), indium oxide (InO), or indium-gallium-zinc oxide (IGZO). For example, the channel 161 may include indium-gallium-zincoxide (IGZO). When the channel 161 includes IGZO, a floating body effect may be prevented and a leakage current may be reduced because a hole is not generated in the body. Accordingly, the capacitance of the memory unit MU required to store electric charges may be reduced. Accordingly, the aspect ratio of the upper electrode 144 and the hole H1 of the first interlayer insulating layer IL1 may be reduced, and thus manufacturing of the memory unit MU may be facilitated.

The gate insulating layer 162 may be arranged between the word line WL and the channel 161. In some example embodiments, the gate insulating layer 162 may surround the word line WL. In FIG. 2B, a boundary between an upper portion of the gate insulating layer 162 and the remaining portion of the gate insulating layer 162 is illustrated. However, because the upper portion of the gate insulating layer 162 and the remaining portion of the gate insulating layer 162 include the same material, the boundary may be indistinguishable by an electron microscope. The gate insulating layer 162 may include silicon oxide, a high dielectric material, or a combination thereof The high dielectric material may include $Al_2O_3$, $HfO_2$, LaO, $ZrO_2$, $Ta_2O_5$, $TiO_2$, $SrTiO_3$, or $BaSrTiO_3$.

The word line WL may be located on the memory unit MU and may extend in a first horizontal direction (Y direction). The first horizontal direction (Y direction) may be perpendicular to the vertical direction (Z direction). The word line WL may pass between the first portion Q1 and the second portion Q2 of the channel 161, and between the third portion Q3 and the fourth portion Q4. The word line WL may be surrounded by the first portion Q1, the second portion Q2, the third portion Q3, and the fourth portion Q4 of the channel 161. The word line WL may include a line portion WLa and a plurality of contact portions WLb. The line portion WLa may extend in the first horizontal direction (Y direction). Each of the contact portions WLb may protrude from the line portion WLa toward the third portion Q3 of the channel 161 in a direction (−Z direction) opposite to the vertical direction.

In some example embodiments, the word line WL may include a gate barrier layer 171 and a filling layer 172 on the gate barrier layer 171. The gate barrier layer 171 may be arranged on a lower surface of the word line WL, a first side surface thereof, and a second side surface opposite to the first side surface. The gate barrier layer 171 may include a metal, a metal nitride, or a combination thereof. The metal may include Ti or Ta. The metal nitride may include TiN, TaN, or WN. The filling layer 172 may include Ti, TiN, Ta, TaN, W, WN, titanium silicon nitride (TiSiN), tungsten silicon nitride (WSiN), or a combination thereof A third interlayer insulating layer IL3 and a fourth interlayer insulating layer IL4 may be arranged on the second interlayer insulating layer IL2 and may surround the selection unit SU. The upper surface of the fourth interlayer insulating layer IL4 may be on the same plane as the upper surface of the fourth portion Q4 of the channel 161. In some example embodiments, an etch stop layer ES may be arranged between the third interlayer insulating layer IL3 and the fourth interlayer insulating layer IL4. Each of the third interlayer insulating layer IL3 and the fourth interlayer insulating layer IL4 may include silicon oxide or a low dielectric material. The low dielectric material may include USG, PSG, BSG, FSG, SOG, or TOSZ. The etch stop layer ES may include a material having an etch selectivity compared to the fourth interlayer insulating layer IL4, for example, silicon nitride (SiN).

The bit line BL may contact an upper end of the channel 161 (e.g., the fourth portion Q4) and may extend in a second horizontal direction (X direction). The second horizontal direction (X direction) may be perpendicular to the vertical direction (Z direction). The first horizontal direction (Y direction) and the second horizontal direction (X direction) may or may not be perpendicular to each other. The bit line BL may include a line portion BLa and a plurality of protrusions BLb. The line portion BLa may extend in the second horizontal direction (X direction). Each of the protrusions BLb may protrude from the line portion BLa in a direction (−Z direction) opposite to the vertical direction to contact the fourth portion Q4 of the channel 1651.

The bit line BL may include metal. The metal may include Cu, Al, W, or a combination thereof. Because the bit line BL is not buried in the substrate 110 and may be formed on the selection unit SU, the bit line BL may include Cu having low electrical conductivity. Accordingly, the resistance of the bit line BL may be reduced.

In some example embodiments, a fifth interlayer insulating layer IL5 in contact with the bit line BL may be arranged on the fourth interlayer insulating layer IL4. The fifth interlayer insulating layer IL5 may include silicon oxide or a low dielectric material. The low dielectric material may include USG, PSG, BSG, FSG, SOG, or TOSZ.

Figure 3A:
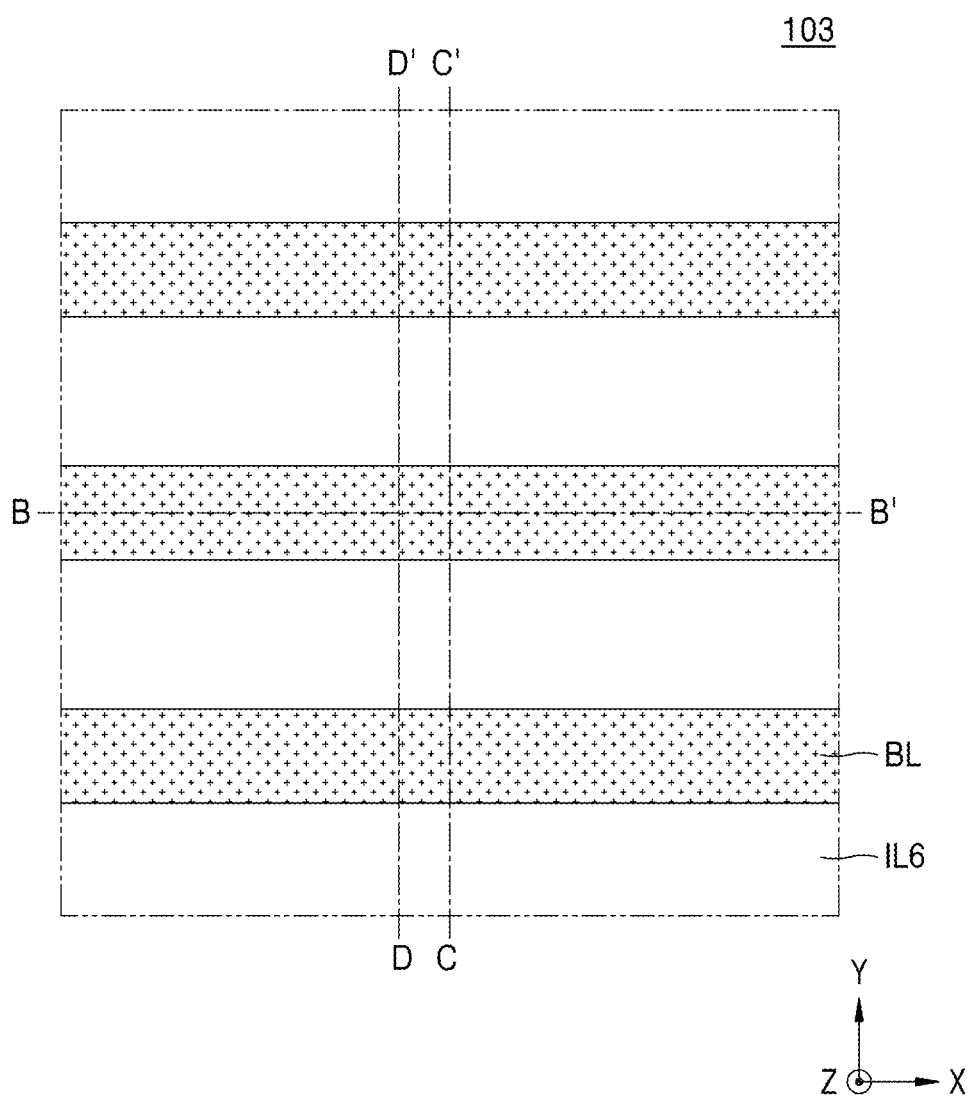
FIG. 3A is a plan view illustrating a memory device according to an example embodiment.
Figure 3B:
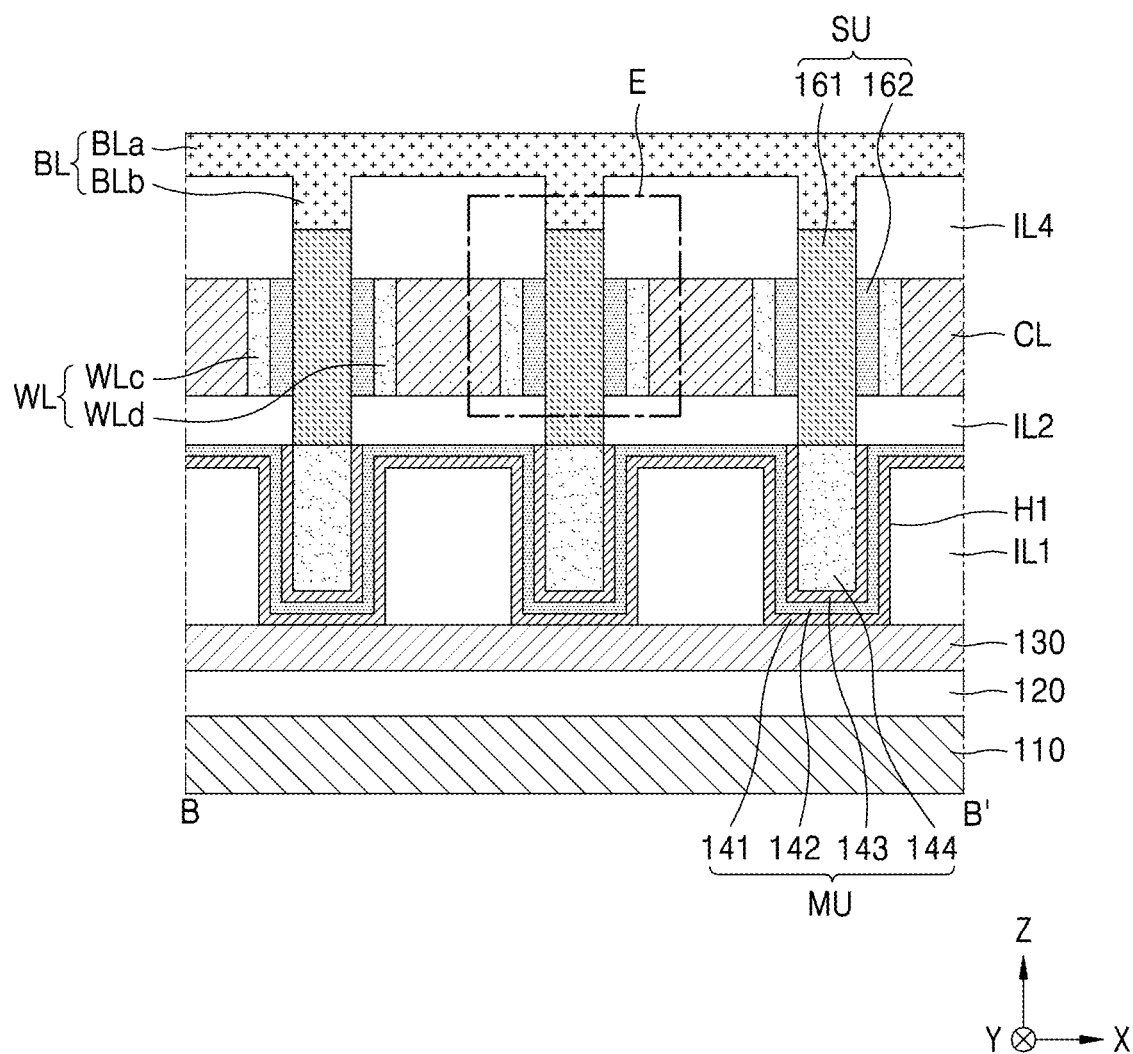
FIG. 3B is a cross-sectional view taken along line B-B' of FIG. 3A.
Figure 3C:
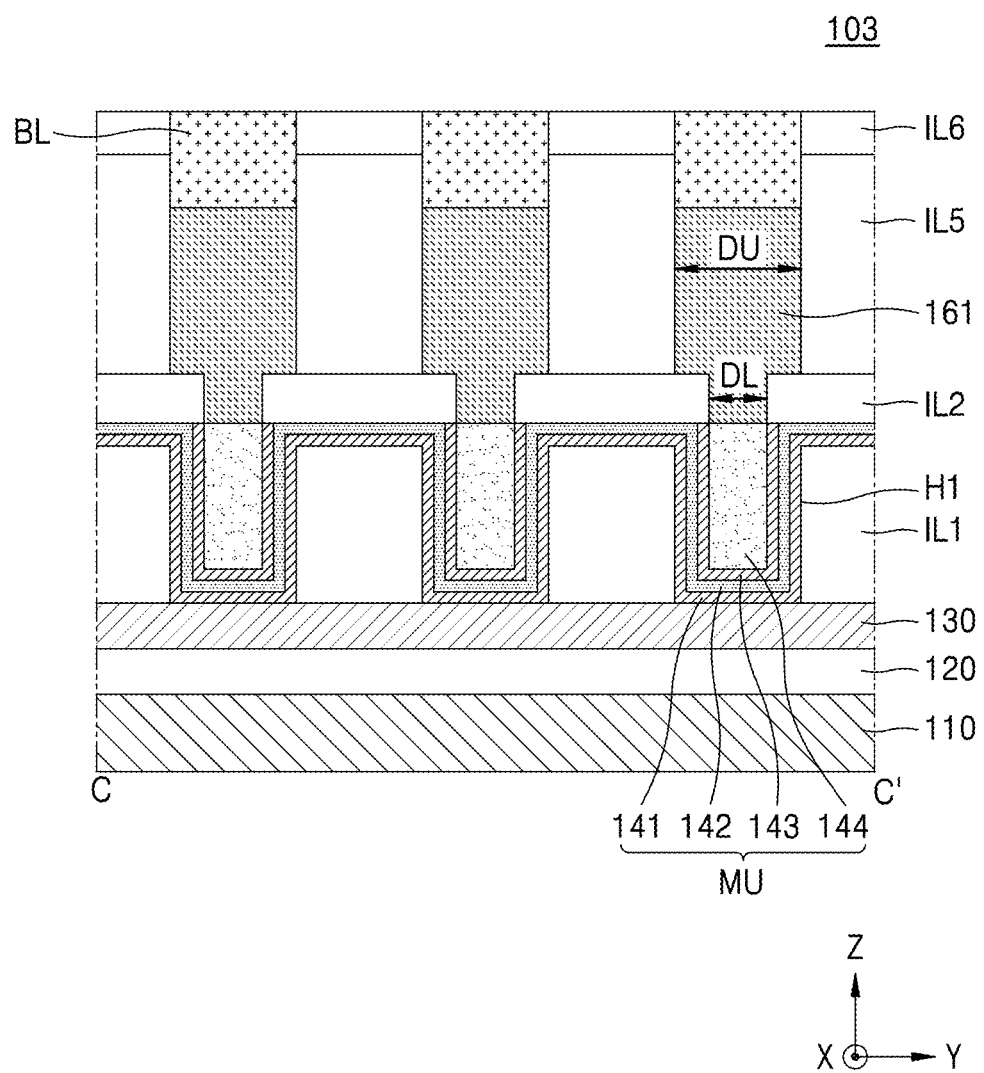
FIG. 3C is a cross-sectional view taken along line C-C' of FIG. 3A.
Figure 3D:
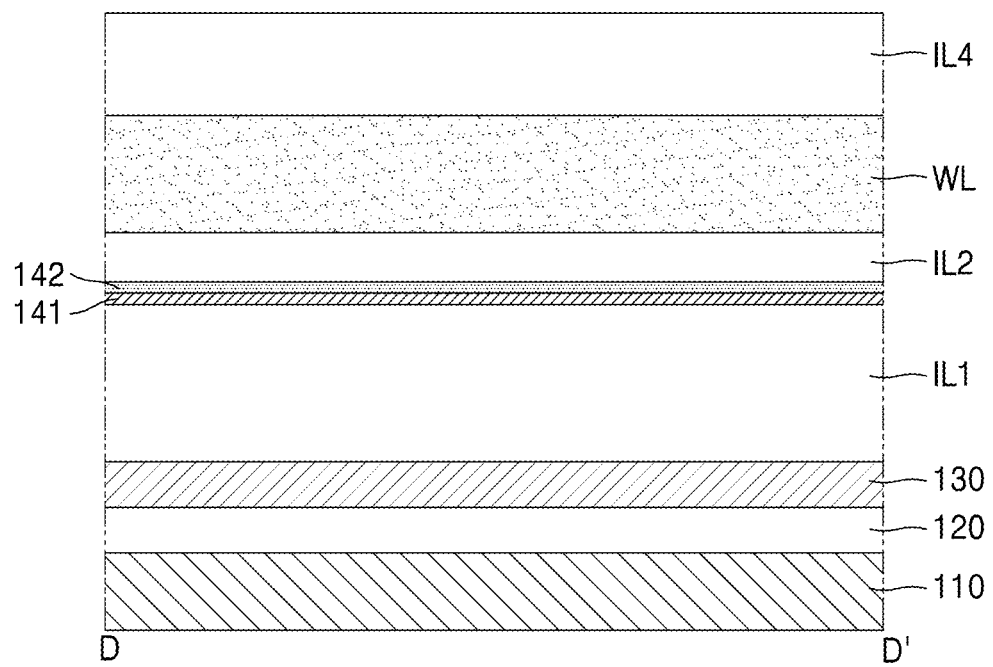
FIG. 3D is a cross-sectional view taken along line D-D' of FIG. 3A.
Figure 3D:
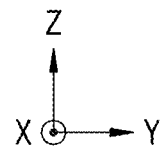
Figure 3E:
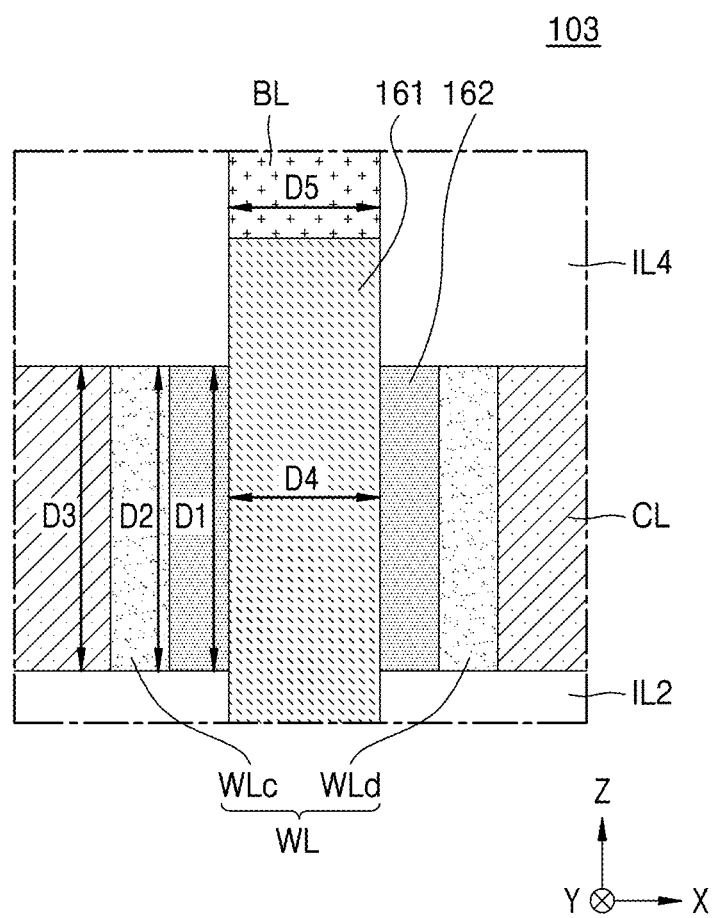
FIG. 3E is an enlarged view of area E in FIG. 3B.
Figure 3F:
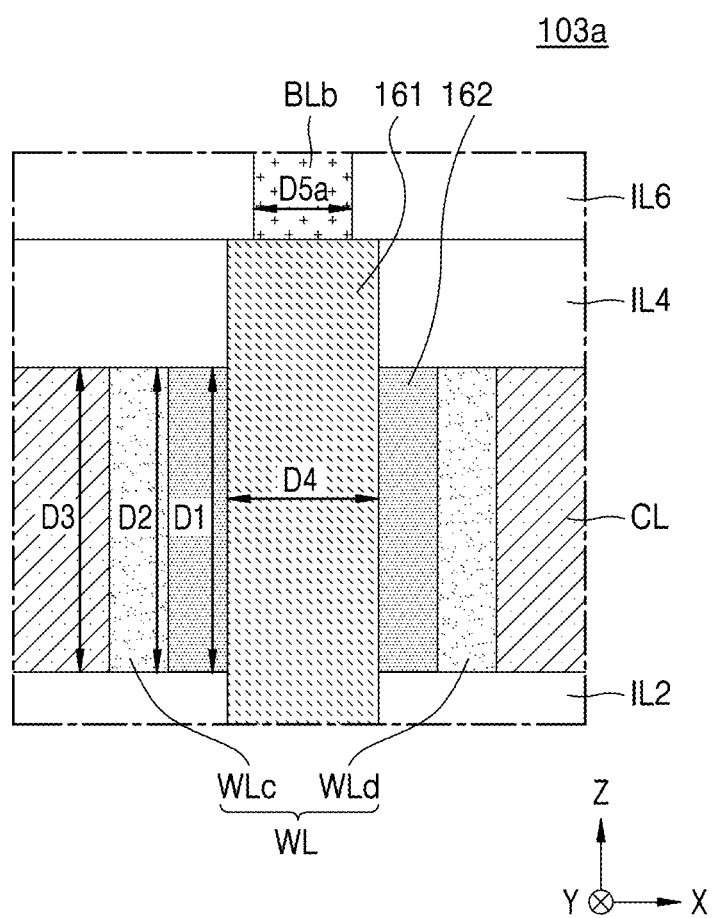
FIG. 3F is an enlarged view illustrating a memory device according to an example embodiment.
Figure 3G:
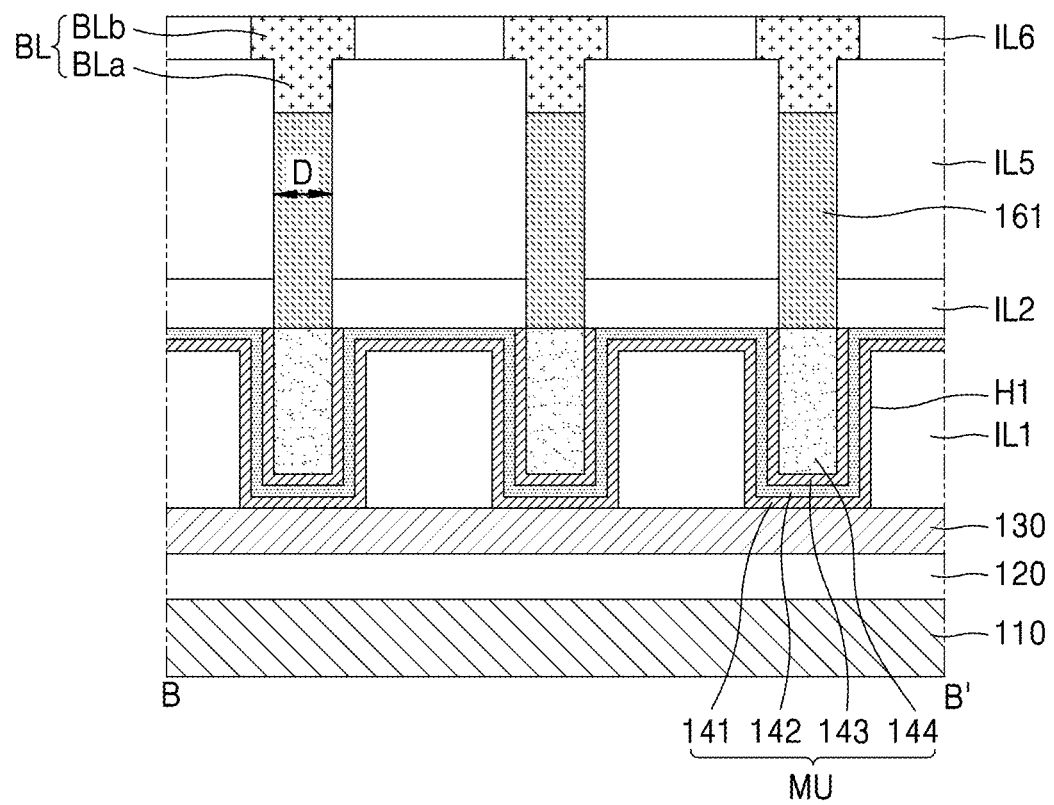
FIG. 3G is a cross-sectional view illustrating a memory device according to an example embodiment.

FIG. 3A is a plan view illustrating a memory device 103 according to an example embodiment. FIG. 3B is a cross-sectional view taken along line B-B' of FIG. 3A. FIG. 3C is a cross-sectional view taken along line C-C' of FIG. 3A. FIG. 3D is a cross-sectional view taken along line D-D' of FIG. 3A. FIG. 3E is an enlarged view of area E in FIG. 3B. FIG. 3F is an enlarged view illustrating a memory device 103a according to an example embodiment. FIG. 3G is a cross-sectional view illustrating a memory device 103b according to an example embodiment.

Referring to FIGS. 3A to 3D, a channel 161 may extend from an upper electrode 144 in a vertical direction (Z direction). A word line WL may include a first portion WLc on a first side of the channel 161 and a second portion WLd on a second side of the channel 161 opposite to the first side of the channel 161. That is, the word line WL may extend from both sides of the channel 161 in a first horizontal direction (Y direction). In some example embodiments, the word line WL may include the same material as the upper electrode 144. The same material may include, for example, W, Ti, Ta, Al, or a combination thereof. A gate insulating layer 162 may be arranged between the first side of the channel 161 and the first portion WLc of the word line WL, and between the second side of the channel 161 and the second portion WLd of the word line WL.

A second interlayer insulating layer IL2 may surround a lower portion of the channel 161. A capping layer CL may be arranged on the second interlayer insulating layer IL2 between word lines WL. The capping layer CL may be arranged on the sides of the word lines WL. A fourth interlayer insulating layer IL4 may be arranged on the capping layer CL. The fourth interlayer insulating layer IL4 may contact the channel 161 and a bit line BL. A fifth interlayer insulating layer IL5 and a sixth interlayer insulating layer IL6 may be arranged on the second interlayer insulating layer IL2. The fifth interlayer insulating layer IL5 may contact the channel 161 and the bit line BL. The channel 161 and a contact portion BLb of the bit line BL may be surrounded by the fourth interlayer insulating layer IL4 and the fifth interlayer insulating layer IL5. The sixth interlayer insulating layer IL6 may contact a line portion BLa of the bit line BL. A capping layer CL may include a material having an etch selectivity for the fourth interlayer insulating layer IL4 and the second interlayer insulating layer IL2, for example, SiN.

The channel 161 may include a lower portion surrounded by the second interlayer insulating layer IL2 and an upper portion on the lower portion. In some example embodiments, a dimension DL of the lower portion of the channel 161 in the first horizontal direction (Y direction) may be different from a dimension DU of the upper portion of the channel 161 in the first horizontal direction (Y direction). For example, the dimension DL of the lower portion of the channel 161 in the first horizontal direction (Y direction) may be smaller than the dimension DU of the upper portion of the channel 161 in the first horizontal direction (Y direction). However, referring to FIG. 3G, in another example embodiment, a dimension D of the channel 161 in the first horizontal direction (Y direction) may be constant. That is, the dimension of the lower portion of the channel 161 in the first horizontal direction (Y direction) may be the same as the dimension of the upper portion of the channel 161 in the first horizontal direction (Y direction).

Referring to FIG. 3E, the upper surfaces of the capping layer CL, the word line WL, and the gate insulating layer 162 may be on the same plane. Furthermore, the lower surfaces of the capping layer CL, the word line WL, and the gate insulating layer 162 may be on the same plane. Accordingly, a dimension D1 of the gate insulating layer 162 in the vertical direction (Z direction) may be the same as a dimension D2 of the word line WL in the vertical direction (Z direction). A dimension D3 of the capping layer CL in the vertical direction (Z direction) may be the same as the dimension D2 of the word line WL in the vertical direction (Z direction). In some example embodiments, a dimension D5 of the contact portion BLb of the bit line BL in a second horizontal direction (X direction) may be the same as a dimension D4 of the channel 161 in the second horizontal direction (X direction). However, example embodiments are not limited thereto. For example, as shown in FIG. 3F, in another example embodiment, a dimension D5a of the contact portion BLb of the bit line BL in the second horizontal direction (X direction) may be smaller than the dimension D4 of the channel 161 in the second horizontal direction (X direction).

FIGS. 4A, 5A, 6A, 7A, 8A, 9A, 10A, 11A, 12A, 13A, 14A, 15A and 16A are plan views illustrating a method of manufacturing a memory device according to an example embodiment. FIGS. 4B, 5B, 6B, 7B, 8B, 9B, 10B, 11B, 12B, 13B, 14B, 15B and 16B are cross-sectional views taken along line B-B' of FIGS. 4A, 5A, 6A, 7A, 8A, 9A, 10A, 11A, 12A, 13A, 14A, 15A and 16A, respectively. FIGS. 10C, 11C, 12C, 13C, 14C, 15C and to 16C are cross-sectional views taken along line C-C' of FIGS. 10A, 11A, 12A, 13A, 14A, 15A and 16A, respectively.

Figure 4A:
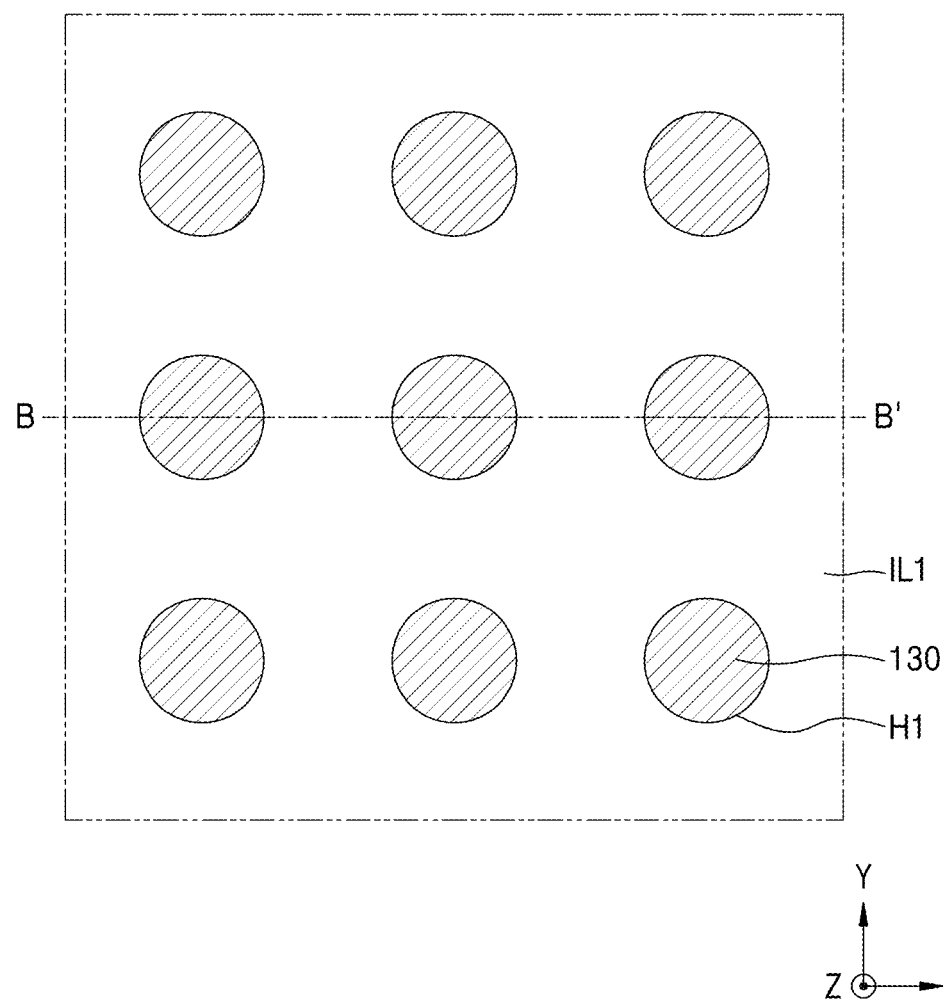
FIGS. 4A, 5A, 6A, 7A, 8A, 9A, 10A, 11A, 12A, 13A, 14A, 15A and 16A are plan views illustrating a method of manufacturing a memory device according to an example embodiment.
Figure 4B:
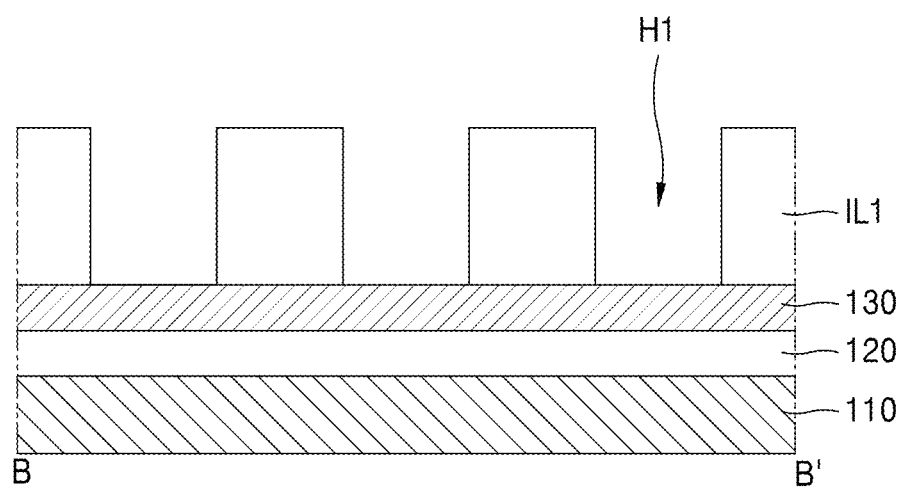
FIGS. 4B, 5B, 6B, 7B, 8B, 9B, 10B, 11B, 12B, 13B, 14B, 15B and 16B are cross-sectional views taken along line B-B' of FIGS. 4A, 5A, 6A, 7A, 8A, 9A, 10A, 11A, 12A, 13A, 14A, 15A and 16A, respectively.
Figure 4B:
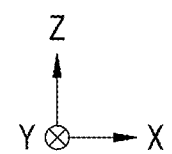

Referring to FIGS. 4A and 4B, a lower insulating layer 120 may be formed on a substrate 110. Next, a ground plate 130 may be formed on the lower insulating layer 120. Next, a first interlayer insulating layer IL1 having a plurality of first holes H1 may be formed on the ground plate 130. For example, the plurality of first holes H1 may be formed by forming a first interlayer insulating layer IL1 on the ground plate 130, forming a mask pattern on the first interlayer insulating layer IL1 and etching the first interlayer insulating layer IL1 by using the mask pattern as an etching mask. Each of the first holes H1 may expose a portion of the ground plate 130. In some example embodiments, the forming of the lower insulating layer 120 and/or the forming of the ground plate 130 may be omitted.

Figure 5A:
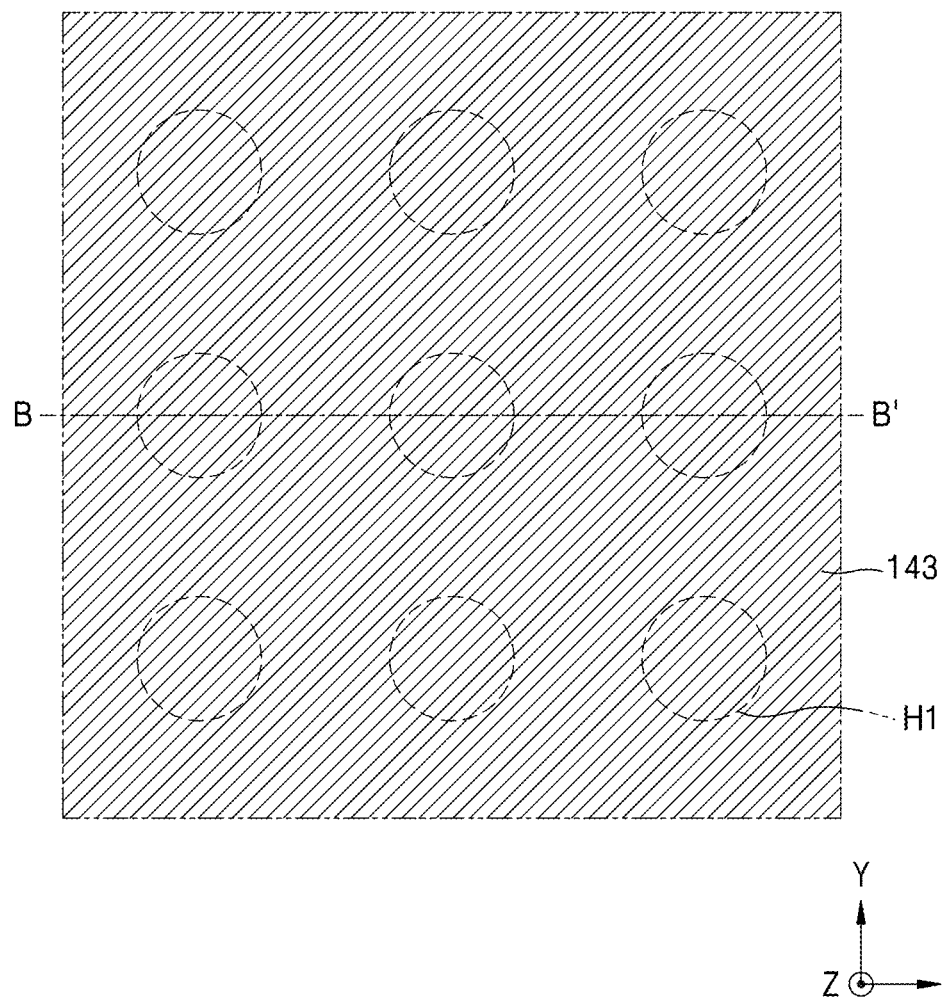
Figure 5B:
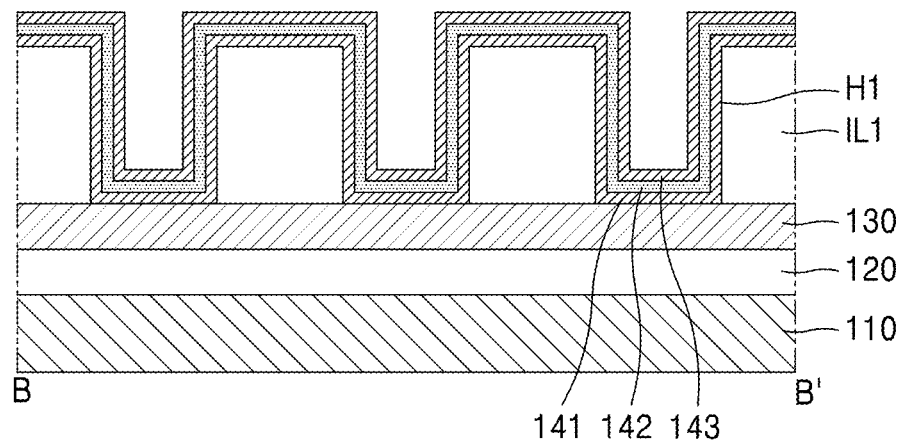
Figure 5B:
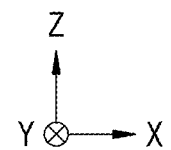

Referring to FIGS. 5A and 5B, a lower electrode 141 may be conformally formed on the first interlayer insulating layer IL1. More specifically, the lower electrode 141 may be formed on the upper surface of the first interlayer insulating layer IL1 and on the side and bottom of each of the first holes H1 of the first interlayer insulating layer IL1. Next, a dielectric layer 142 may be conformally formed on the lower electrode 141. Next, an upper barrier layer 143 may be conformally formed on the dielectric layer 142.

Figure 6A:
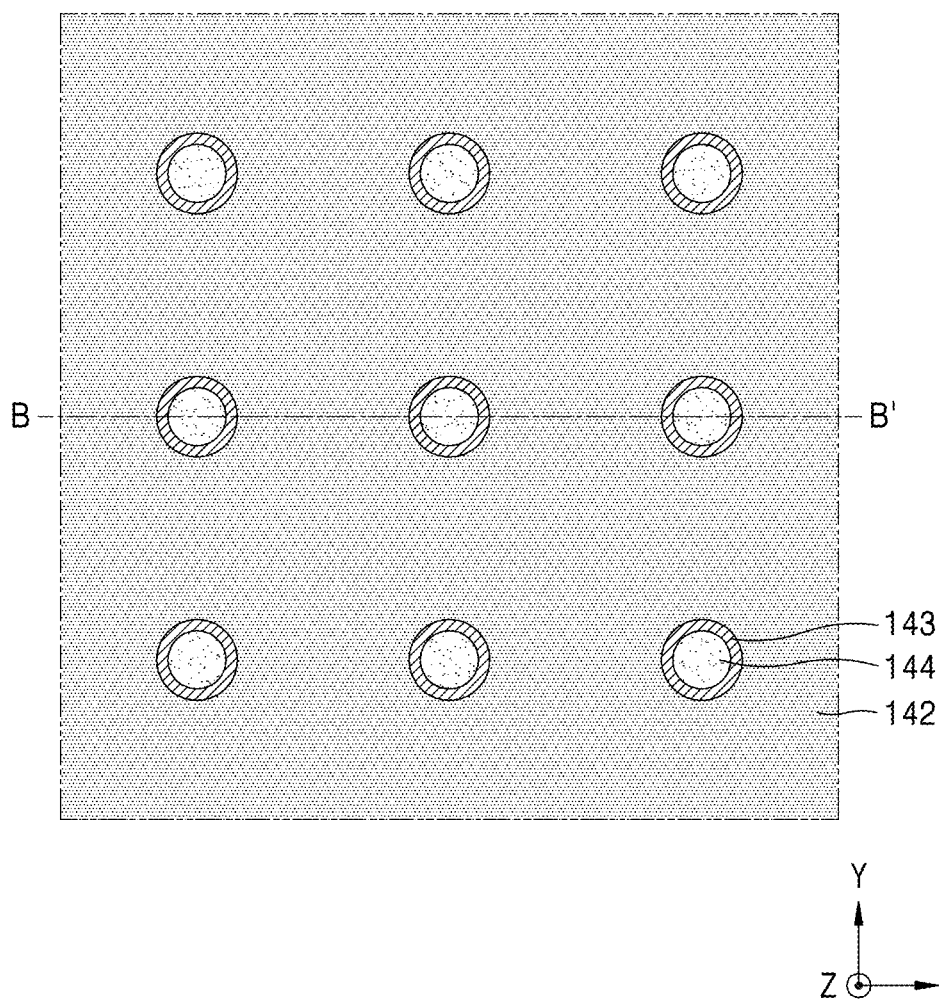
Figure 6B:
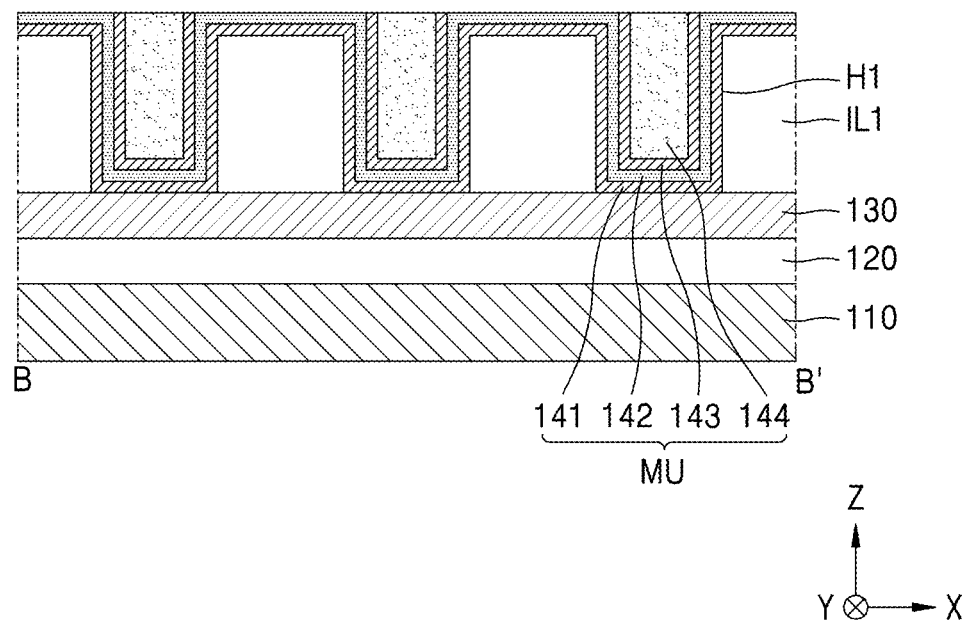

Referring to FIGS. 6A and 6B, an upper electrode 144 may be formed on the upper barrier layer 143. The upper electrode 144 may fill the first holes H1. The upper electrode 144 may also be formed on the upper barrier layer 143 on the upper surface of the first interlayer insulating layer IL1. Thereafter, portions of the upper barrier layer 143 and the upper electrode 144 on the upper surface of the first interlayer insulating layer IL1 may be removed. For example, the upper electrode 144 and the upper barrier layer 143 may be planarized such that a portion of the dielectric layer 142 on the upper surface of the first interlayer insulating layer IL1 is exposed. The remaining portions of the upper barrier layer 143 may be separated from each other. The remaining portions of the upper electrode 144 in the first holes H1 may be separated from each other. The lower electrode 141, the dielectric layer 142, the upper electrode 144, and the upper barrier layer 143 may form a memory unit MU.

Figure 7A:
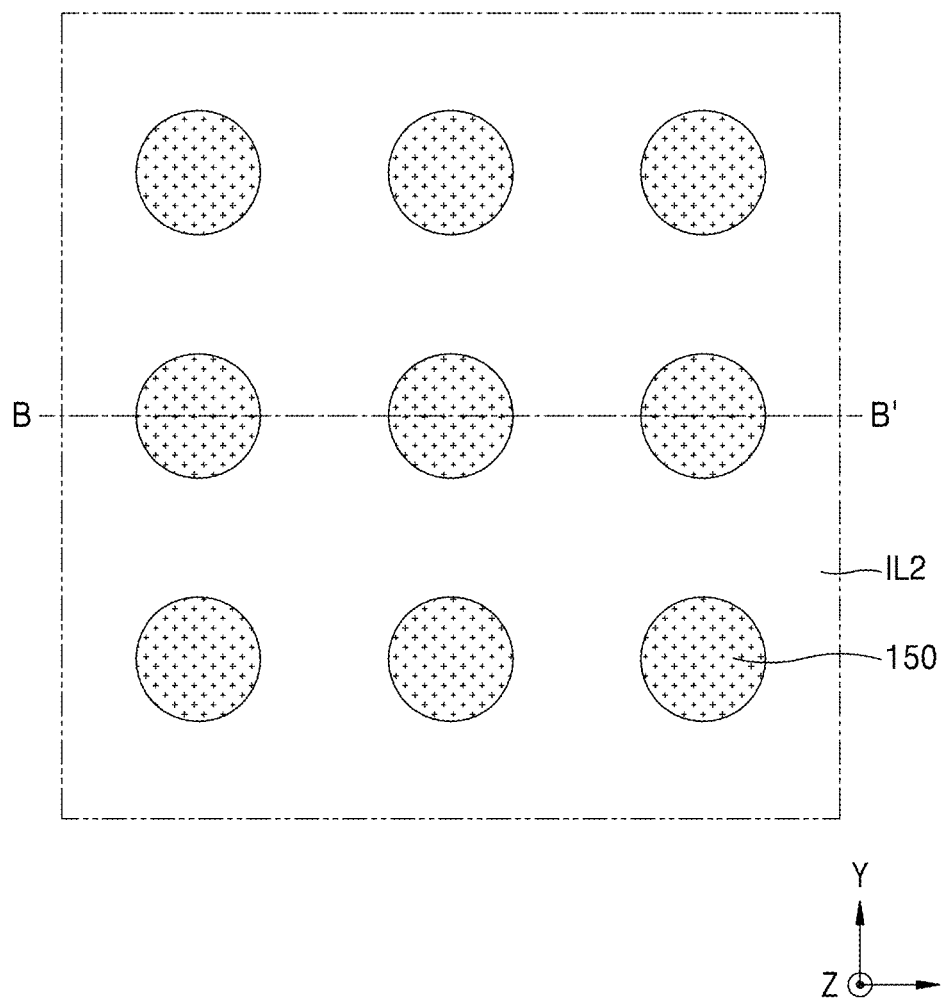
Figure 7B:
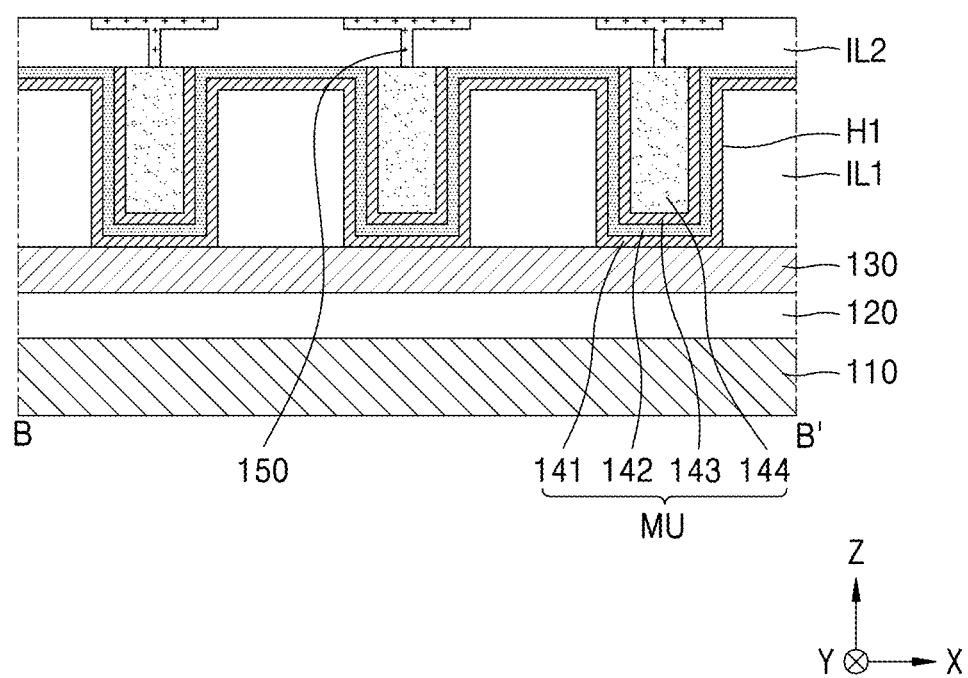

Referring to FIG. 7A and 7B, a memory unit contact 150 on the upper electrode 144 and a second interlayer insulating layer IL2 surrounding the memory unit contact 150 may be formed. For example, the second interlayer insulating layer IL2 may be formed on the dielectric layer 142, and the memory unit contact 150 may be formed in the second interlayer insulating layer IL2 to contact the upper electrode 144.

Figure 8A:
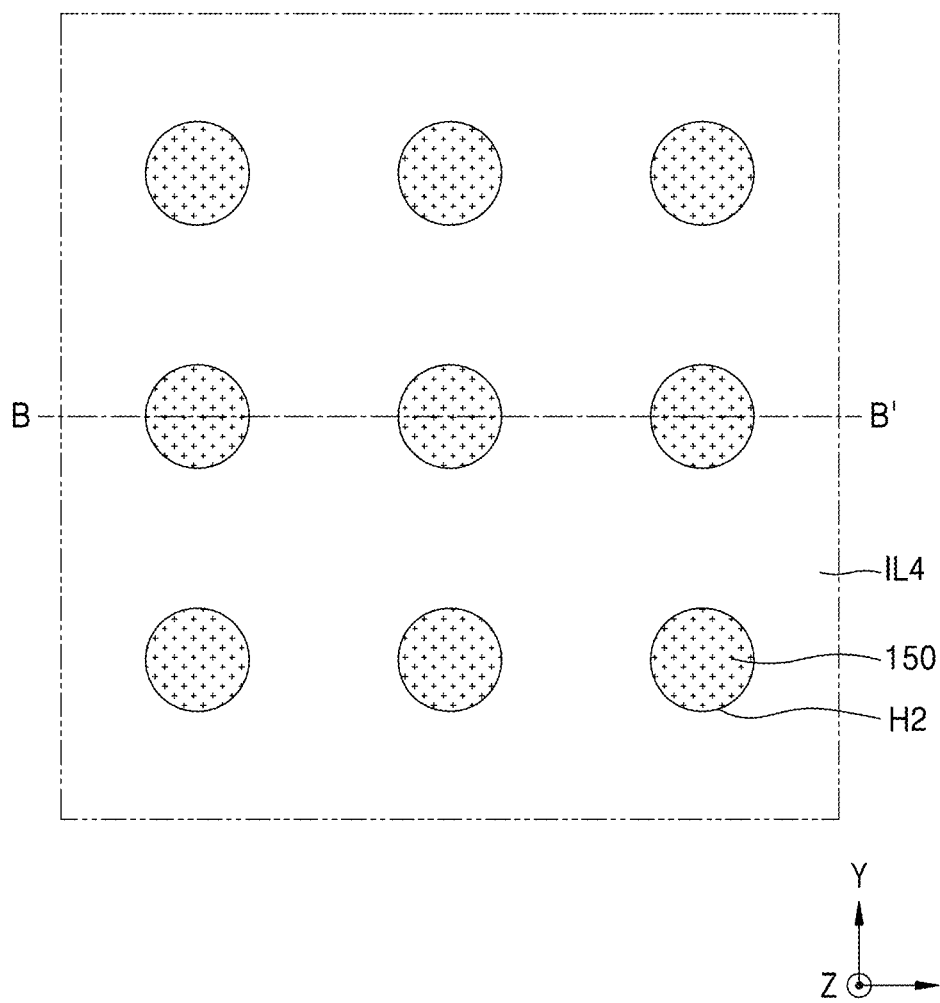
Figure 8B:
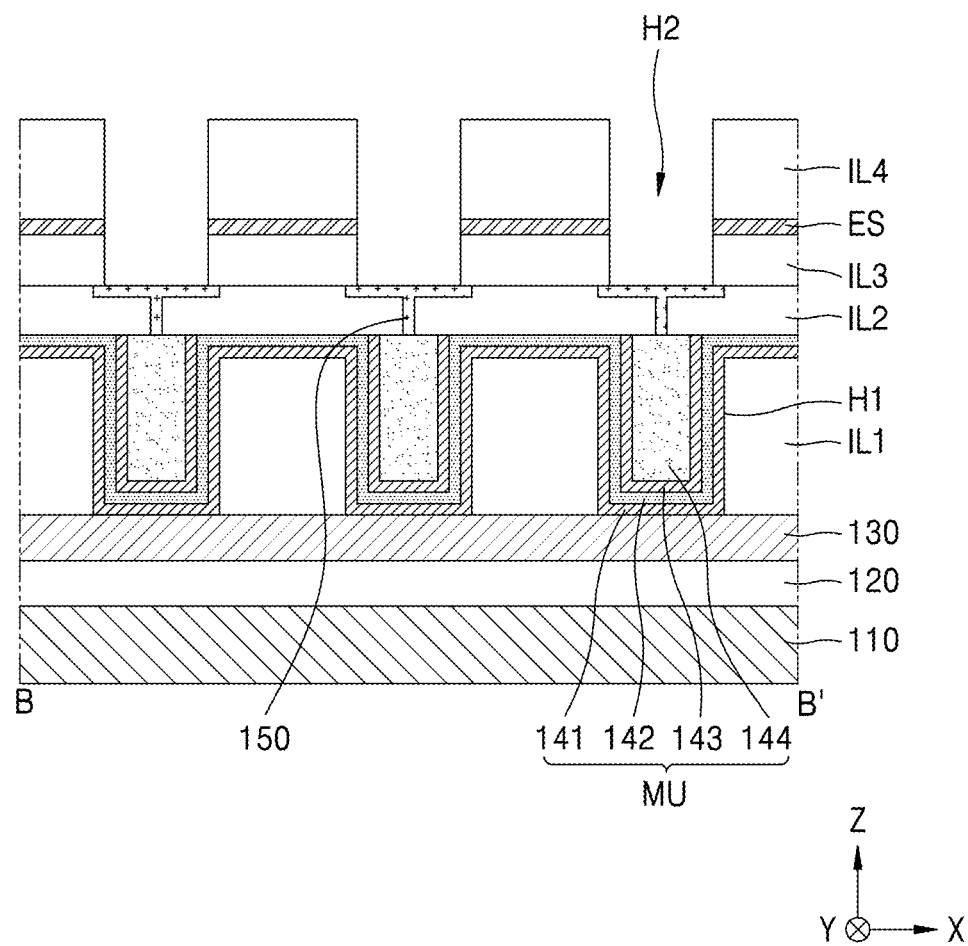

Referring to FIGS. 8A and 8B, a third interlayer insulating layer IL3 may be formed on the second interlayer insulating layer IL2 and a plurality of memory unit contacts 150. Next, an etch stop layer ES may be formed on the third interlayer insulating layer IL3. Next, a fourth interlayer insulating layer IL4 may be formed on the etch stop layer ES. In some example embodiments, the forming of the etch stop layer ES may be omitted. Next, a plurality of second holes H2 passing through the third interlayer insulating layer IL3, the etch stop layer ES, and the fourth interlayer insulating layer IL4 may be formed to expose the plurality of memory unit contacts 150, respectively.

Figure 9A:
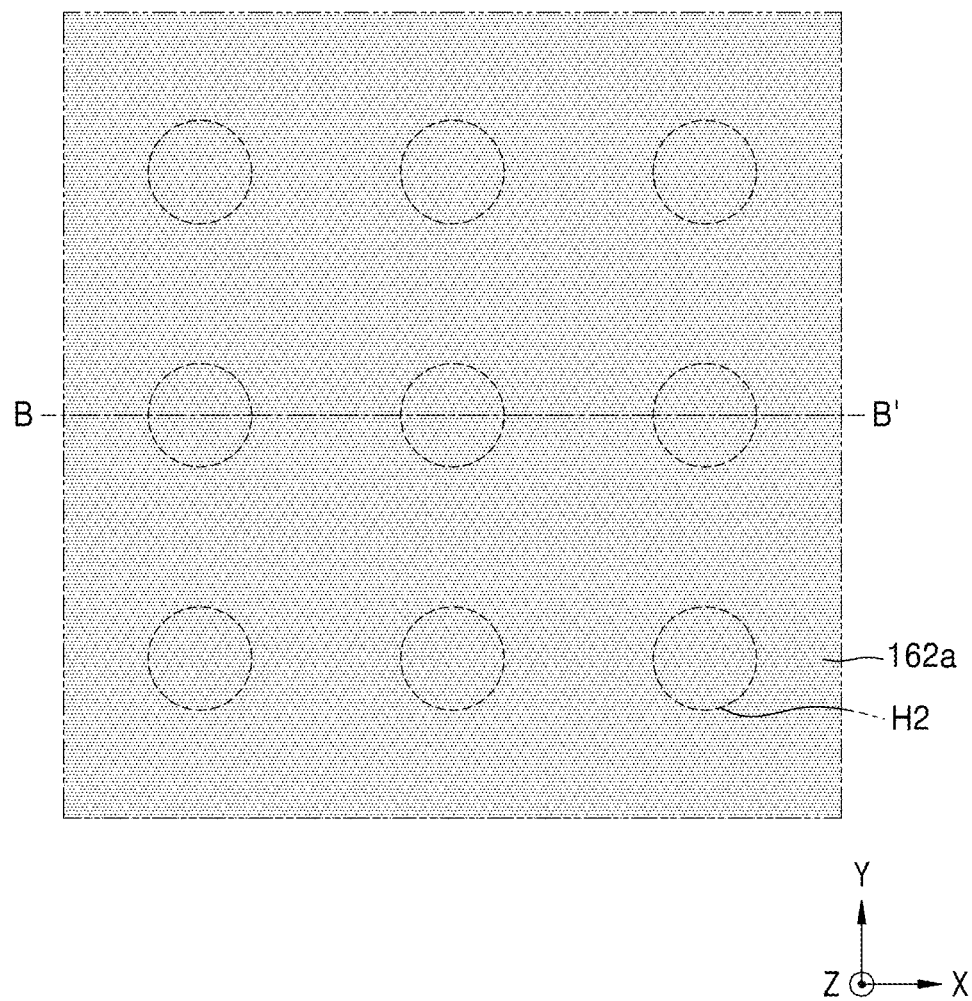
Figure 9B:
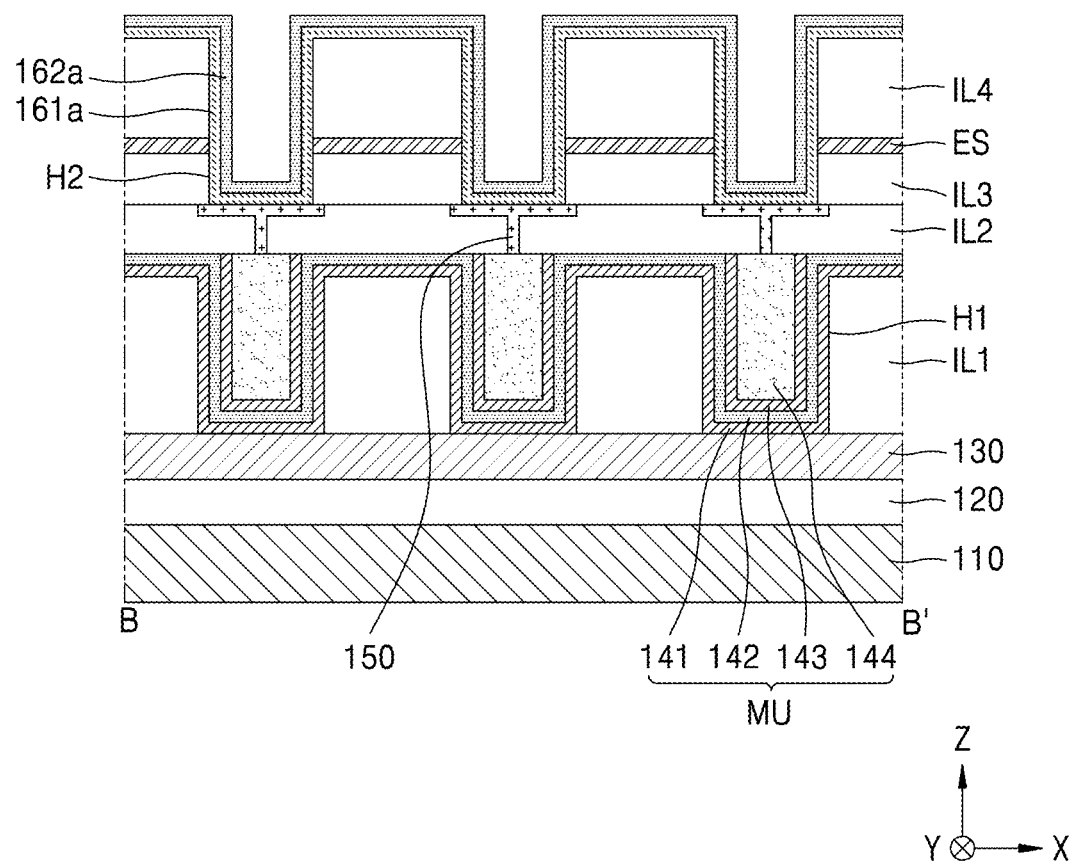

FIGS. 9A and 9B, a first channel layer 161a may be conformally formed on the upper surface of the fourth interlayer insulating layer IL4 and on the side and bottom of the second holes H2. Next, a first gate insulating layer 162a may be conformally formed on the first channel layer 161a.

Figure 10A:
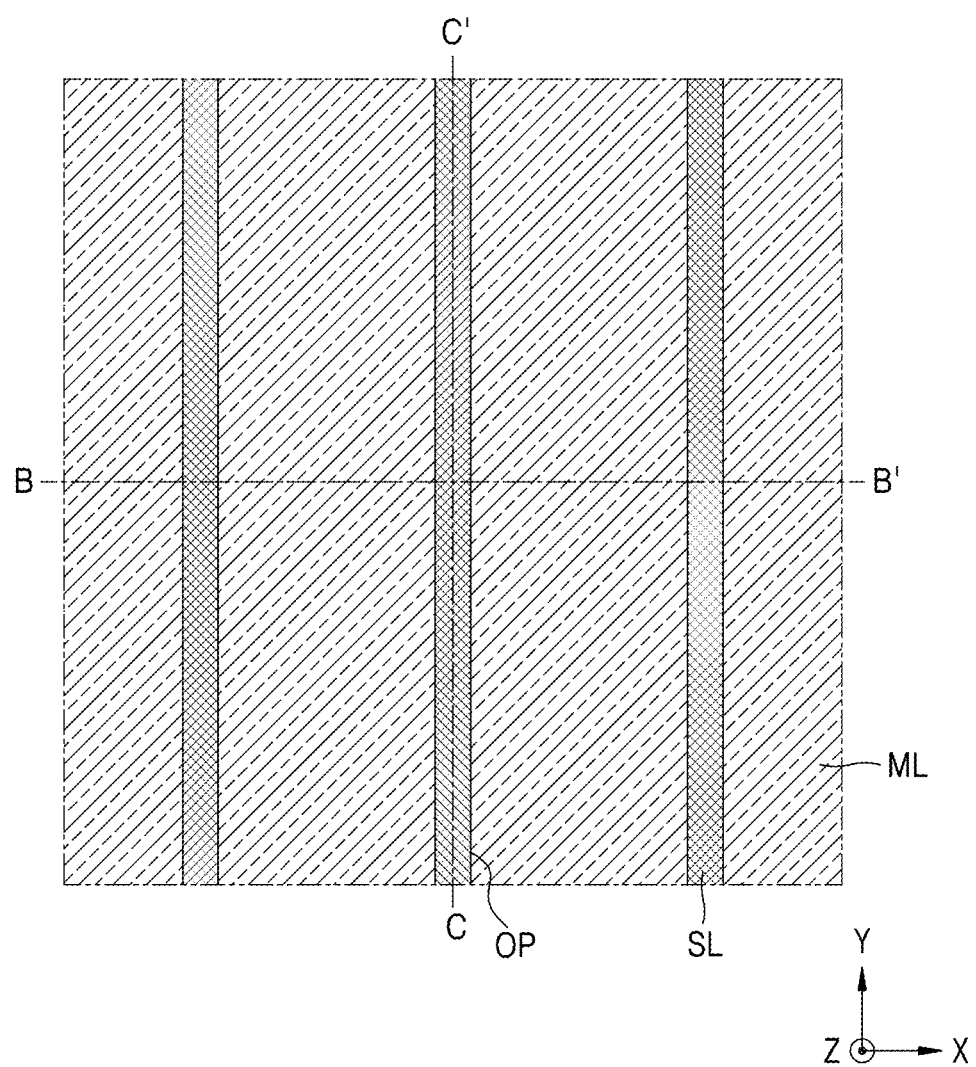
Figure 10B:
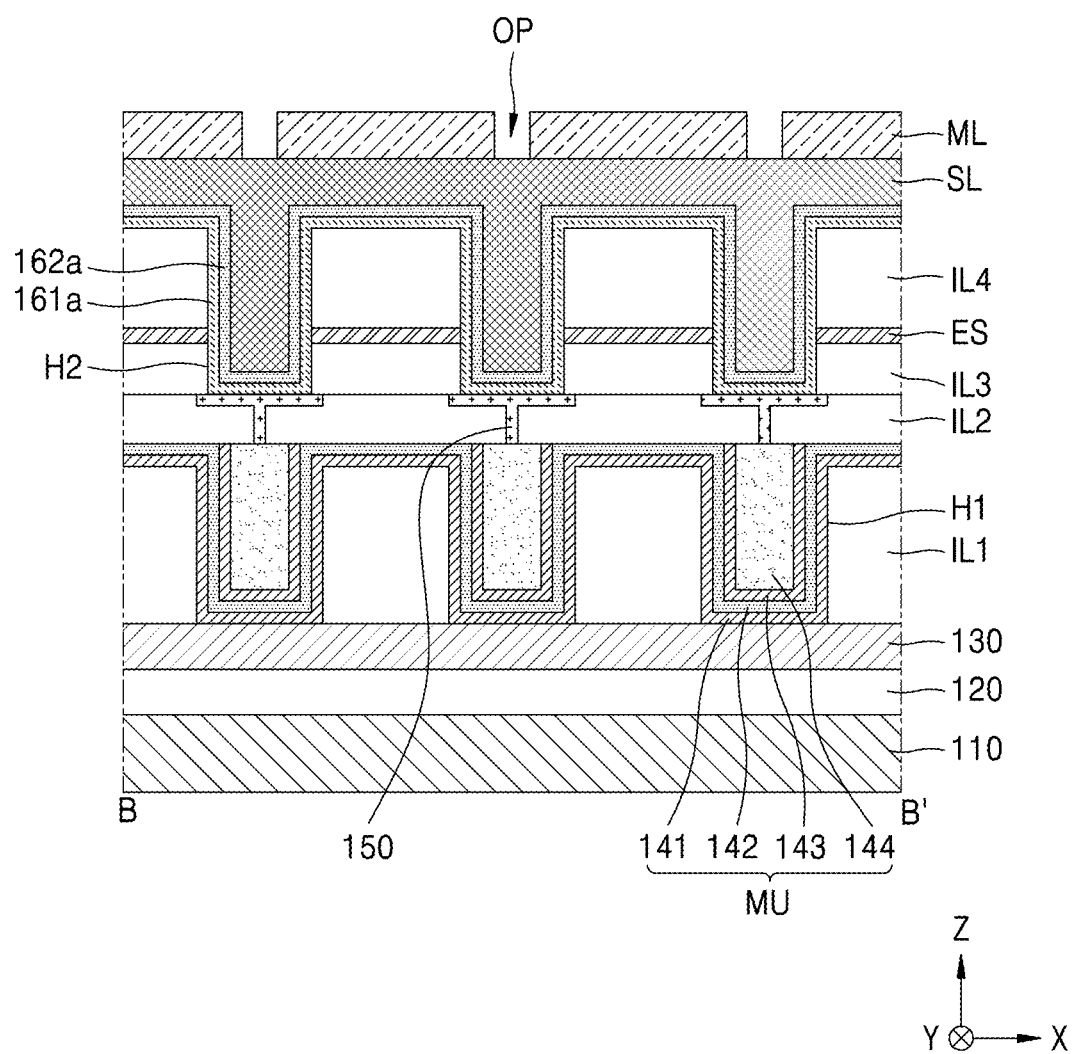
Figure 10C:
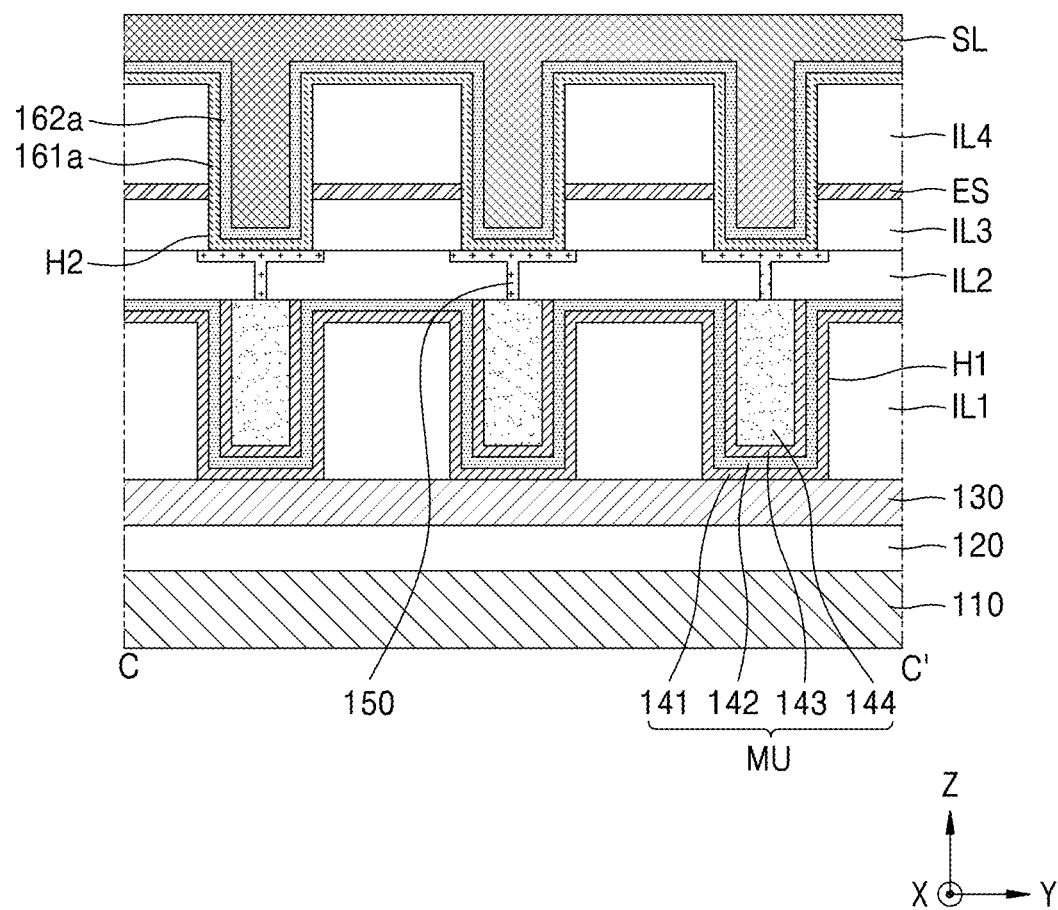
FIGS. 10C, 11C, 12C, 13C, 14C, 15C and 16C are cross-sectional views taken along line C-C' of FIGS. 10A, 11A, 12A, 13A, 14A, 15A and 16A, respectively.

Referring to FIGS. 10A to 10C, a sacrificial layer SL may be formed on the first gate insulating layer 162a. The sacrificial layer SL may fill the second holes H2. A mask pattern ML may be formed on the sacrificial layer SL. The mask pattern ML may have a plurality of line-shaped openings OP extending in parallel in the first horizontal direction (Y direction). Each of the openings OP may expose the sacrificial layer SL.

Figure 11A:
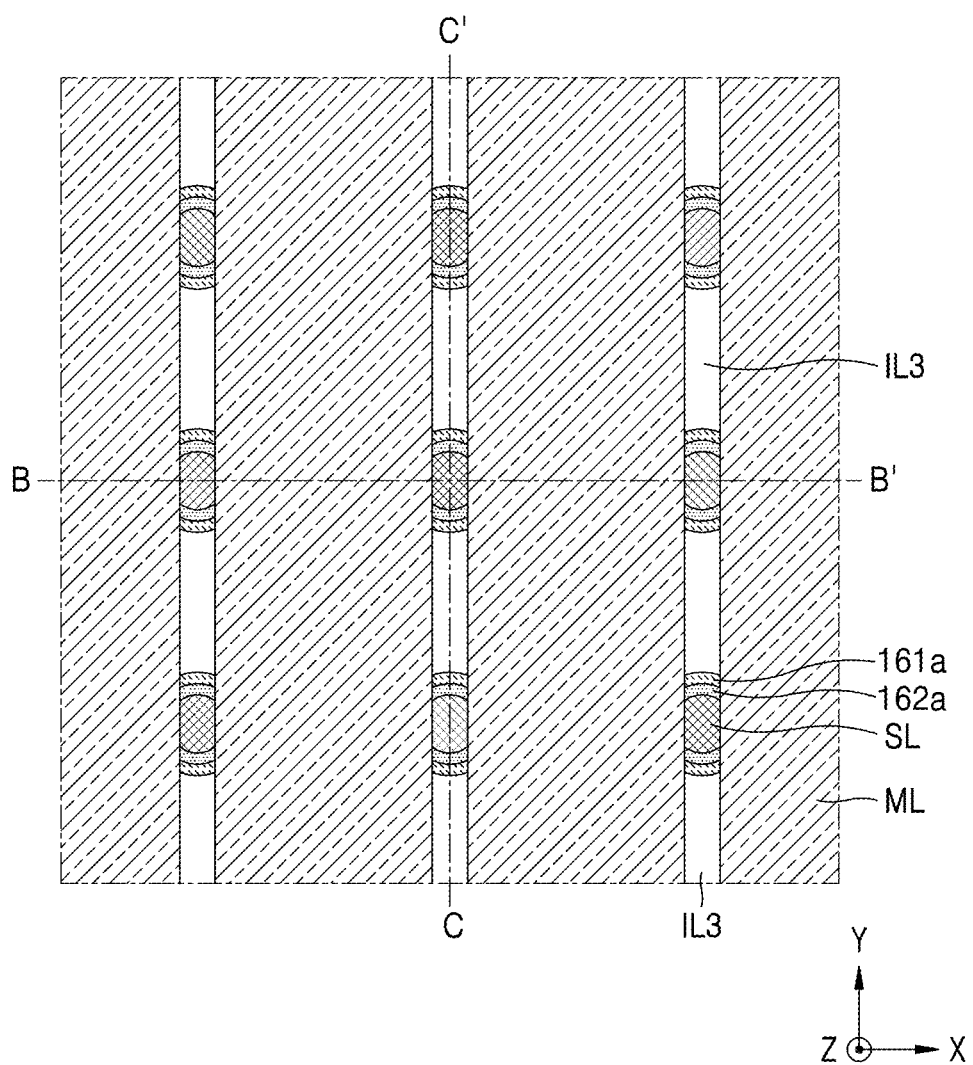
Figure 11B:
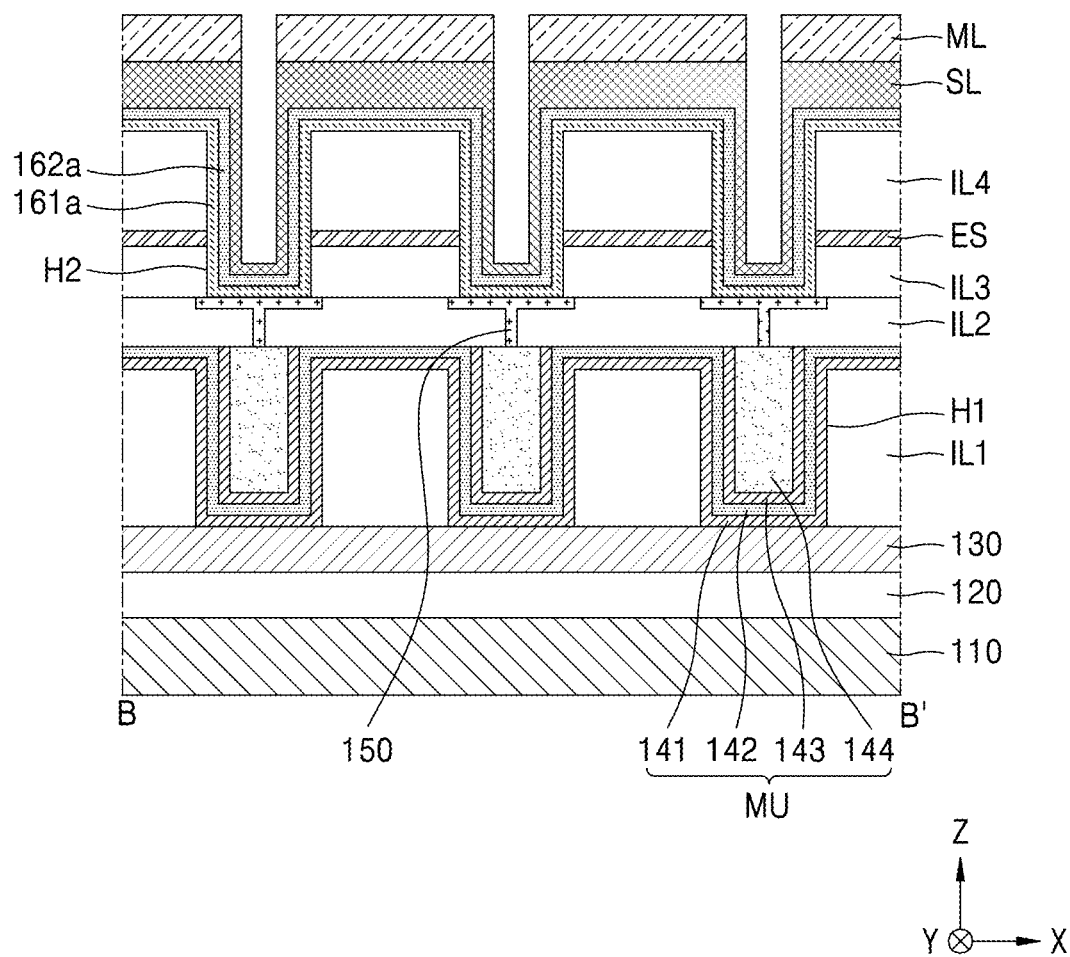
Figure 11C:
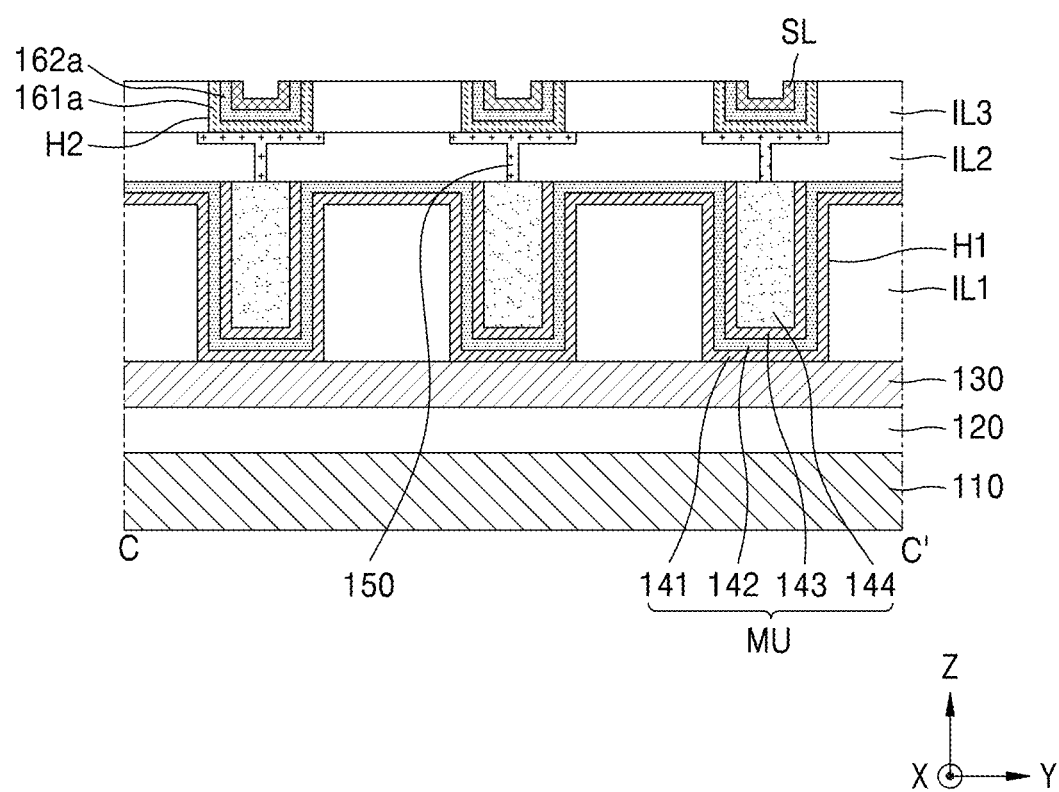

Referring to FIGS. 11A to 11C, the sacrificial layer SL, the first channel layer 161a, the first gate insulating layer 162a, the fourth interlayer insulating layer IL4, and the etch stop layer (ES) may be etched by using the mask pattern ML as an etch mask. The etching may be stopped on the upper surface of the third interlayer insulating layer IL3 by the etch stop layer ES. In addition, portions of the first channel layer 161a, the first gate insulating layer 162a and the sacrificial layer SL located in the second holes H2 may not be removed and may remain in the second holes H2.

Figure 12A:
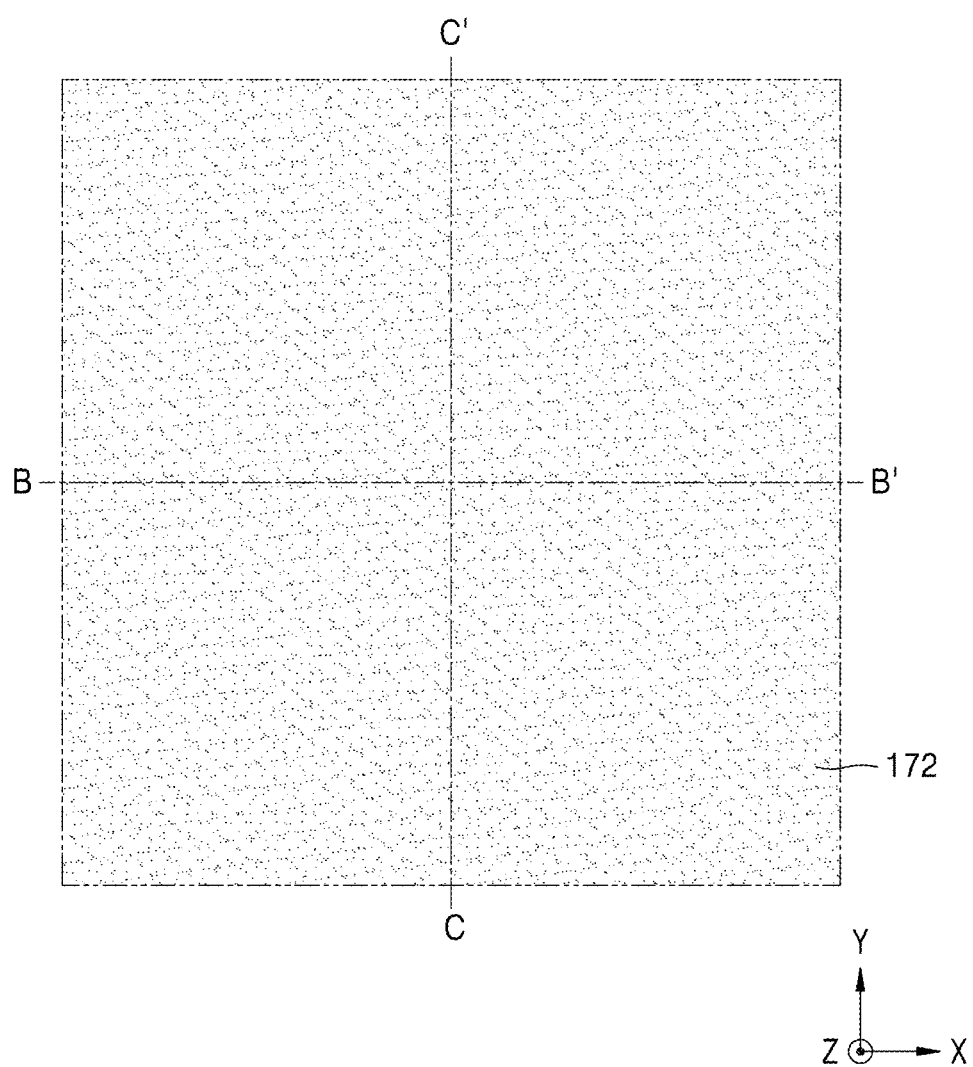
Figure 12B:
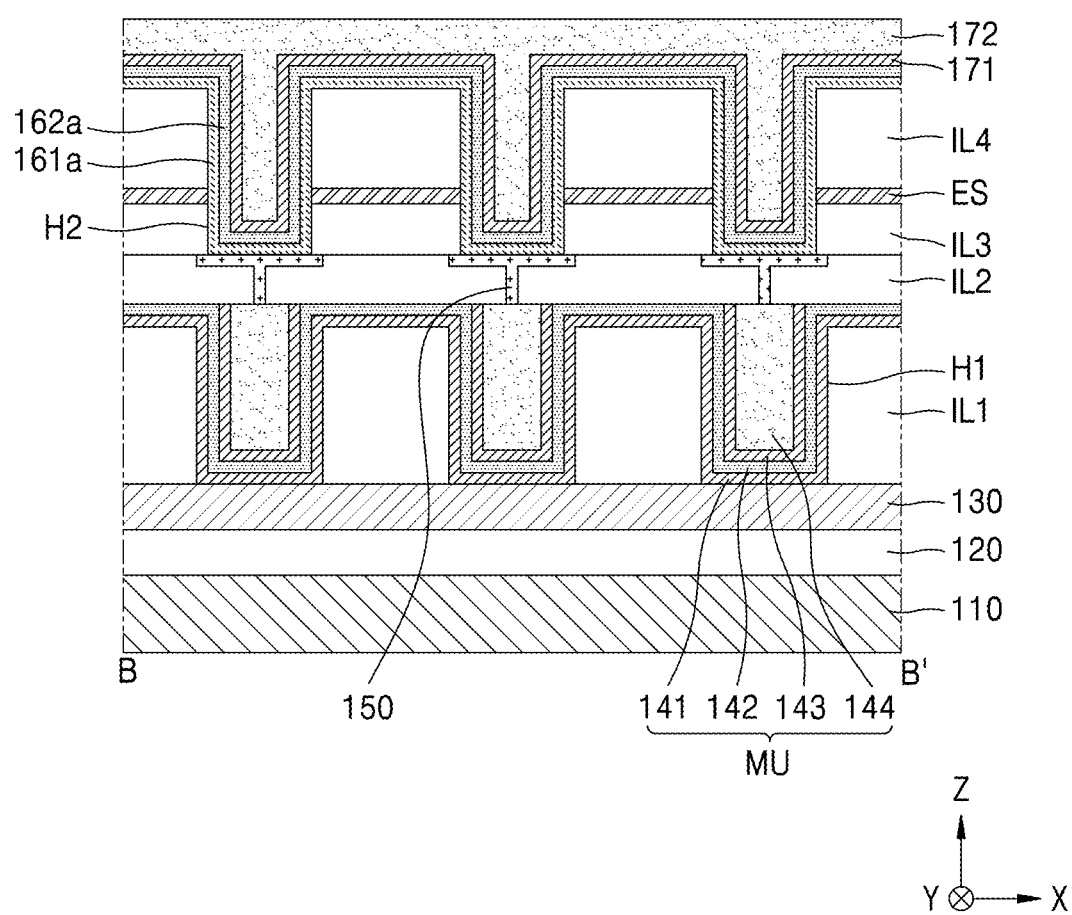
Figure 12C:
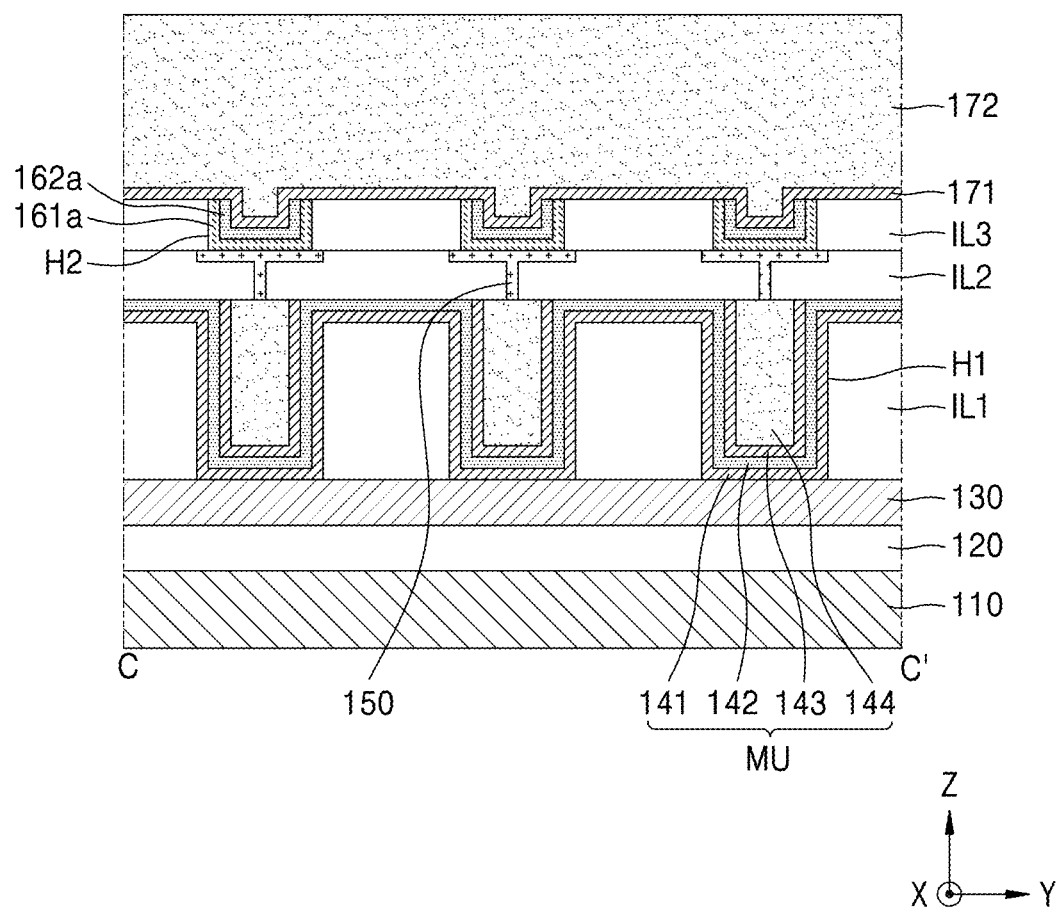

Referring to FIGS. 12A to 12C, the sacrificial layer SL and the mask pattern ML may be removed after the etching. A gate barrier layer 171 may be conformally formed on the first gate insulating layer 162a and the third interlayer insulating layer IL3. Next, a filling layer 172 may be formed on the gate barrier layer 171. The filling layer 172 may fill the second holes H2.

Figure 13A:
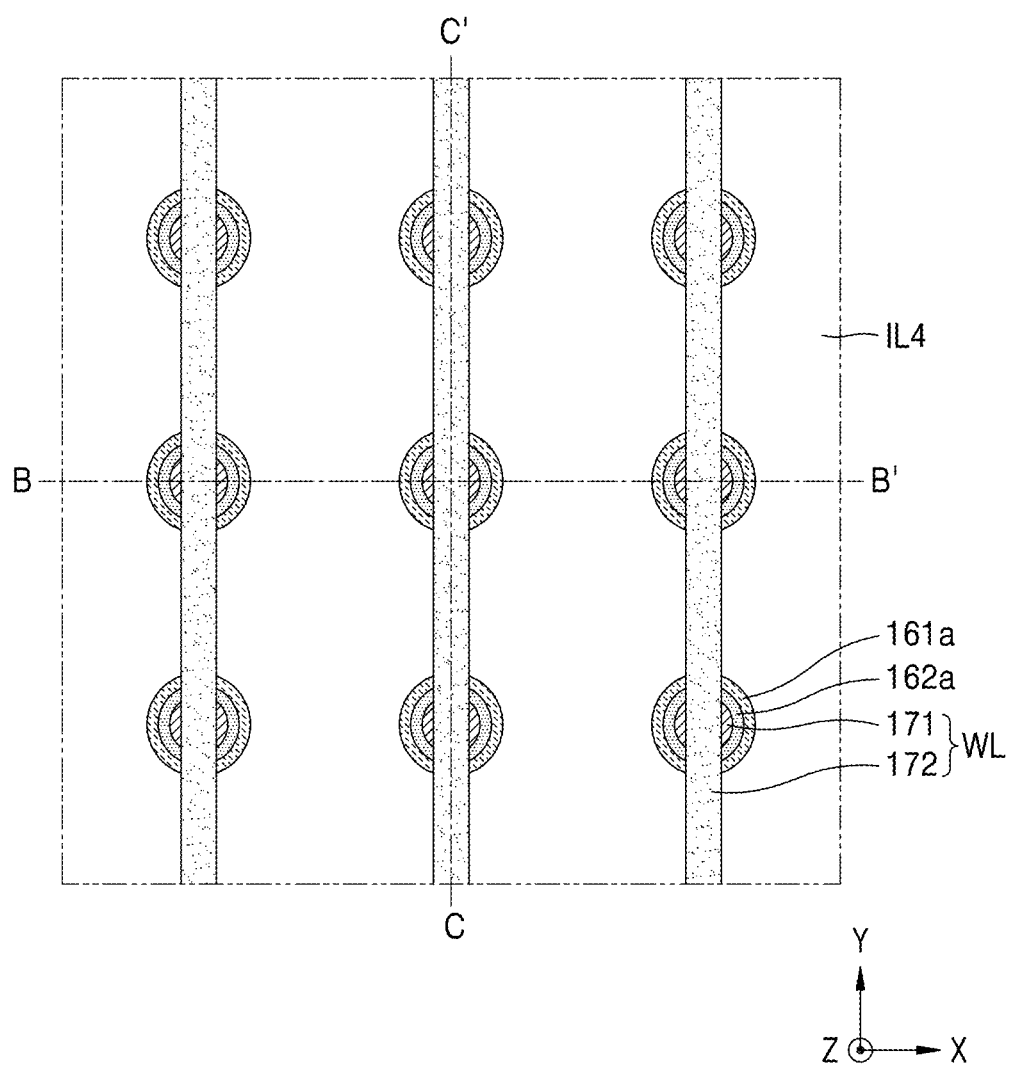
Figure 13B:
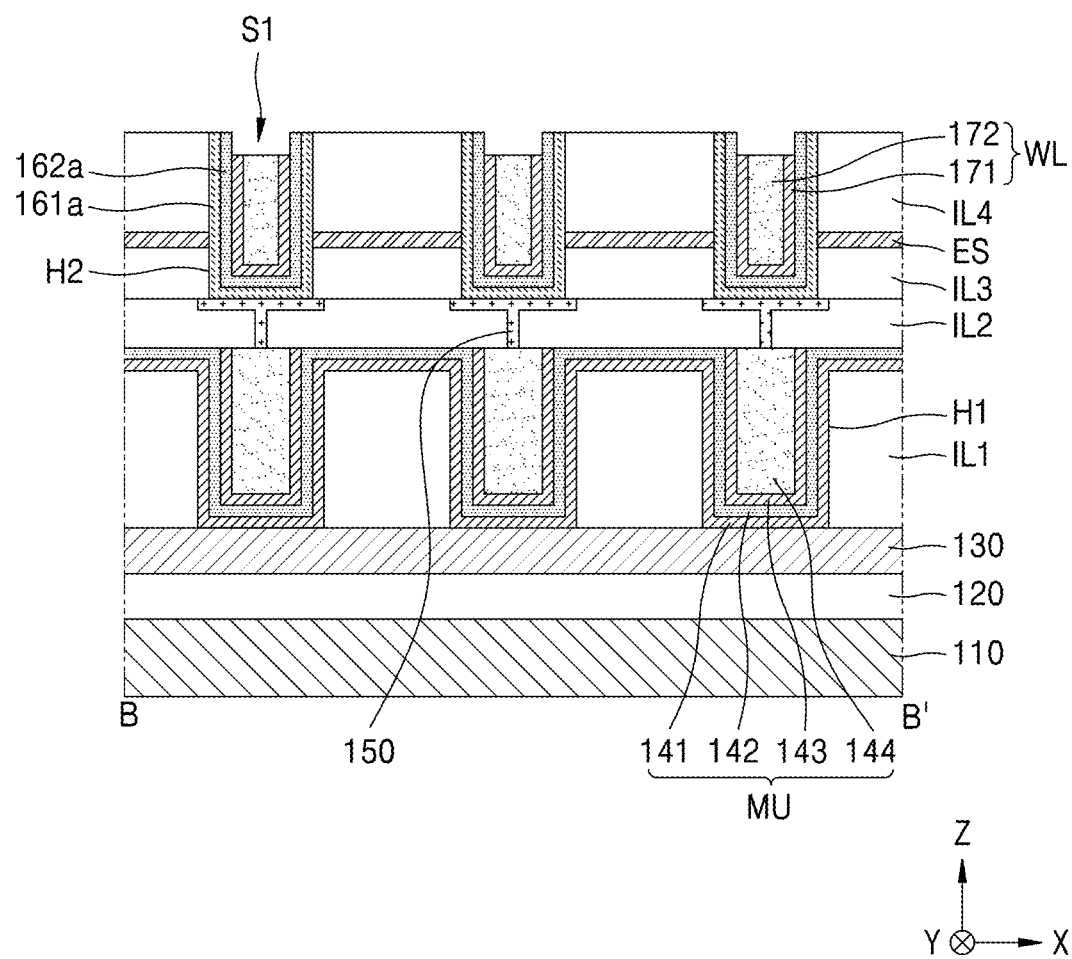
Figure 13C:
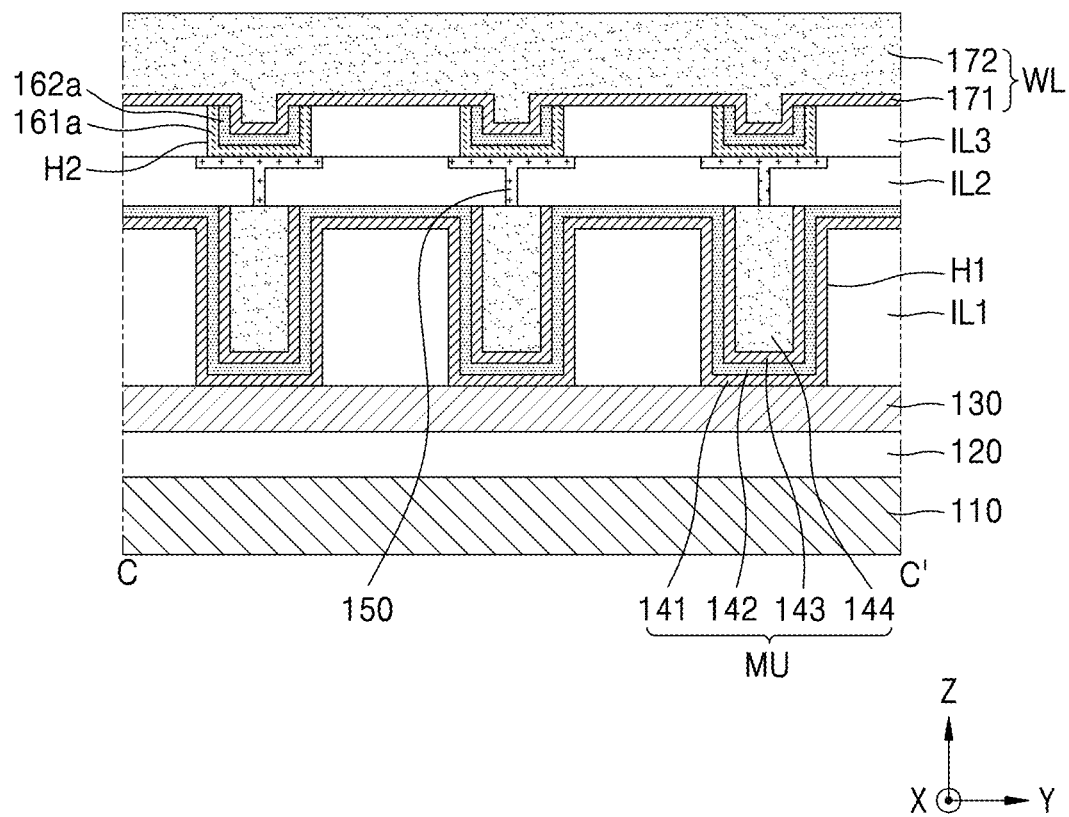

Referring to FIGS. 13A to 13C, portions of the filling layer 172, the gate barrier layer 171, the first gate insulating layer 162a, and the first channel layer 161a may be removed. For example, the filling layer 172, the gate barrier layer 171, the first gate insulating layer 162a, and the first channel layer 161a may be planarized such that the upper surface of the fourth interlayer insulating layer IL4 is exposed. Next, upper portions of the first gate insulating layer 162a and the first channel layer 161a may be removed such that an empty space S1 is formed in an upper portion of the second holes H2. As a result, a word line WL including the filling layer 172 and the gate barrier layer 171 may be formed.

Figure 14A:
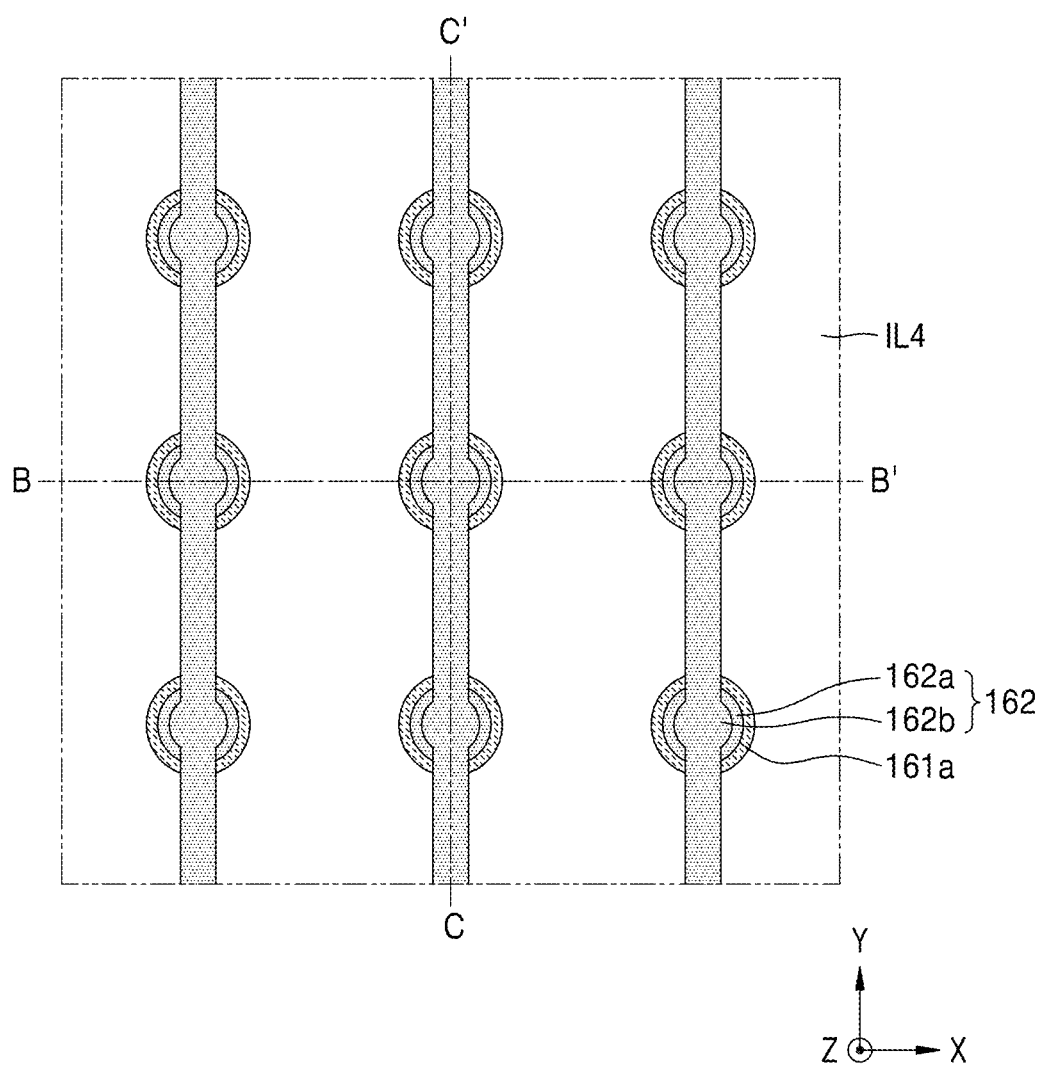
Figure 14B:
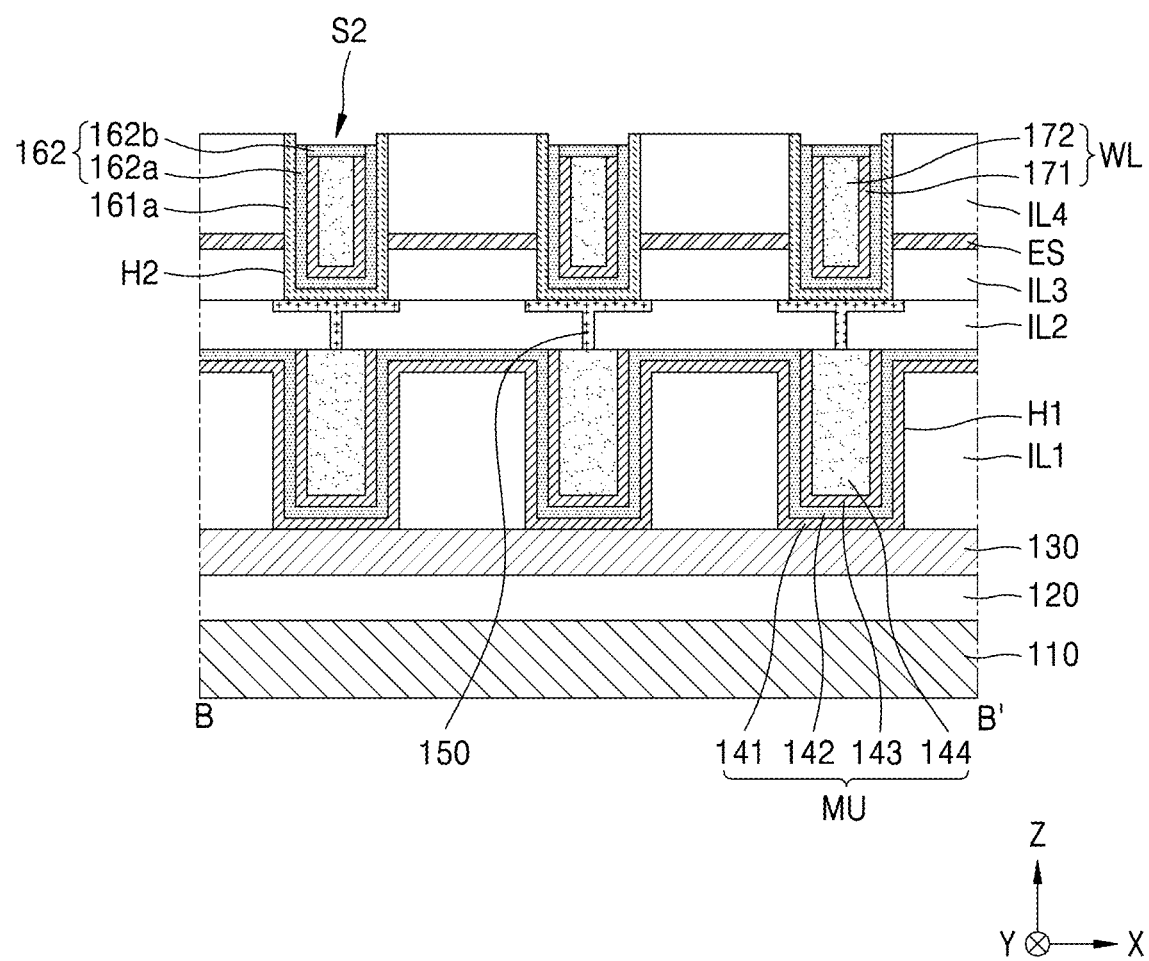
Figure 14C:
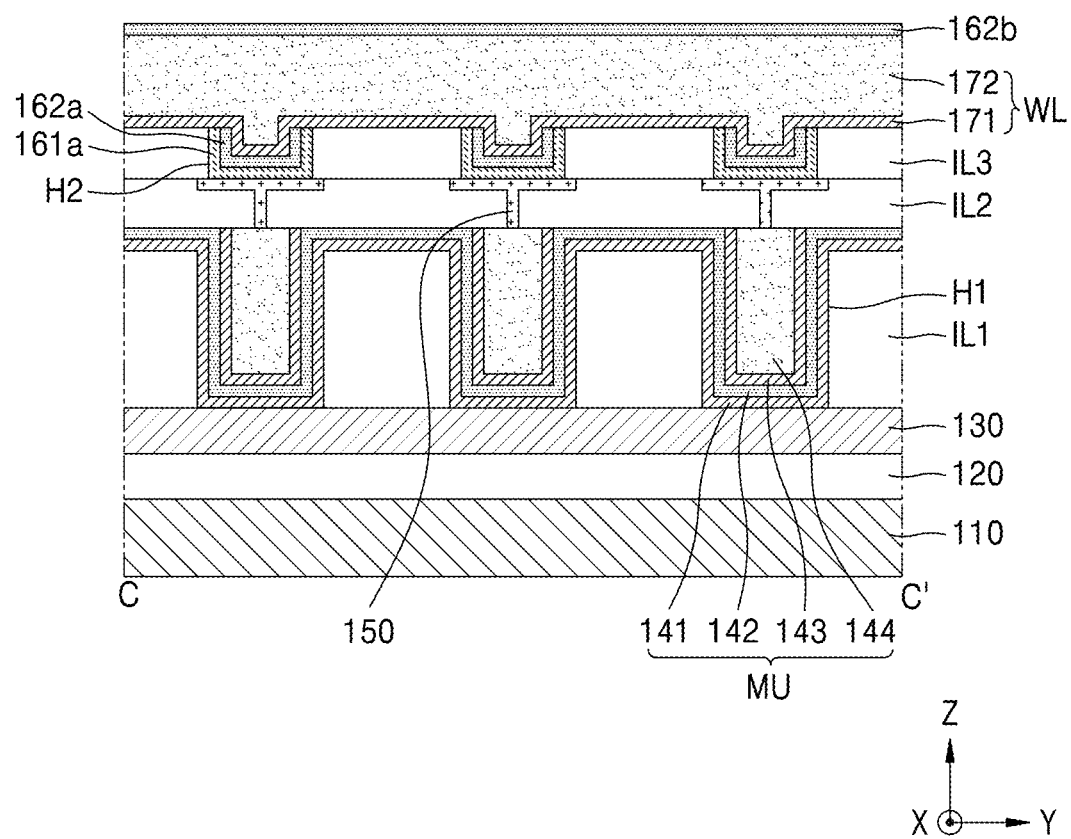

Referring to FIGS. 14A to 14C, a second gate insulating layer 162b may be formed on the word line WL. The second gate insulating layer 162b may fill an upper portion of the second holes H2. For example, the second gate insulating layer 162b may be formed on the fourth interlayer insulating layer IL4 and the word line WL, and a portion of the second gate insulating layer 162b on the fourth interlayer insulating layer IL4 may be removed, for example, by planarization or anisotropic etching. The first gate insulating layer 162a and/or the second gate insulating layer 162b may be etched such that an empty space S2 is formed in an upper portion of the second holes H2. The first gate insulating layer 162a and the second gate insulating layer 162b may include the same material and may form a gate insulating layer 162 together.

Figure 15A:
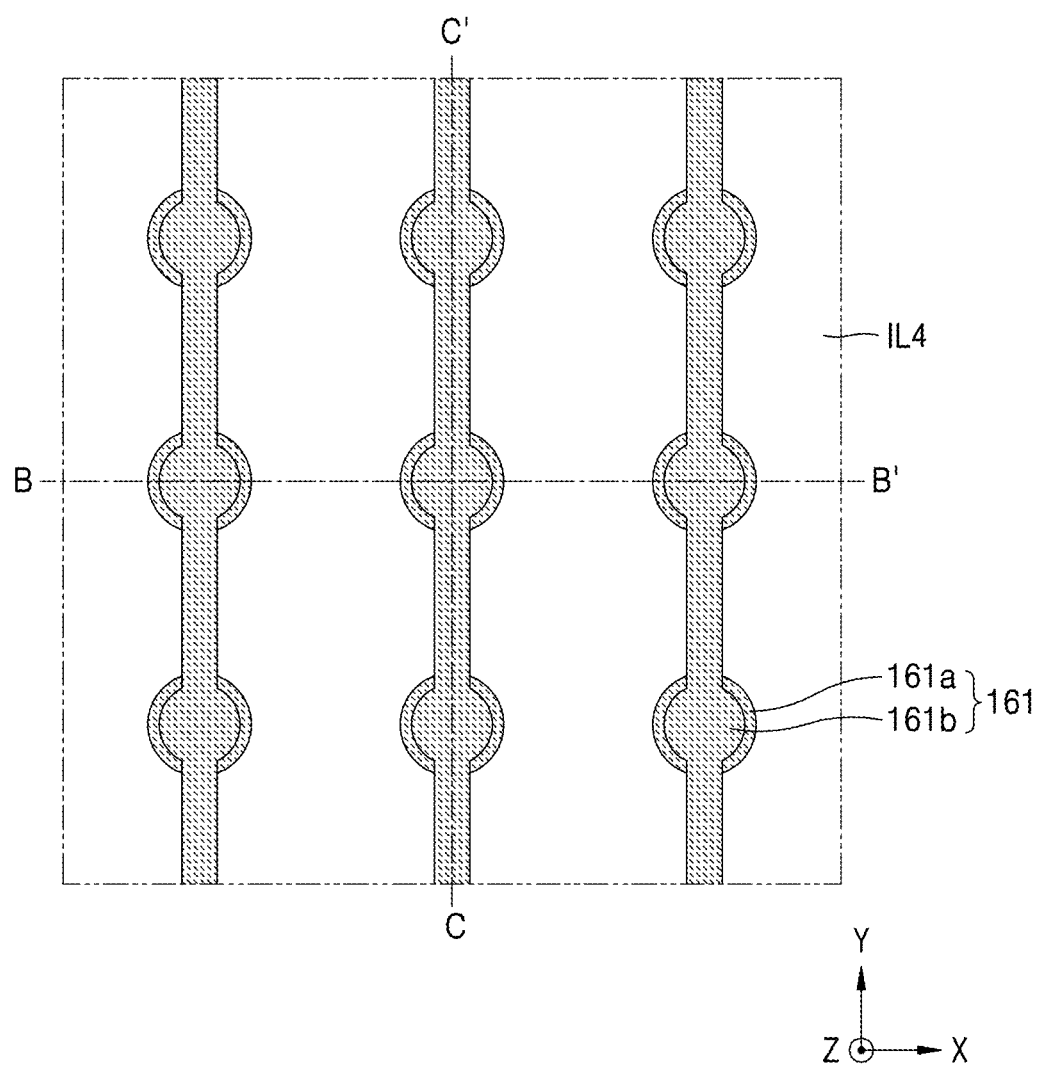
Figure 15B:
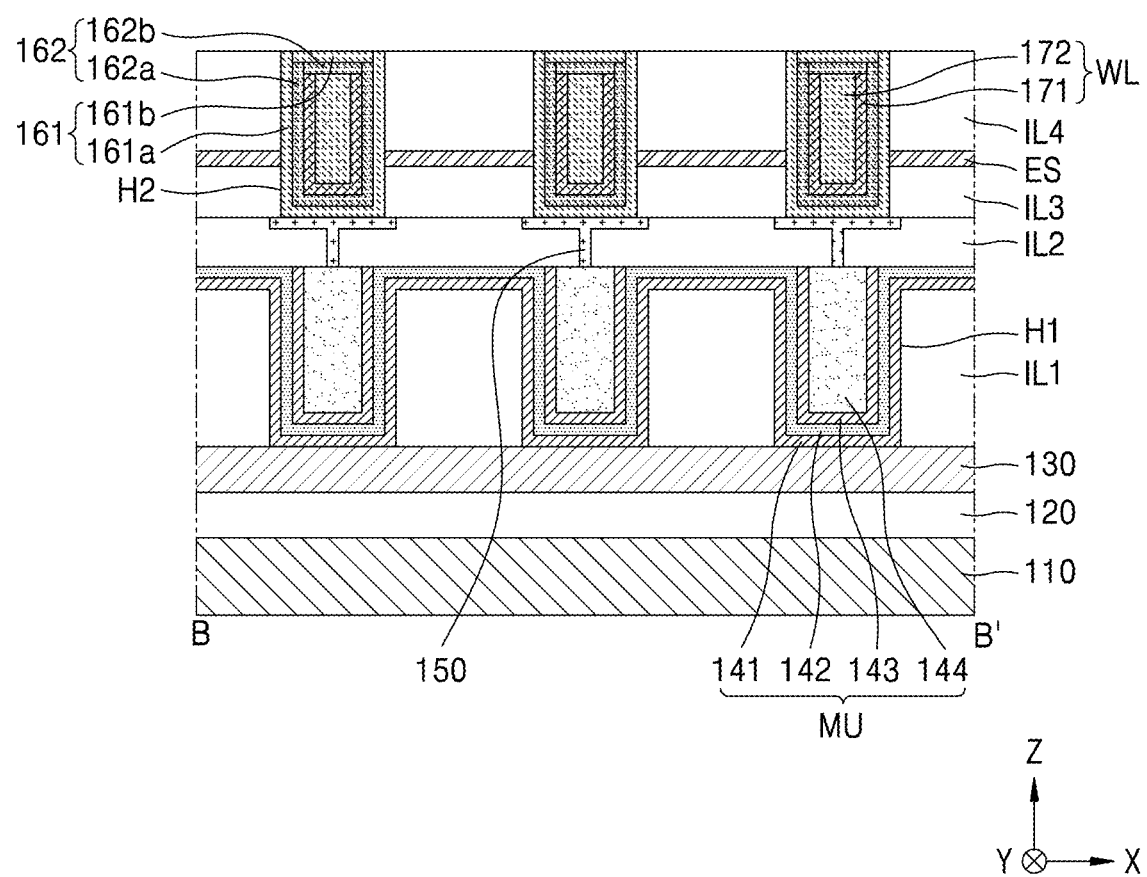
Figure 15C:
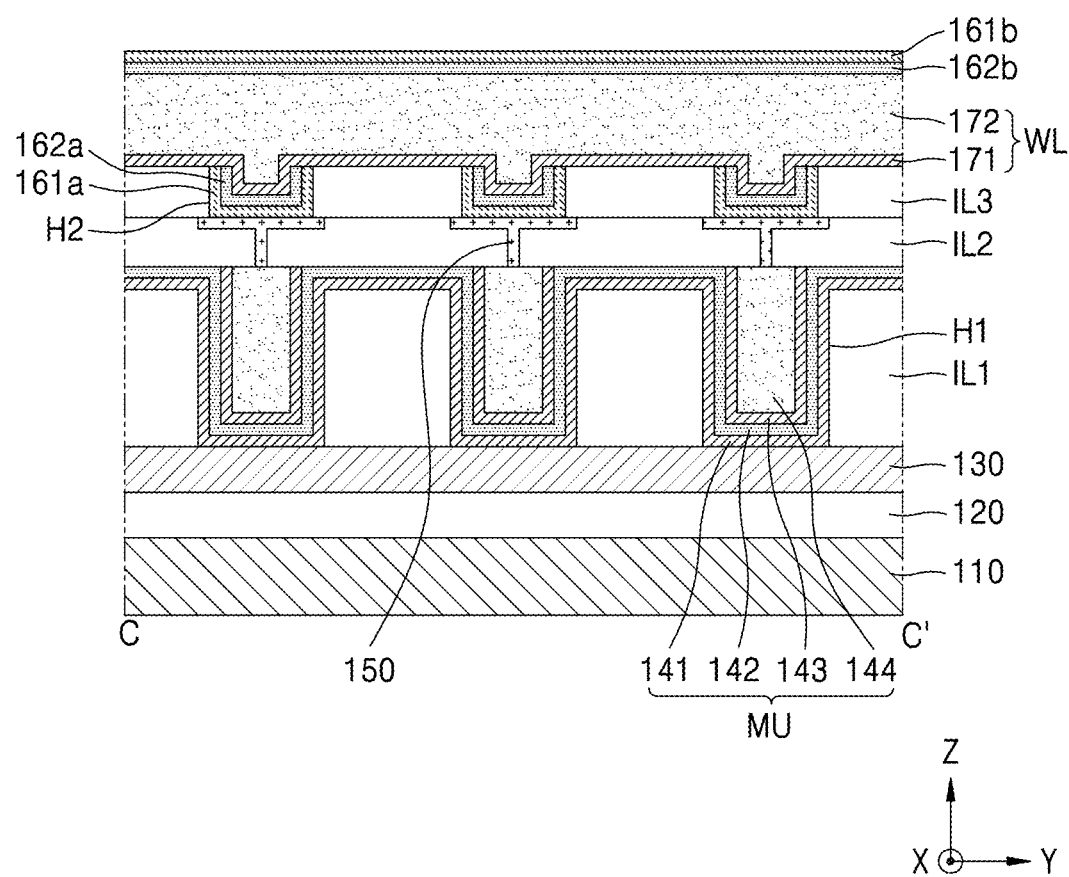

Referring to FIGS. 15A to 15C, a second channel layer 161b may be formed on the gate insulating layer 162. The second channel layer 161b may fill the upper portion of the second holes H2. For example, the second channel layer 161b may be formed on the second gate insulating layer 162b and the fourth interlayer insulating layer IL4, and the second channel layer 161b may be anisotropically etched or planarized such that the upper surface of the fourth interlayer insulating layer IL4 is exposed.

Figure 16A:
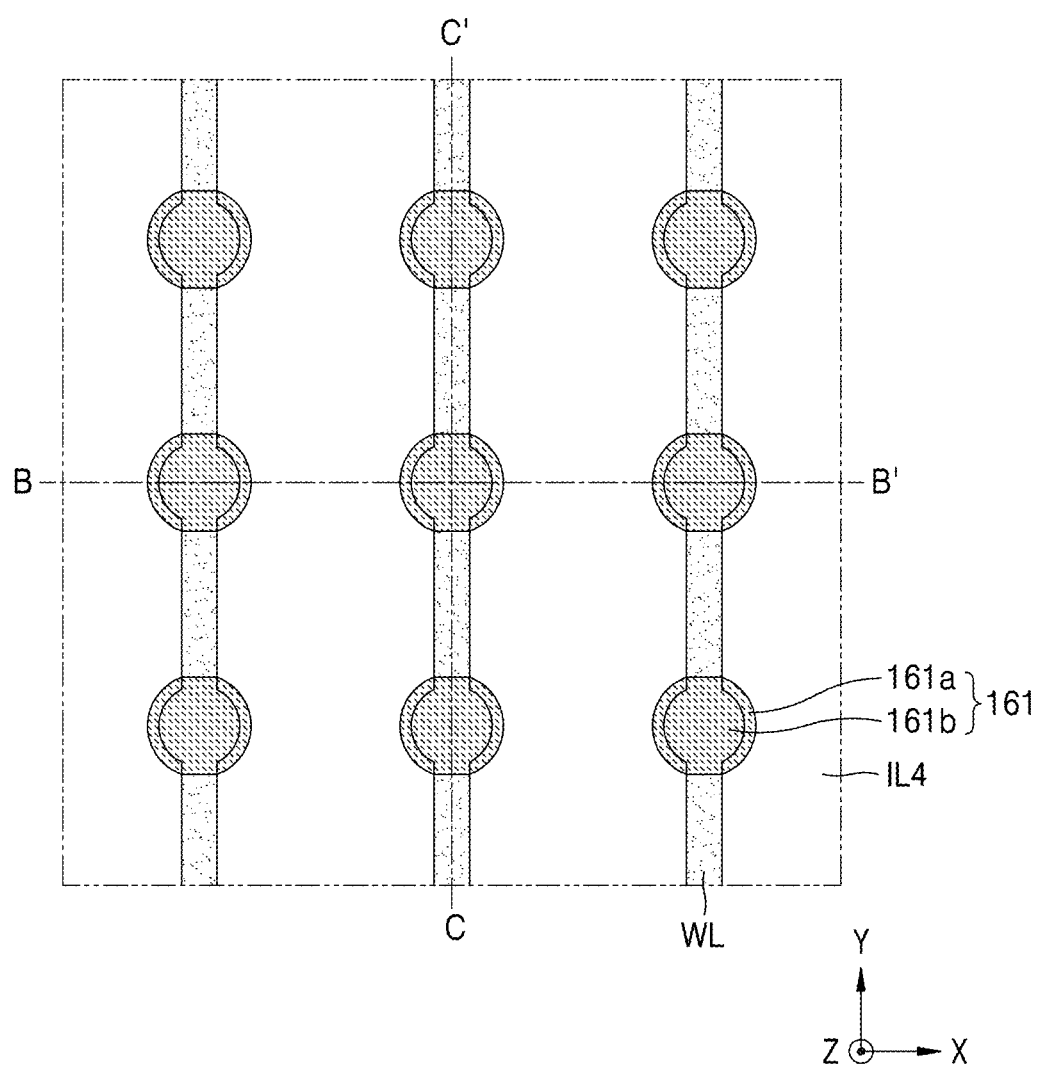
Figure 16B:
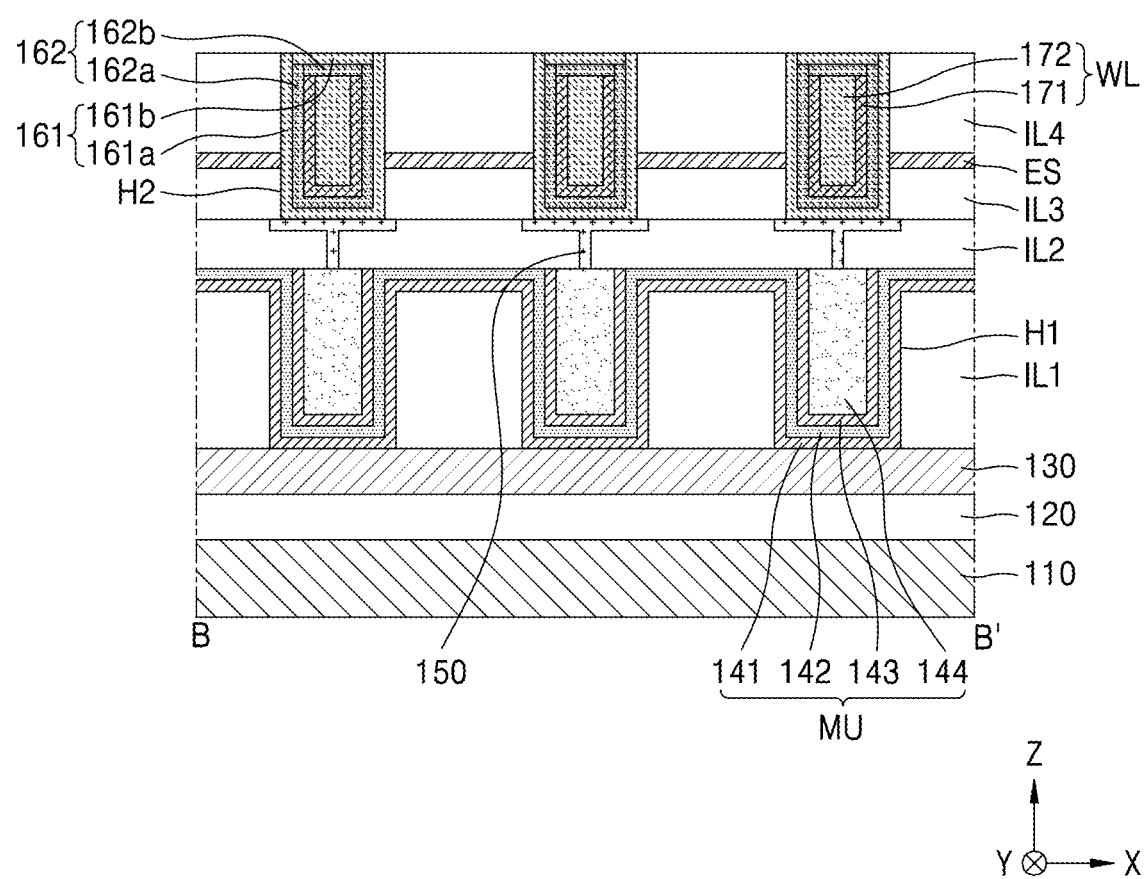
Figure 16C:
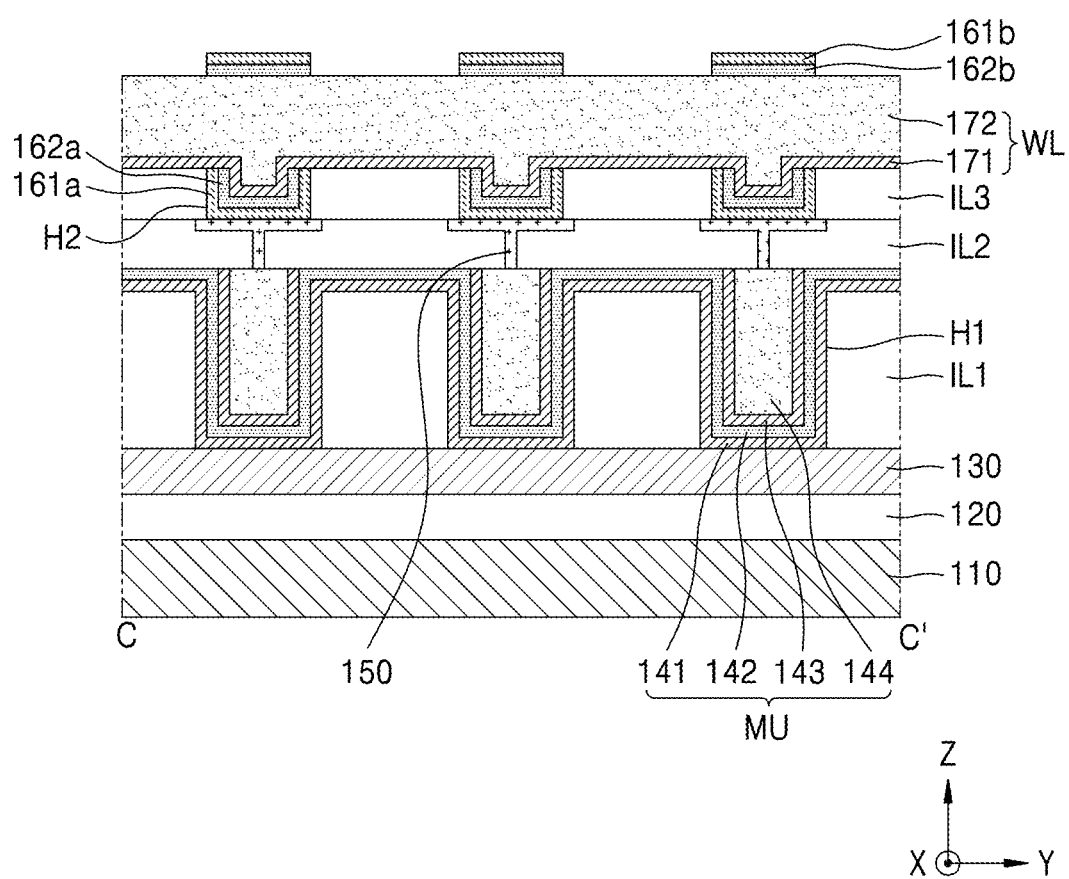

Referring to FIGS. 16A to 16C, the second channel layer 161b and the second gate insulating layer 162b may be patterned to thereby separate the second channel layer 161b and the second gate insulating layer 162b into a plurality of portions. For example, the second channel layer 161b and the second gate insulating layer 162b may be patterned by forming a mask pattern on the second channel layer 161b and the fourth interlayer insulating layer IL4 and etching the second channel layer 161b and the second gate insulating layer 162b by using the mask pattern as an etching mask. Portions of the second channel layer 161b and the second gate insulating layer 162b may be aligned with the plurality of second holes H2, respectively.

Referring to FIGS. 2A to 2C, a fifth interlayer insulating layer IL5 may be formed on the selection unit SU and the word line WL. The bit line BL contacting the selection unit SU may be formed in the fifth interlayer insulating layer IL5. The memory device 100 shown in FIGS. 2A to 2C may be manufactured according to the manufacturing method described with reference to FIGS. 4A to 16C and 2A to 2C.

FIGS. 17A, 18A, 19A, 20A, 21A, 22A, 23A, 24A, 25A, 26A and 27A are plan views illustrating a method of manufacturing a memory device according to an example embodiment. FIGS. 17B, 18B, 19B, 20B, 21B, 22B, 23B, 24B, 25B, 26B and 27B are cross-sectional views taken along line B-B' of FIGS. 17A, 18A, 19A, 20A, 21A, 22A, 23A, 24A, 25A, 26A and 27A, respectively. FIGS. 19C, 20C, 21C, 22C, 23C, 24C, 25C, 26C and 27C are cross-sectional views taken along line C-C' of FIGS. 19A, 20A, 21A, 22A, 23A, 24A, 25A, 26A and 27A, respectively. FIGS. 19D, 20D, 21D and 22D are cross-sectional views taken along line D-D' of FIGS. 19A, 20A, 21A and 22A, respectively.

Figure 17A:
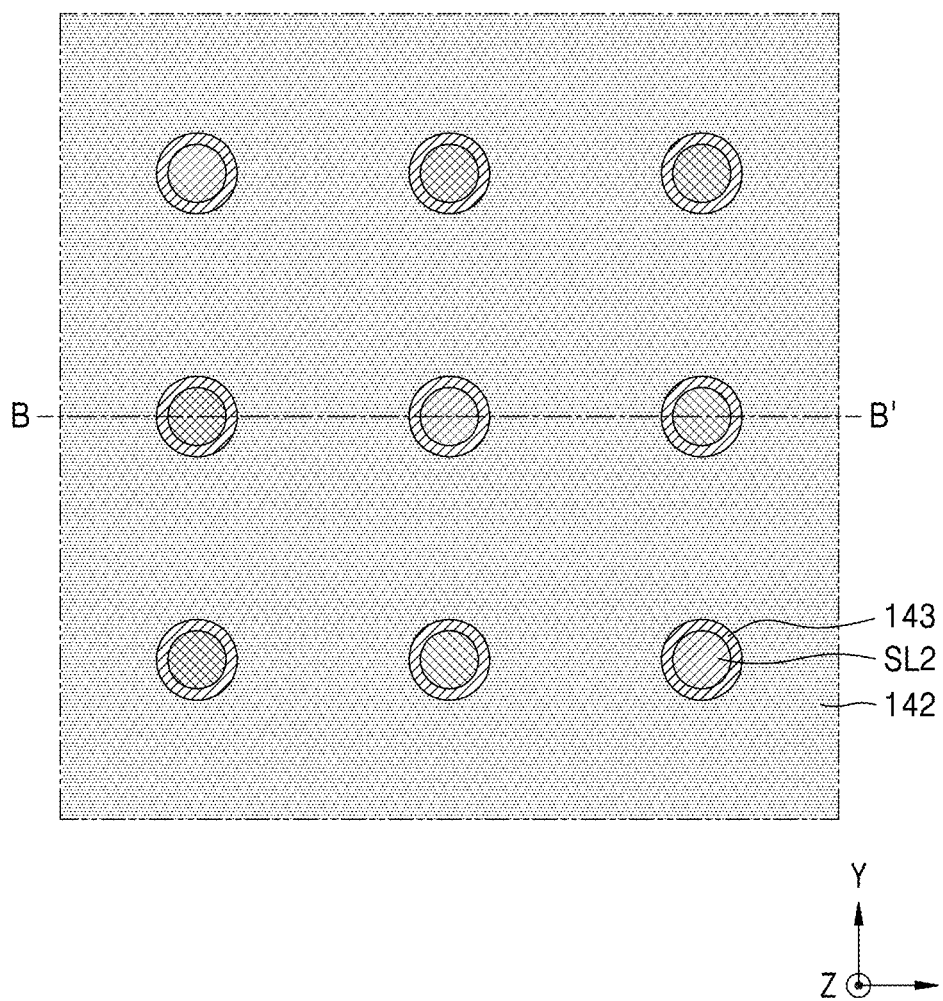
FIGS. 17A, 18A, 19A, 20A, 21A, 22A, 23A, 24A, 25A, 26A and 27A are plan views illustrating a method of manufacturing a memory device according to an example embodiment.
Figure 17B:
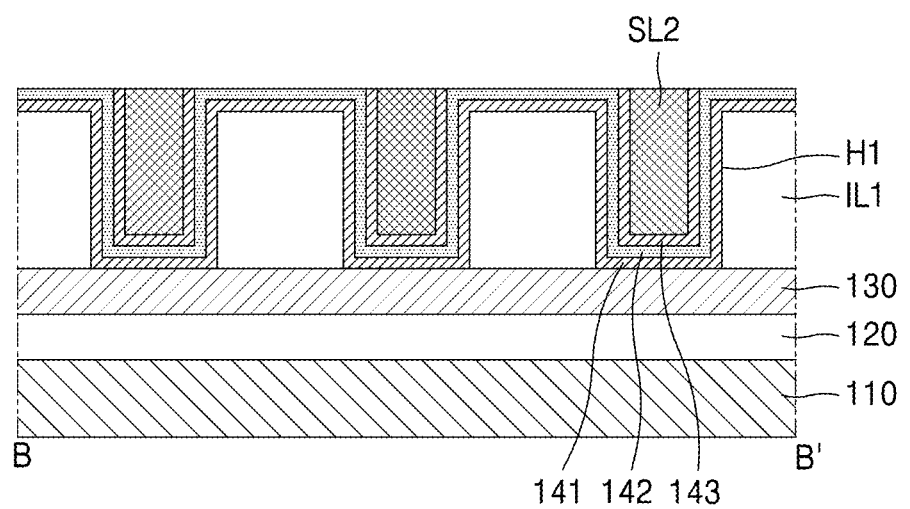
FIGS. 17B, 18B, 19B, 20B, 21B, 22B, 23B, 24B, 25B, 26B and 27B are cross-sectional views taken along line B-B' of FIGS. 17A, 18A, 19A, 20A, 21A, 22A, 23A, 24A, 25A, 26A and 27A, respectively.
Figure 17B:
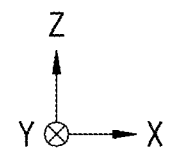

Referring to FIGS. 17A and 17B, a lower insulating layer 120 may be formed on a substrate 110. Next, a ground plate 130 may be formed on the lower insulating layer 120. Next, a first interlayer insulating layer IL1 having a plurality of first holes H1 may be formed on the ground plate 130.

Next, a lower electrode 141 may be conformally formed on the first interlayer insulating layer IL1. More specifically, the lower electrode 141 may be formed on the upper surface of the first interlayer insulating layer IL1 and on the side and bottom of each of the first holes H1 of the first interlayer insulating layer IL1. Next, a dielectric layer 142 may be conformally formed on the lower electrode 141. Next, an upper barrier layer 143 may be conformally formed on the dielectric layer 142.

Next, a sacrificial layer SL2 may be formed on the upper barrier layer 143 to fill the first holes H1. An upper portion of the sacrificial layer SL2 and an upper portion of the upper barrier layer 143 may be removed together such that a portion of the upper barrier layer 143 and a portion of the sacrificial layer SL2 on the upper surface of the first interlayer insulating layer IL1 may be removed. For example, an upper portion of the sacrificial layer SL2 and an upper portion of the upper barrier layer 143 may be planarized together such that the dielectric layer 142 is exposed. Through this removal, the remaining portions of the upper barrier layer 143 may be separated from each other. After the remaining portions of the upper barrier layer 143 are separated from each other, the sacrificial layer SL2 may be removed.

Figure 18A:
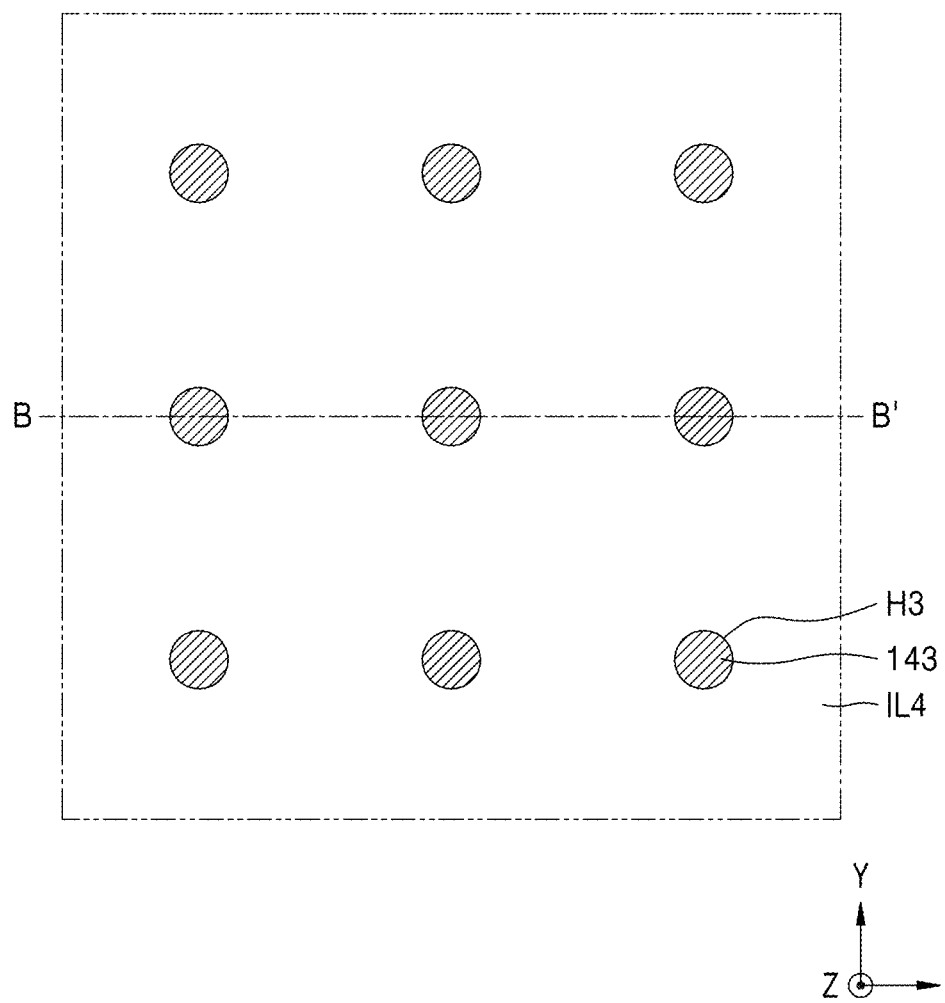
Figure 18B:
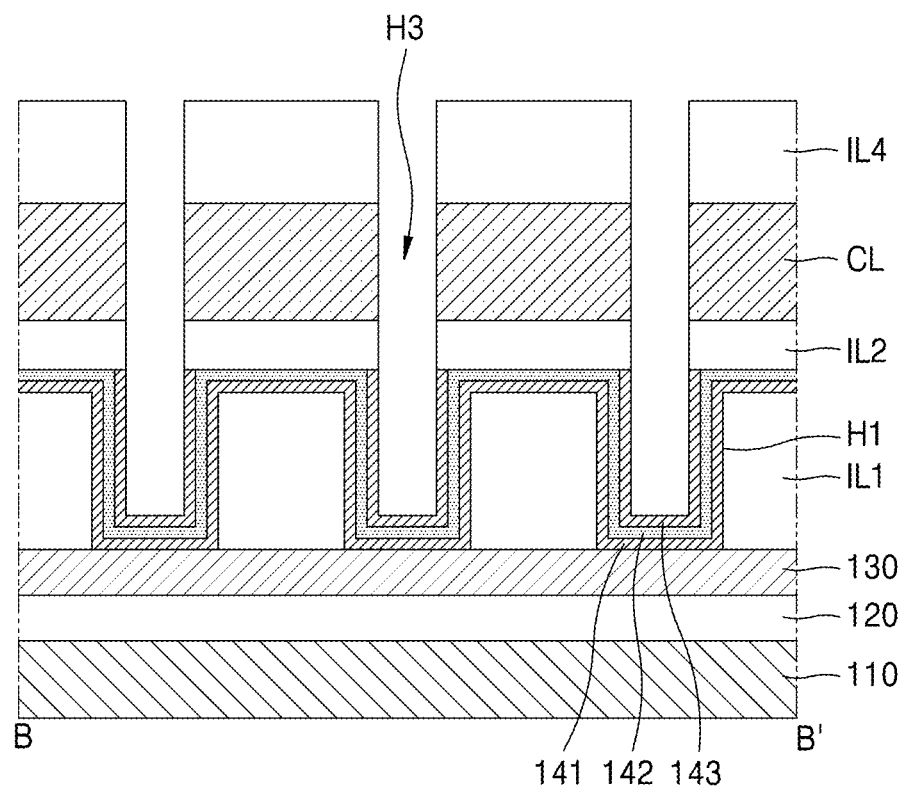
Figure 19A:
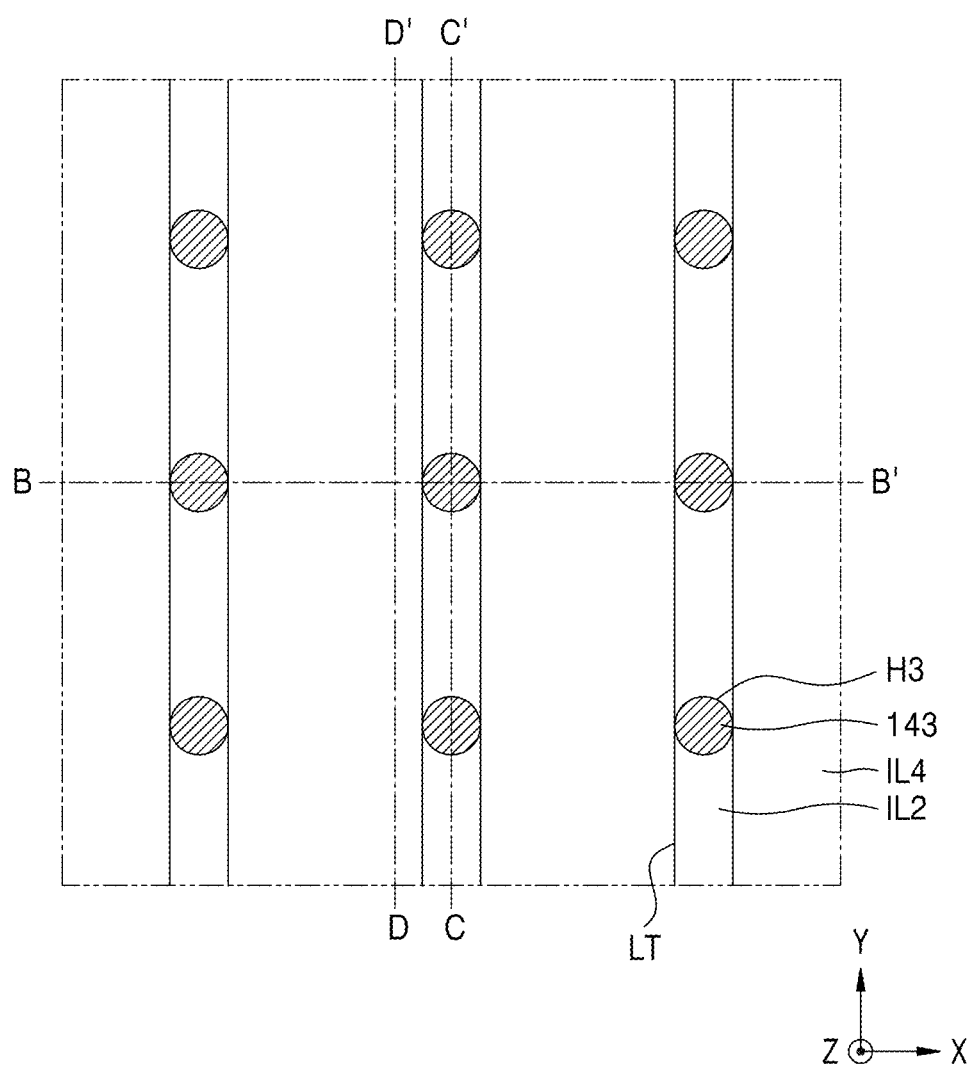
Figure 19B:
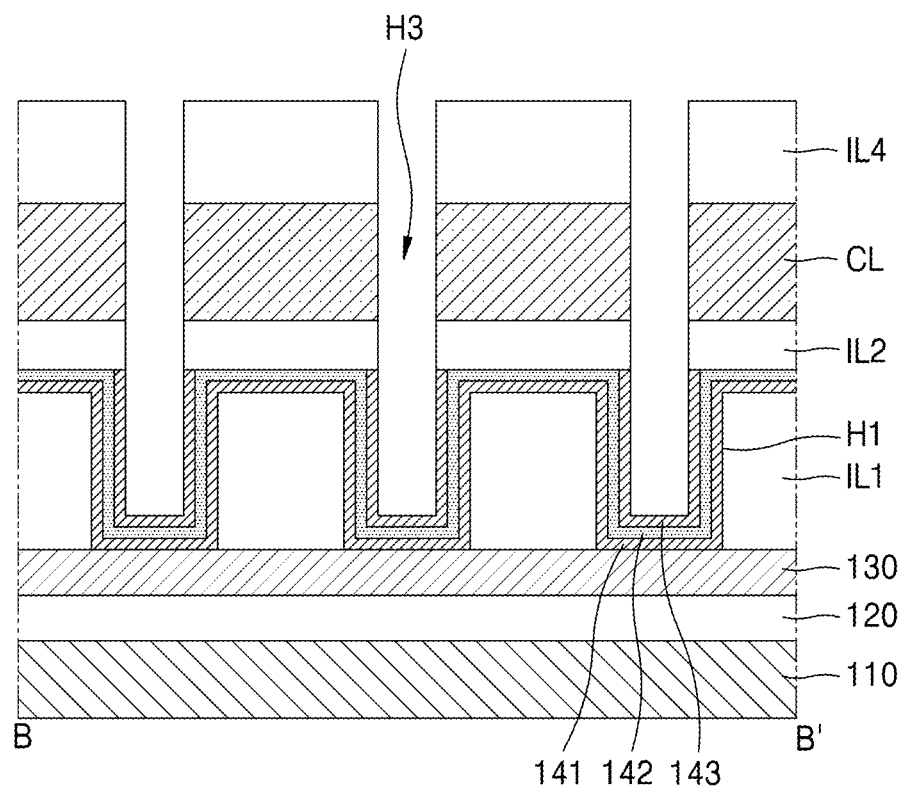
Figure 19C:
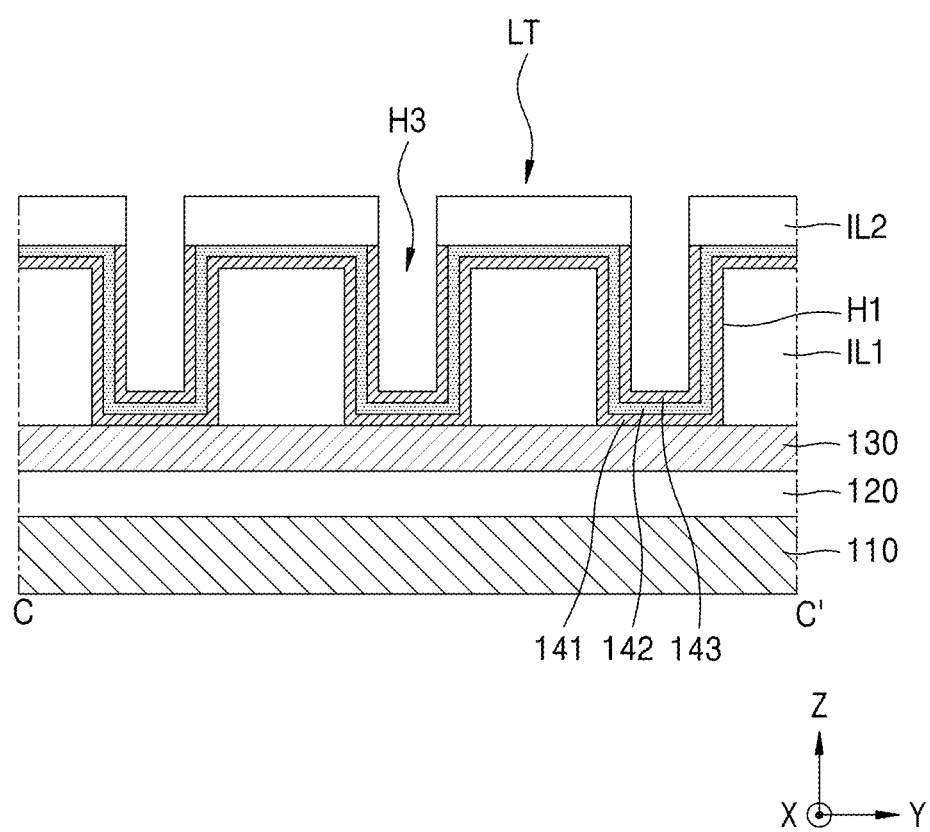
FIGS. 19C, 20C, 21C, 22C, 23C, 24C, 25C, 26C and 27C are cross-sectional views taken along line C-C' of FIGS. 19A, 20A, 21A, 22A, 23A, 24A, 25A, 26A and 27A, respectively.
Figure 19D:
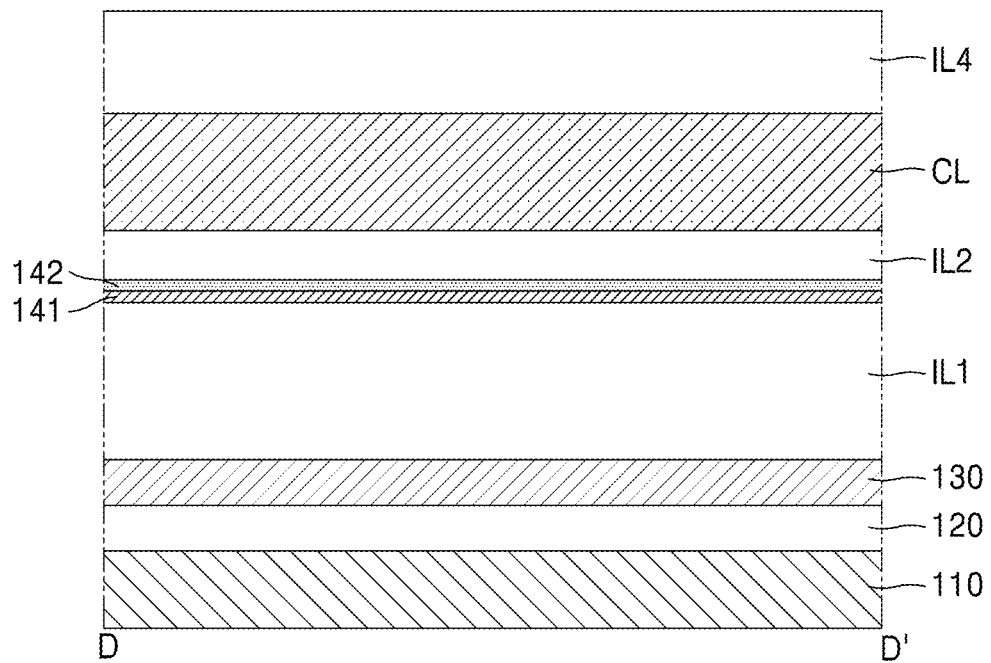
FIGS. 19D, 20D, 21D and 22D are cross-sectional views taken along line D-D' of FIGS. 19A, 20A, 21A and 22A, respectively.
Figure 20A:
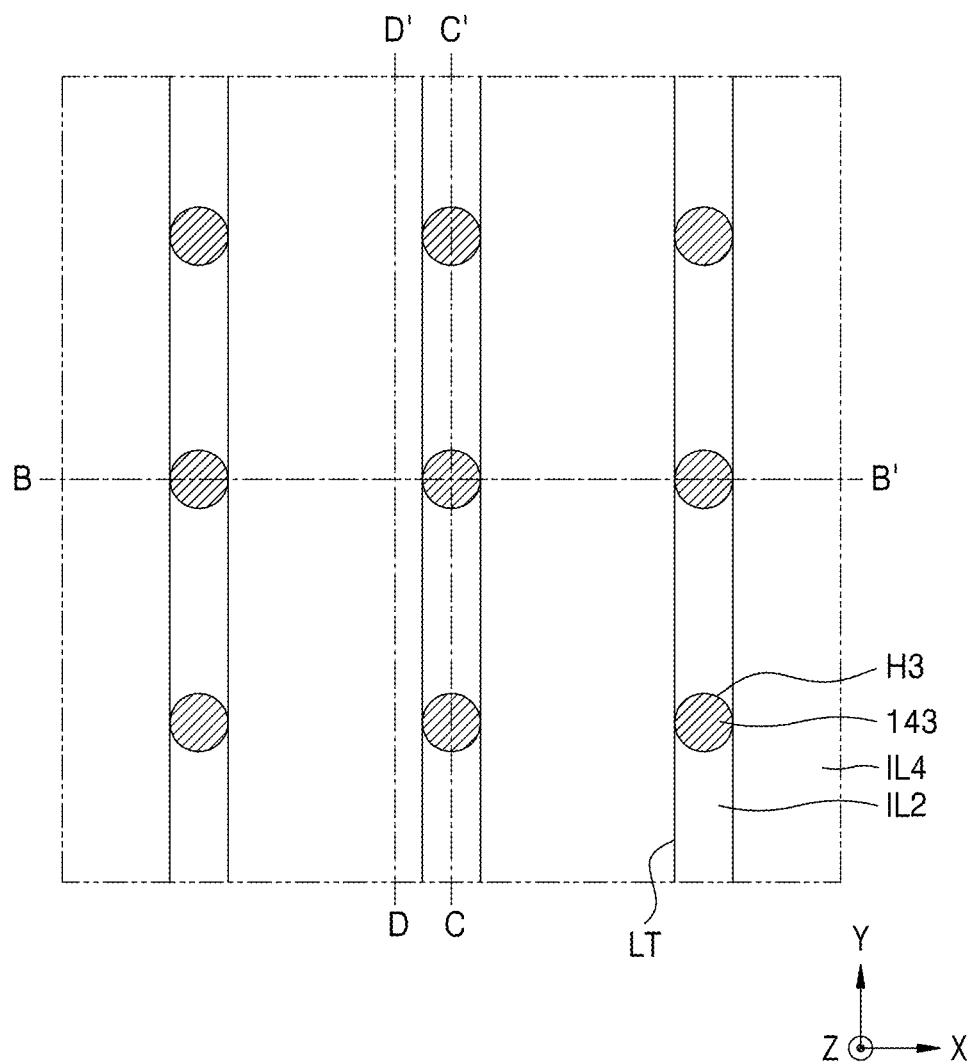
Figure 20B:
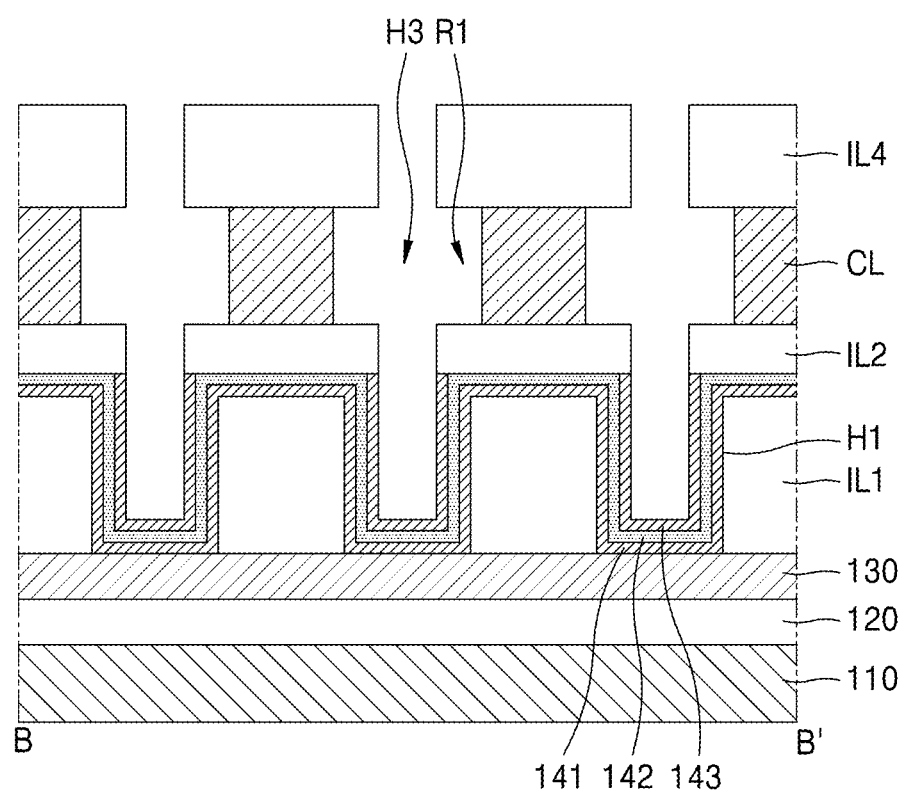
Figure 20C:
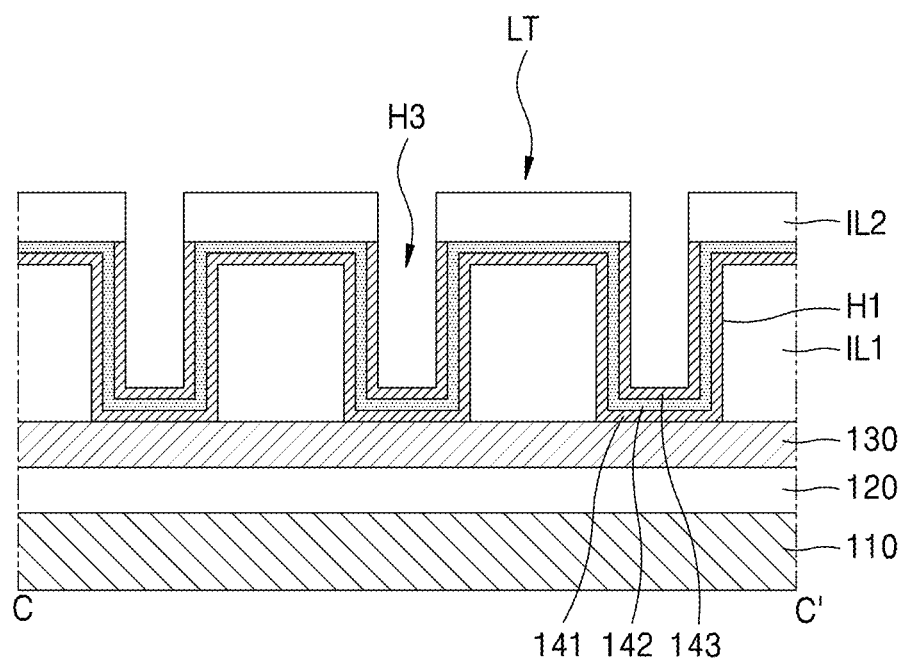
Figure 20D:
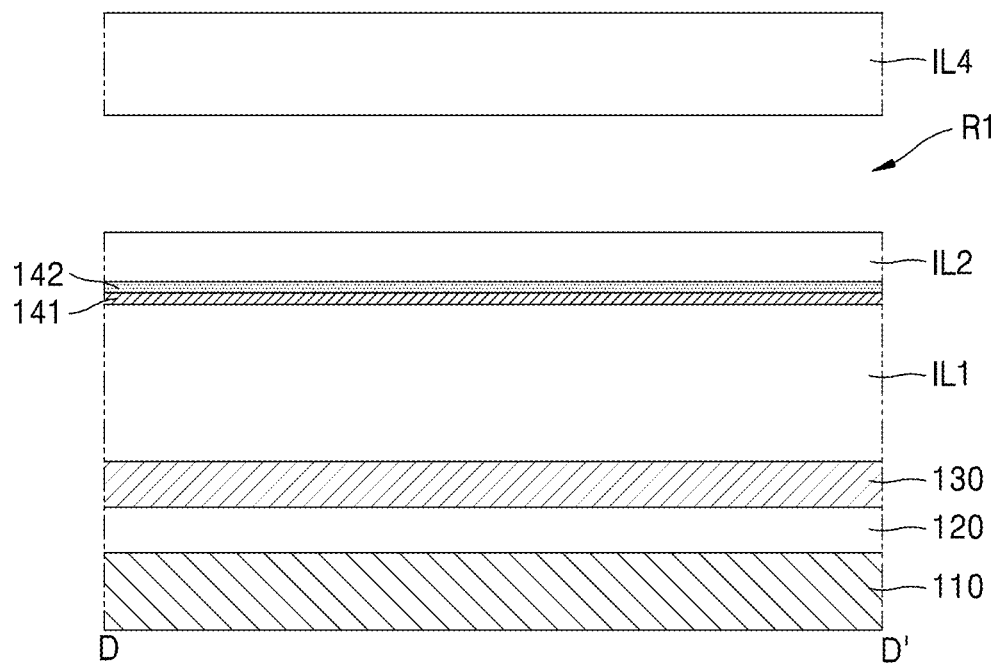
Figure 21A:
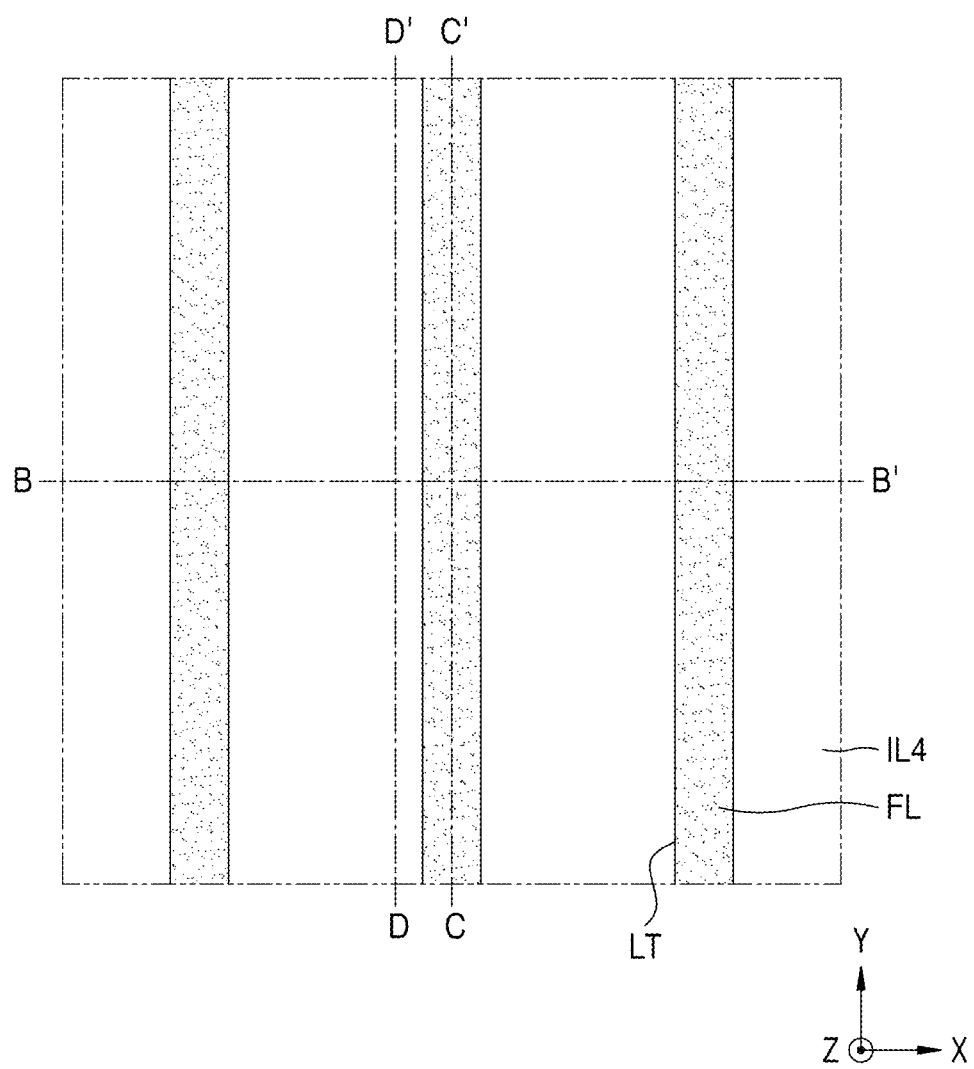
Figure 21B:
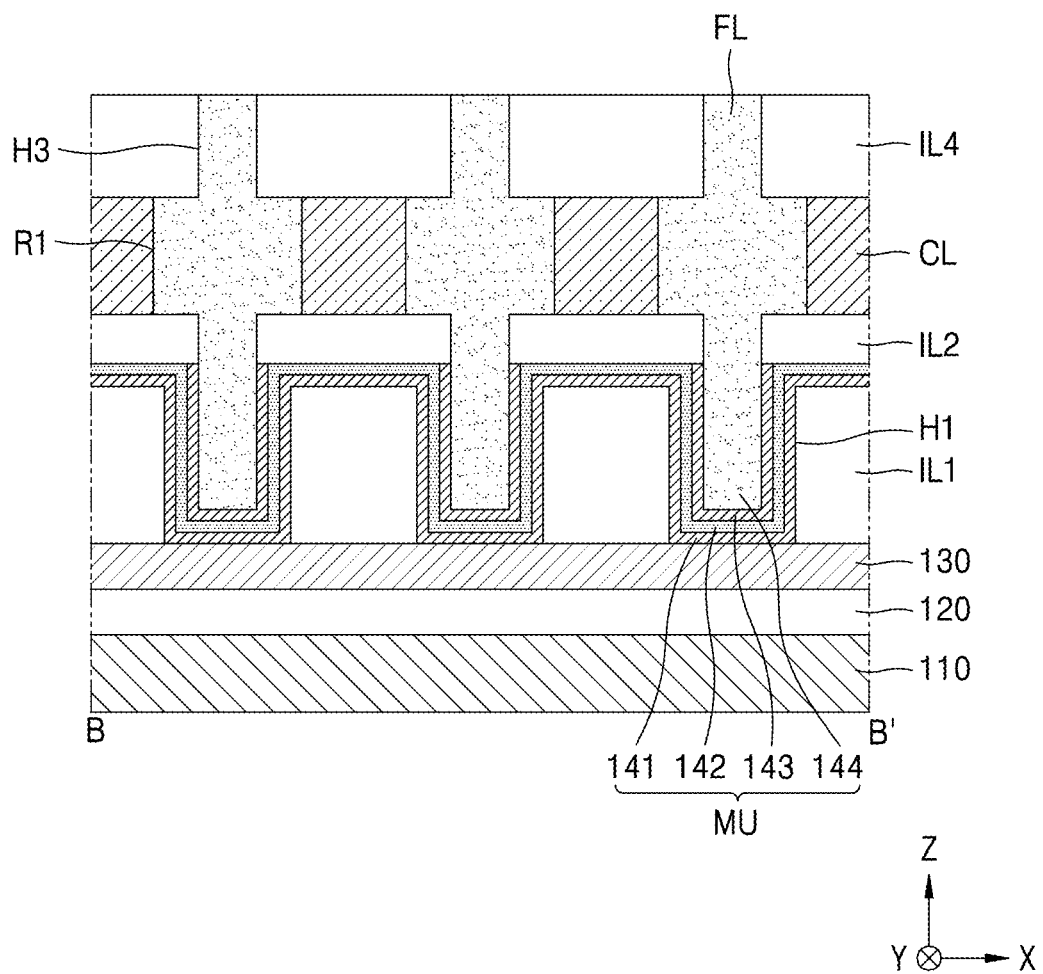
Figure 21C:
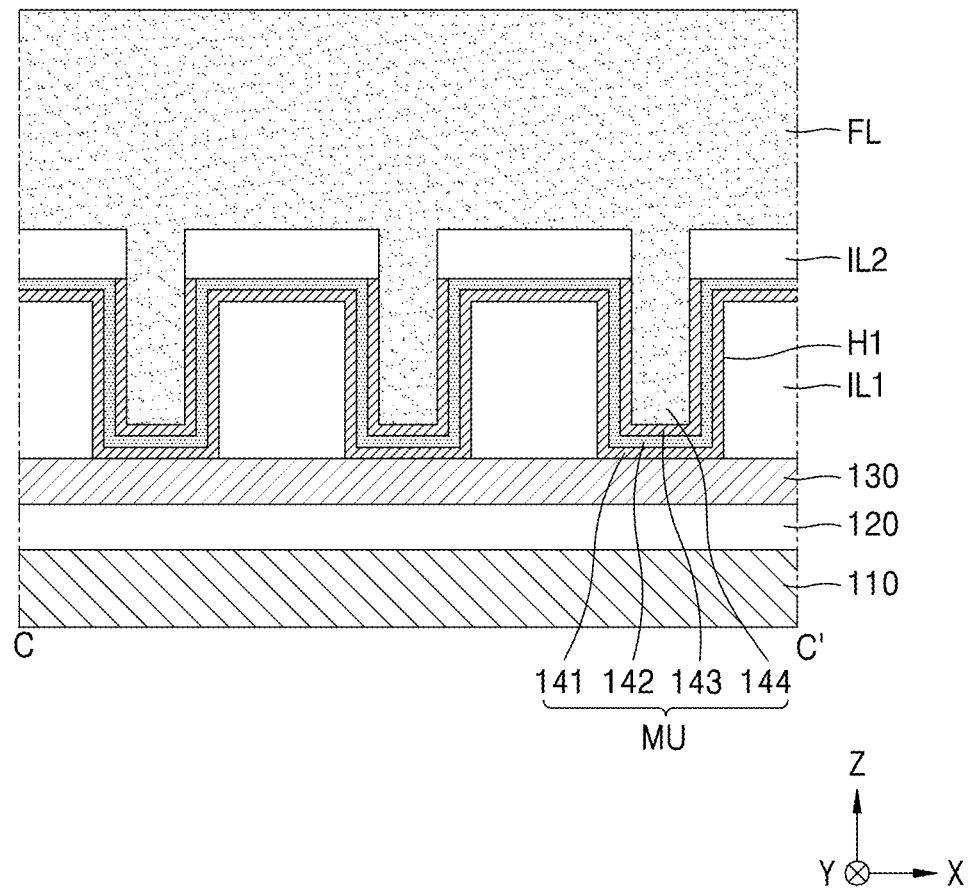
Figure 21D:
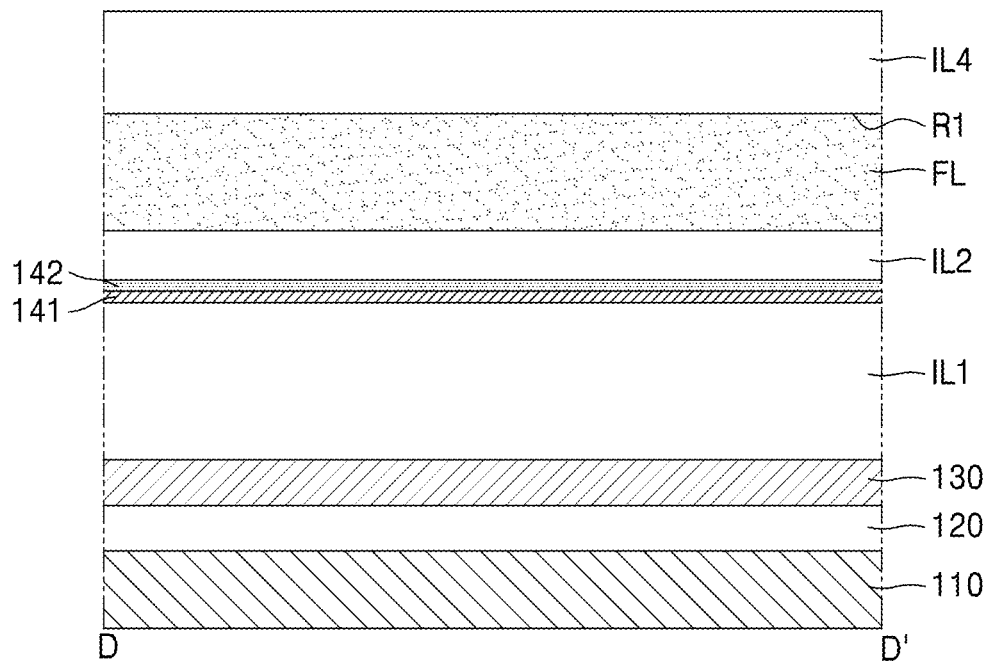
Figure 22A:
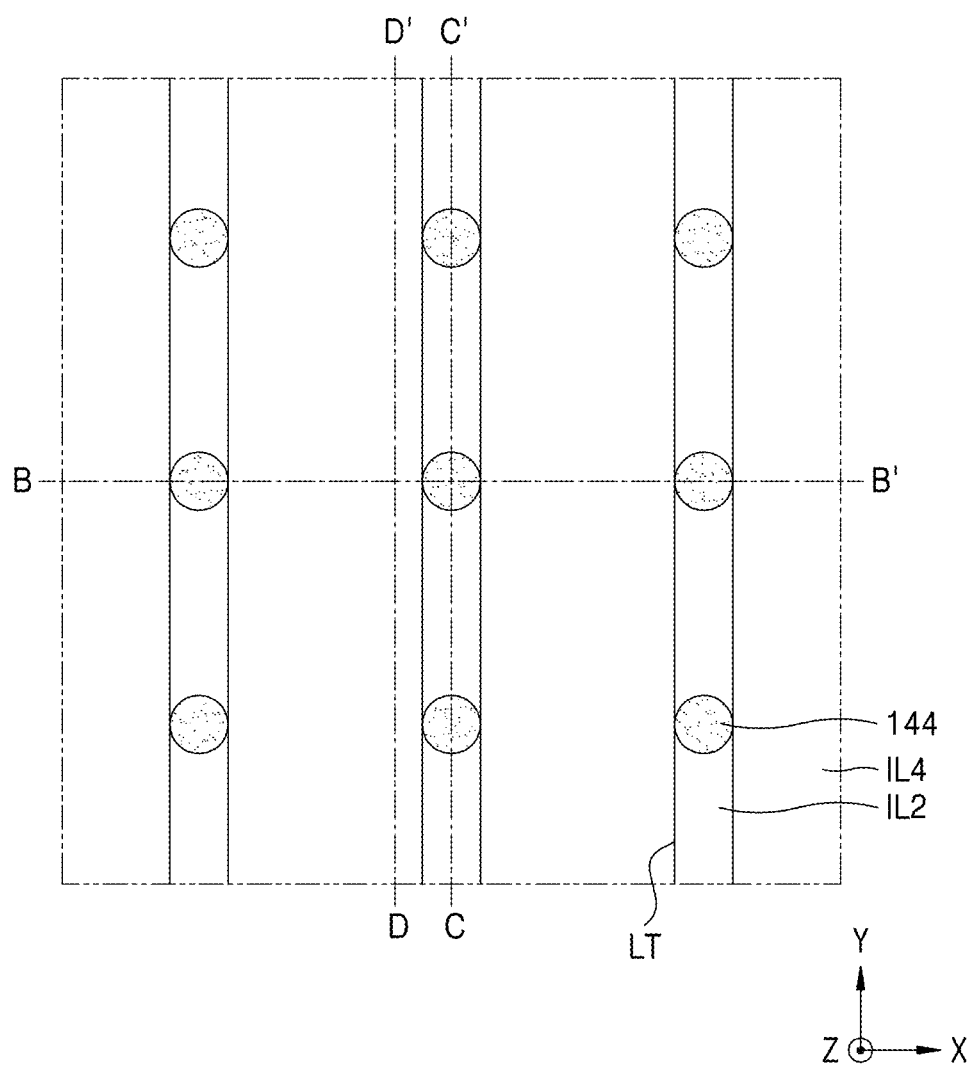
Figure 22B:
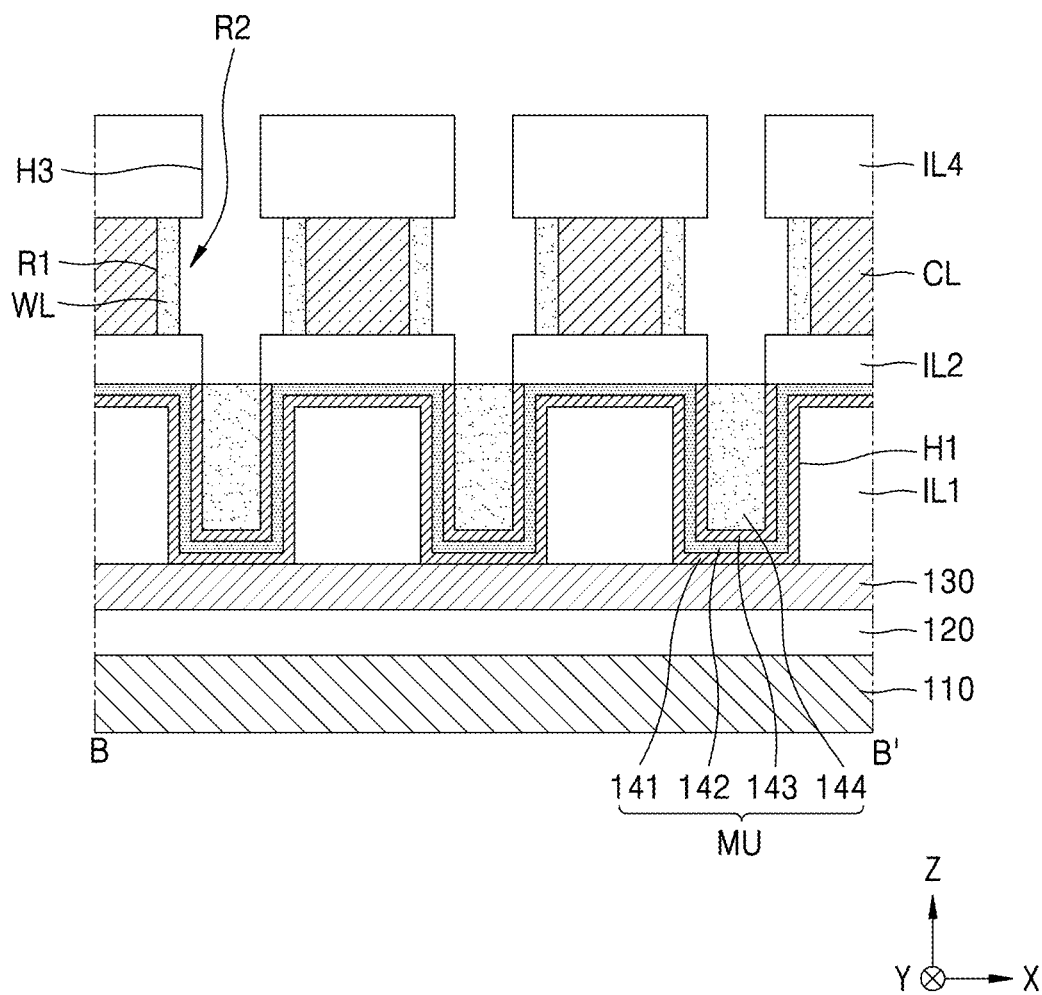
Figure 22C:
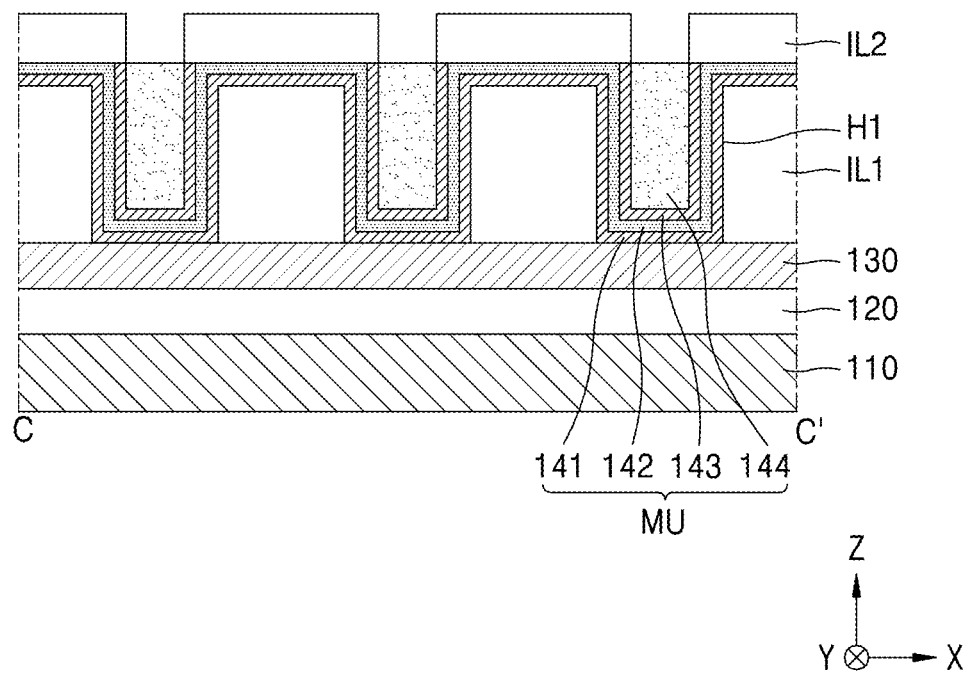
Figure 22D:
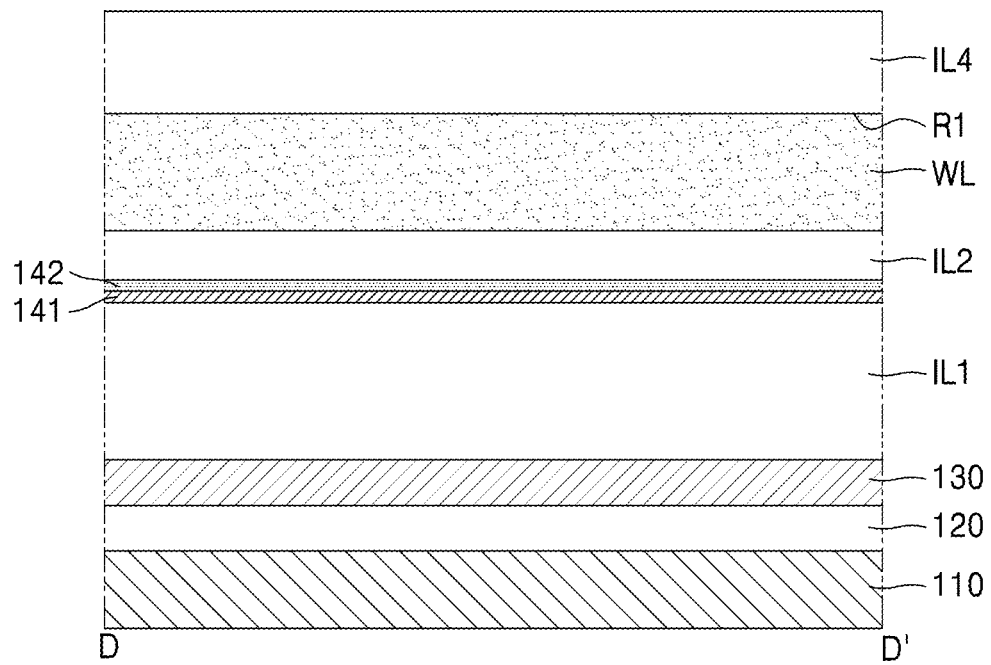

Referring to FIGS. 18A and 18B, a second interlayer insulating layer IL2 may be formed on the dielectric layer 142 and the upper barrier layer 143. A capping layer CL may be formed on the second interlayer insulating layer IL2. A fourth interlayer insulating layer IL4 may be formed on the capping layer CL.

Next, a plurality of third holes H3 passing through the second interlayer insulating layer IL2, the capping layer CL, and the fourth interlayer insulating layer IL4 may be formed to expose the upper barrier layer 143 in the first holes H1.

Referring to FIGS. 19A to 19D, a line trench LT extending in parallel in a first horizontal direction (Y direction) may be formed. An upper surface of second interlayer insulating layer IL2 may be exposed by the line trench LT. The bottom of the line trench LT may be connected to the plurality of third holes H3.

Referring to FIGS. 20A to 20D, a first recess R1 recessed into the capping layer CL from the side surface of the third holes H3 may be formed. For example, only the capping layer CL may be selectively etched. The first recess R1 may be defined by the second interlayer insulating layer IL2, the fourth interlayer insulating layer IL4, and the capping layer CL.

Referring to FIGS. 21A to 21D, the third holes H3 and the first recess R1 may be filled with a filling layer FL.

Referring to FIGS. 22A to 22D, a word line WL and an upper electrode 144 may be formed from the filling layer FL by etching the filling layer FL. For example, isotropic etching may be used. A remaining portion of the filling layer FL in the first recess R1 may form the word line WL, and a remaining portion of the filling layer FL in the third holes H3 may form the upper electrode 144. Because both the word line WL and the upper electrode 144 are formed from the filling layer FL, the word line WL and the upper electrode 144 may include the same material. Because the word line WL is formed in the first recess R1, the upper surface of the word line WL may be formed on the same plane as the upper surface of the capping layer CL. Also, the lower surface of the word line WL may be formed on the same plane as the lower surface of the capping layer CL. The side surface of the word line WL may be recessed from the side surface of the third holes H3. That is, the word line WL, the fourth interlayer insulating layer IL4, and the second interlayer insulating layer IL2 may define a second recess R2 recessed into the capping layer CL from the side surface of the third holes H3.

Figure 23A:
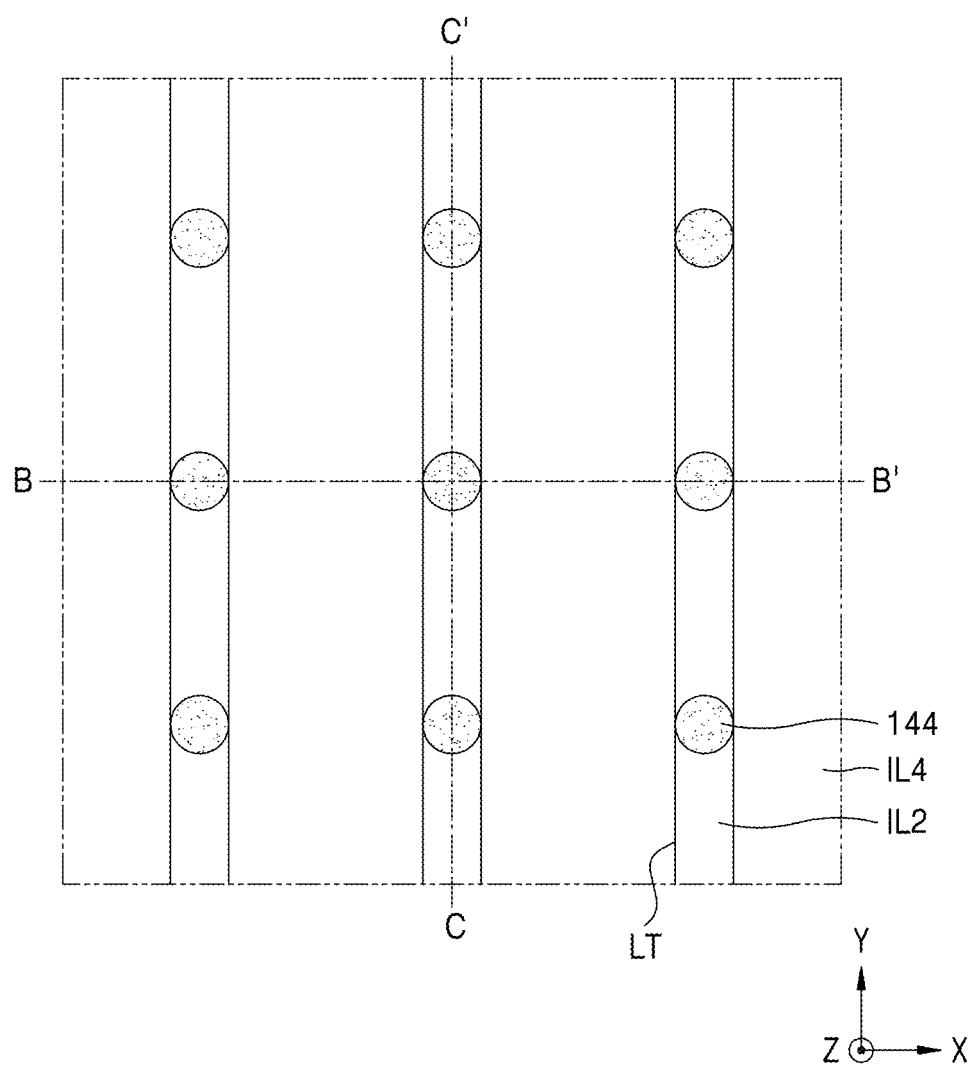
Figure 23B:
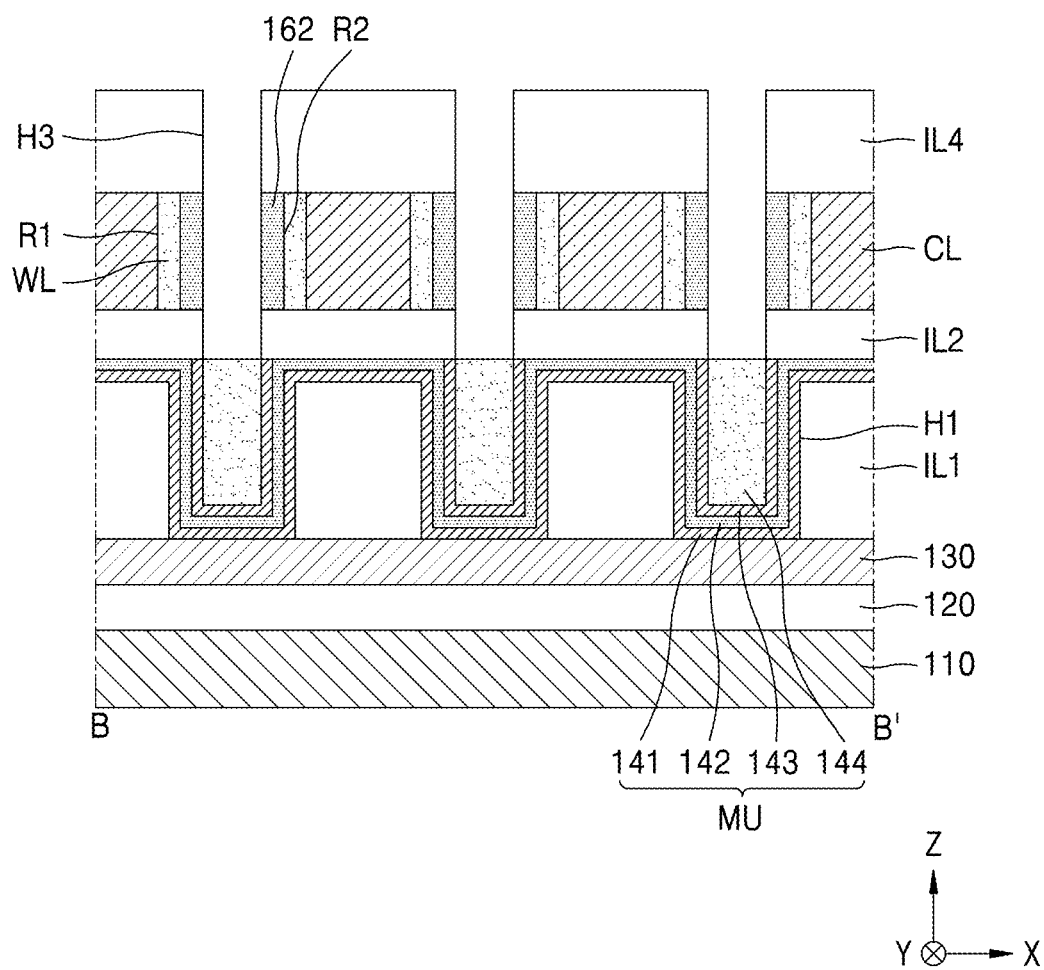
Figure 23C:
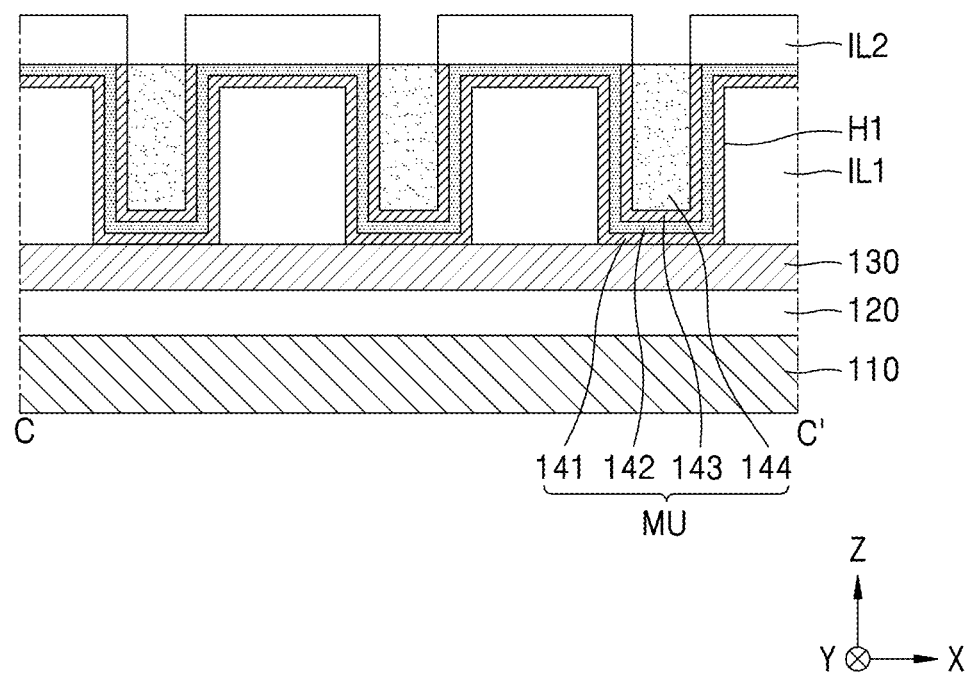

Referring to FIGS. 23A to 23C, a gate insulating layer 162 may be formed in the second recess R2 and the third holes H3. Next, a portion of the gate insulating layer 162 outside the second recess R2 may be removed through anisotropic etching. Accordingly, the gate insulating layer 162 may remain only in the second recess R2. Because the gate insulating layer 162 is formed in the second recess R2, the upper surface of the gate insulating layer 162 may be on the same plane as the upper surface of the word line WL. In addition, the lower surface of the gate insulating layer 162 may be on the same plane as the lower surface of the word line WL.

Figure 24A:
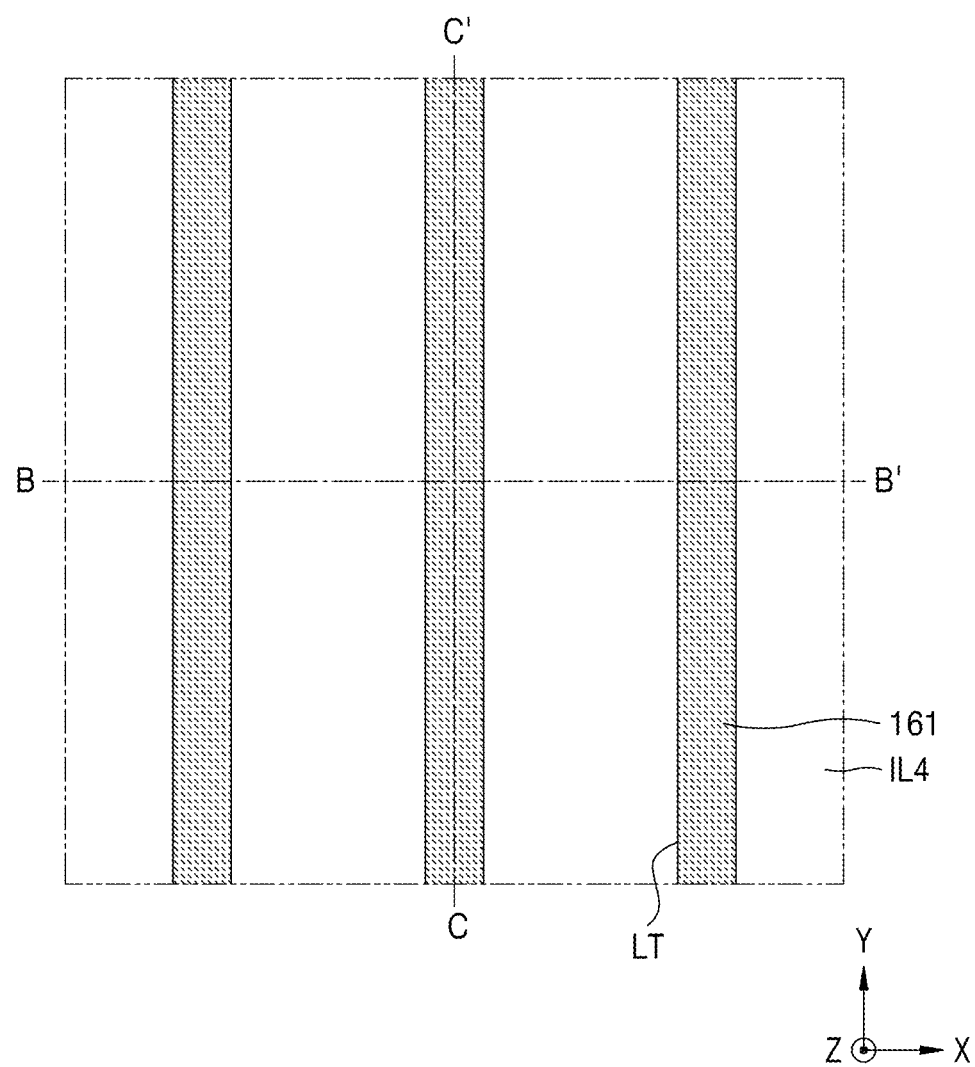
Figure 24B:
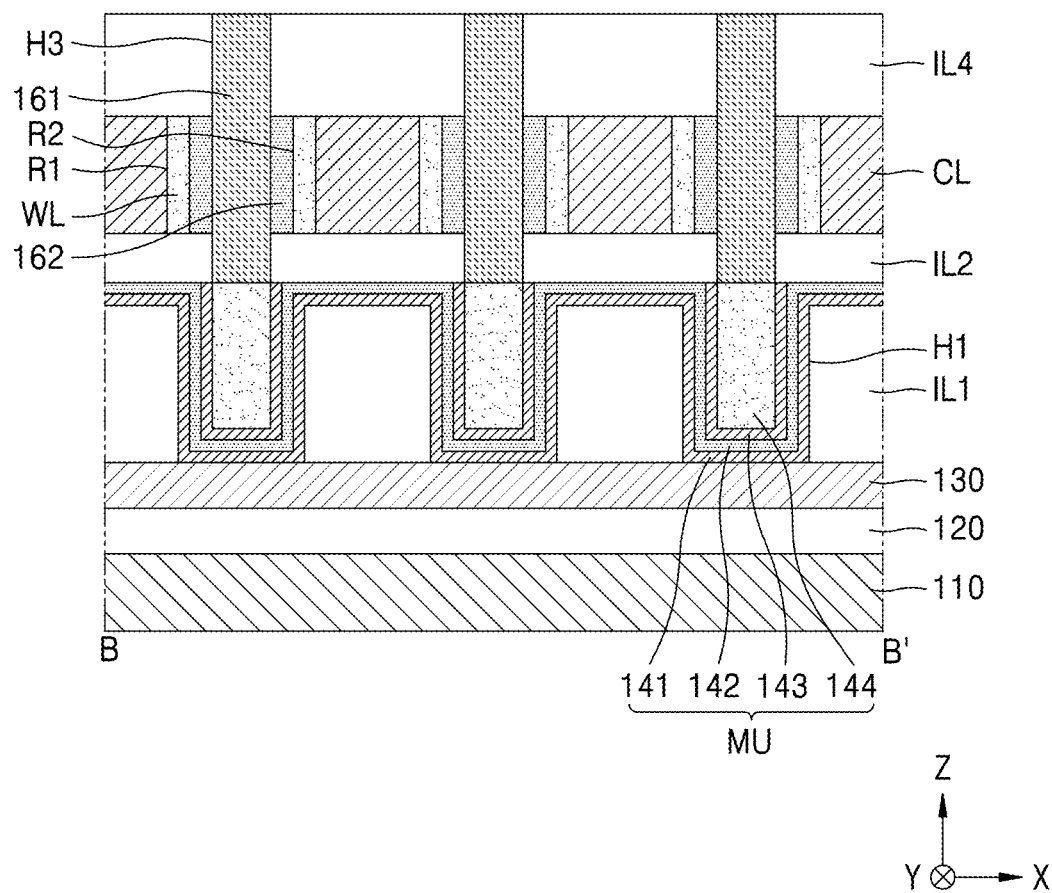
Figure 24C:
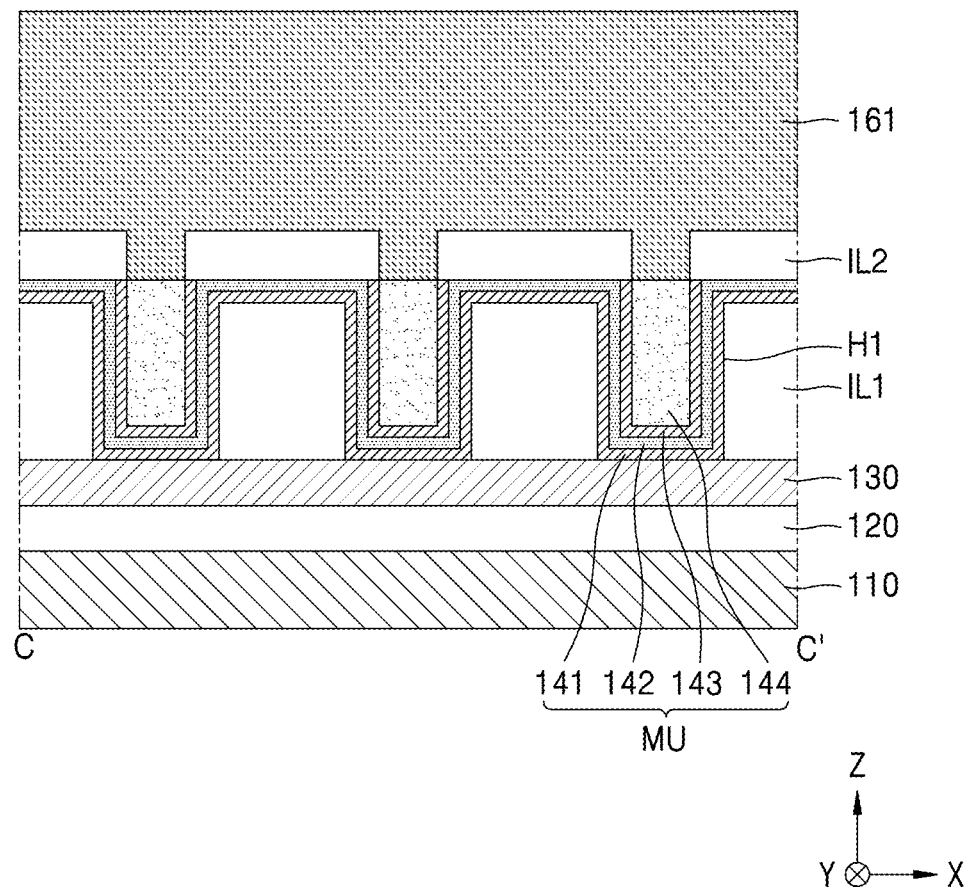

Referring to FIGS. 24A to 24C, the channel 161 may be filled in the third holes H3 and the line trench LT.

Figure 25A:
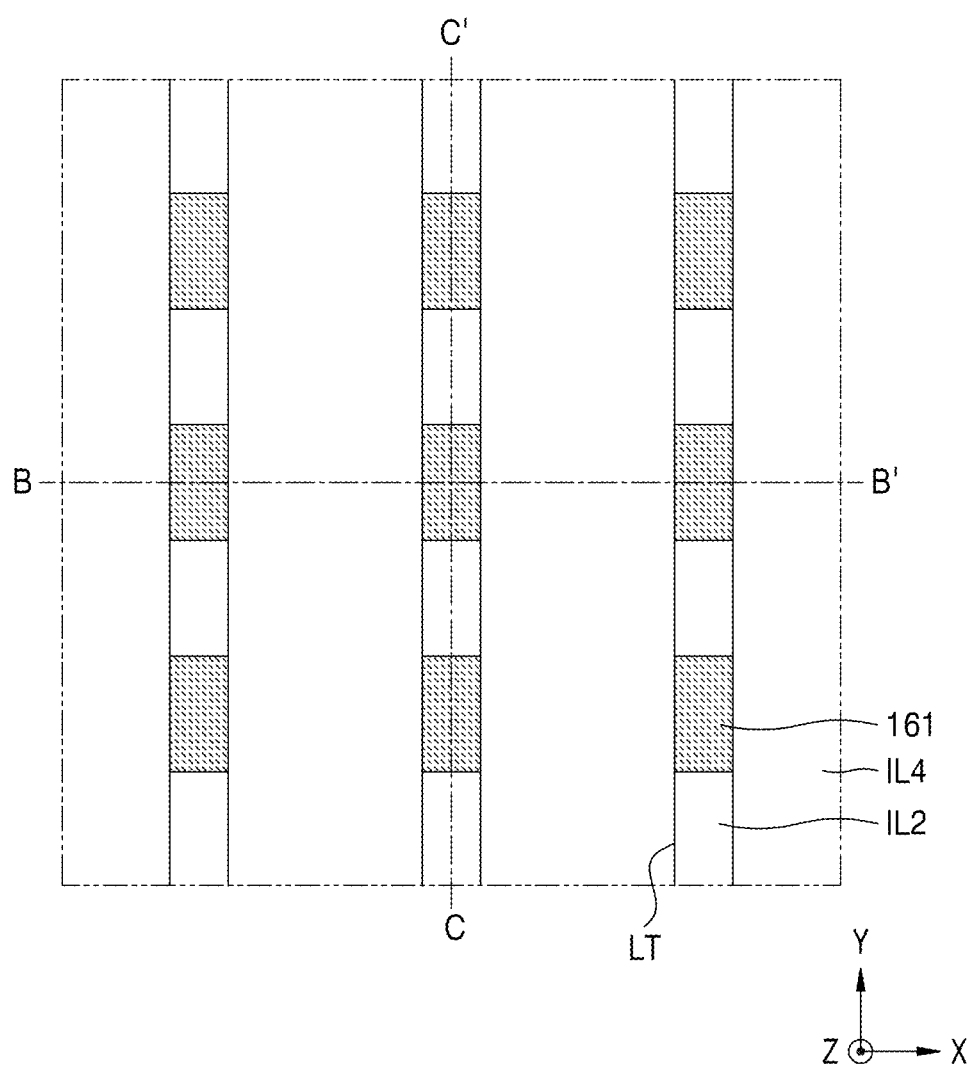
Figure 25B:
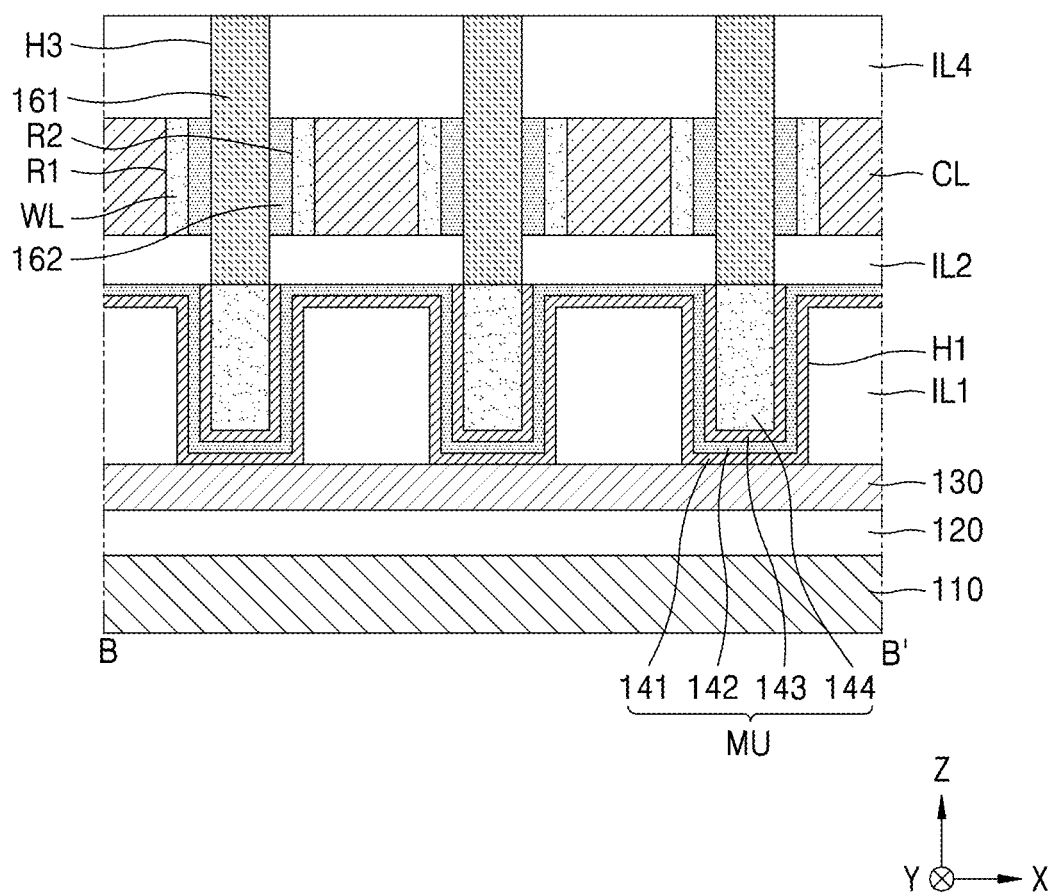
Figure 25C:
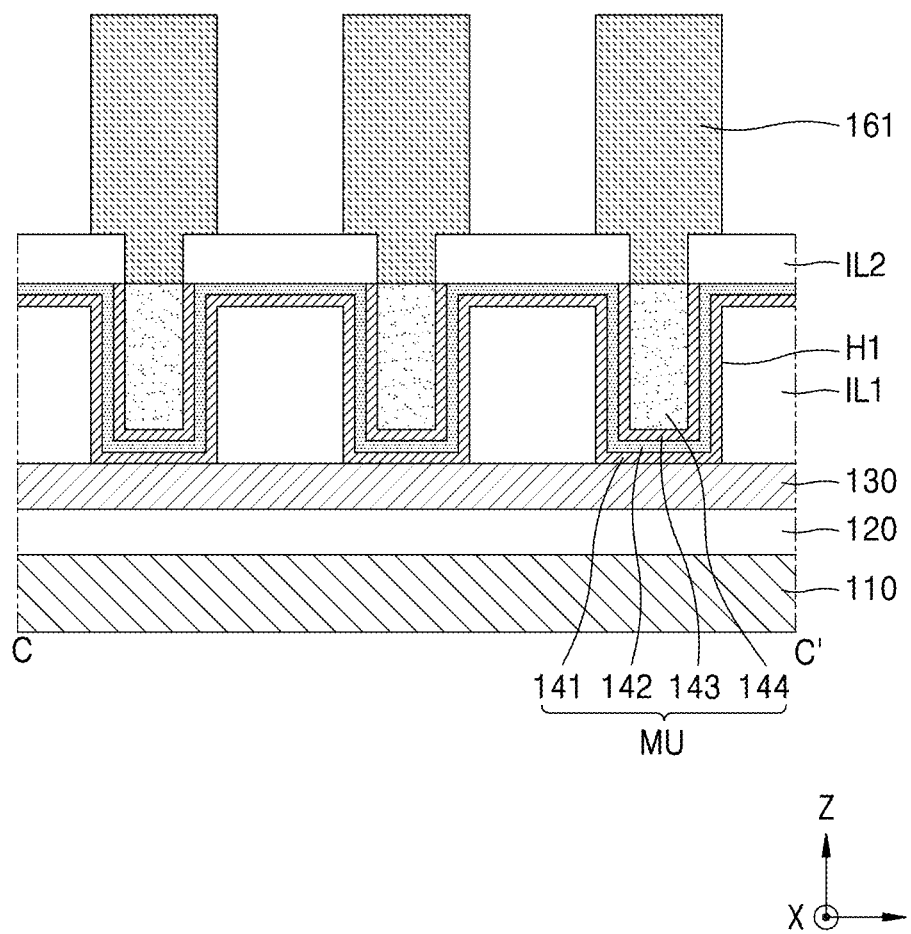

Referring to FIGS. 25A to 25C, the channel 161 may be divided into a plurality of portions spaced apart in the first horizontal direction (Y direction). For example, the channel 161 can be patterned by forming a mask pattern on the channel 161 and the fourth interlayer insulating layer IL4, and etching the channel 161 using the mask pattern as an etching mask.

Figure 26A:
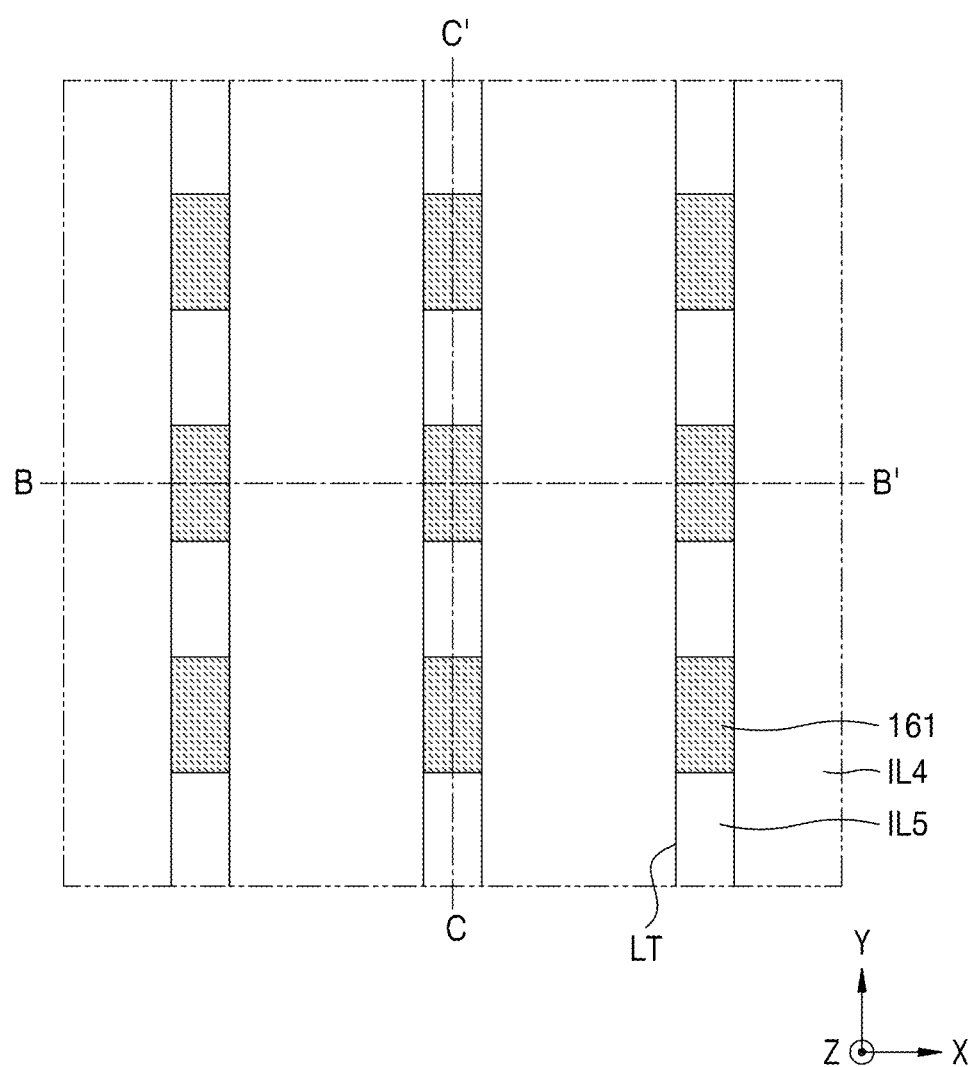
Figure 26B:
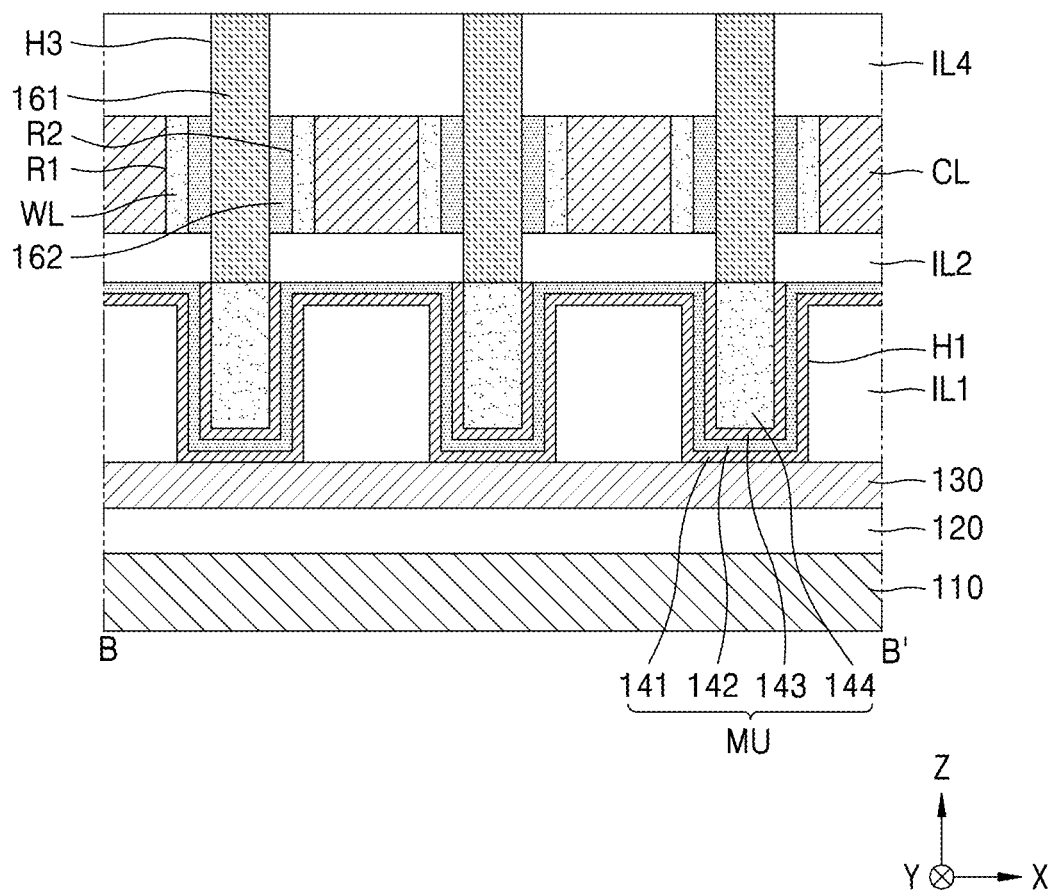
Figure 26C:
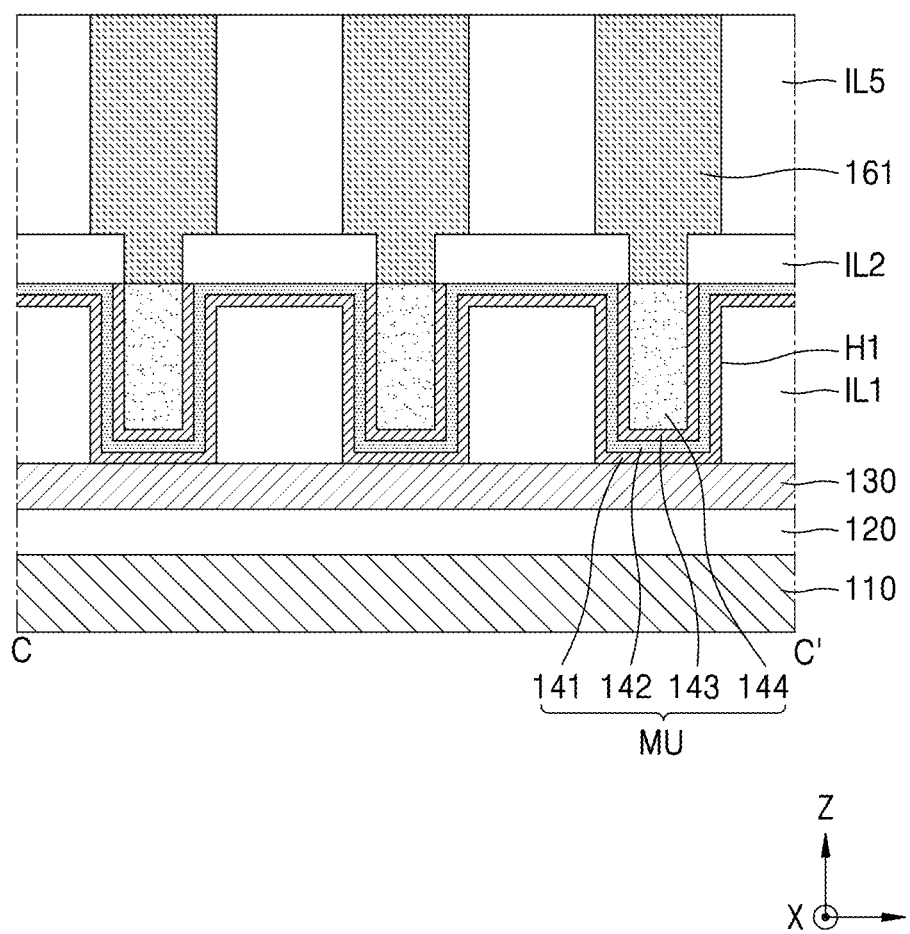

Referring to FIGS. 26A to 26C, a fifth interlayer insulating layer IL5 may be formed on the second interlayer insulating layer IL2 to fill the line trench LT. The fifth interlayer insulating layer IL5 may fill a space between channels 161 in the line trench LT.

Figure 27A:
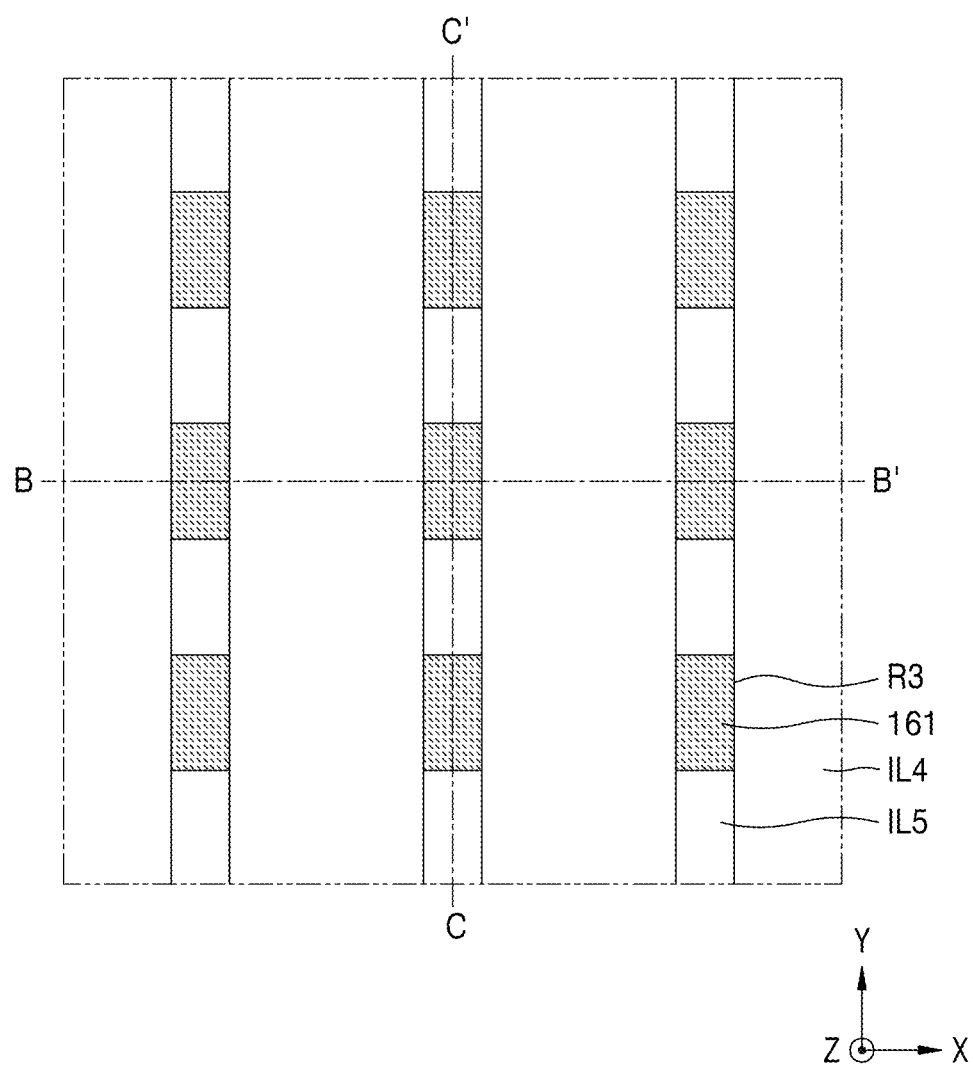
Figure 27B:
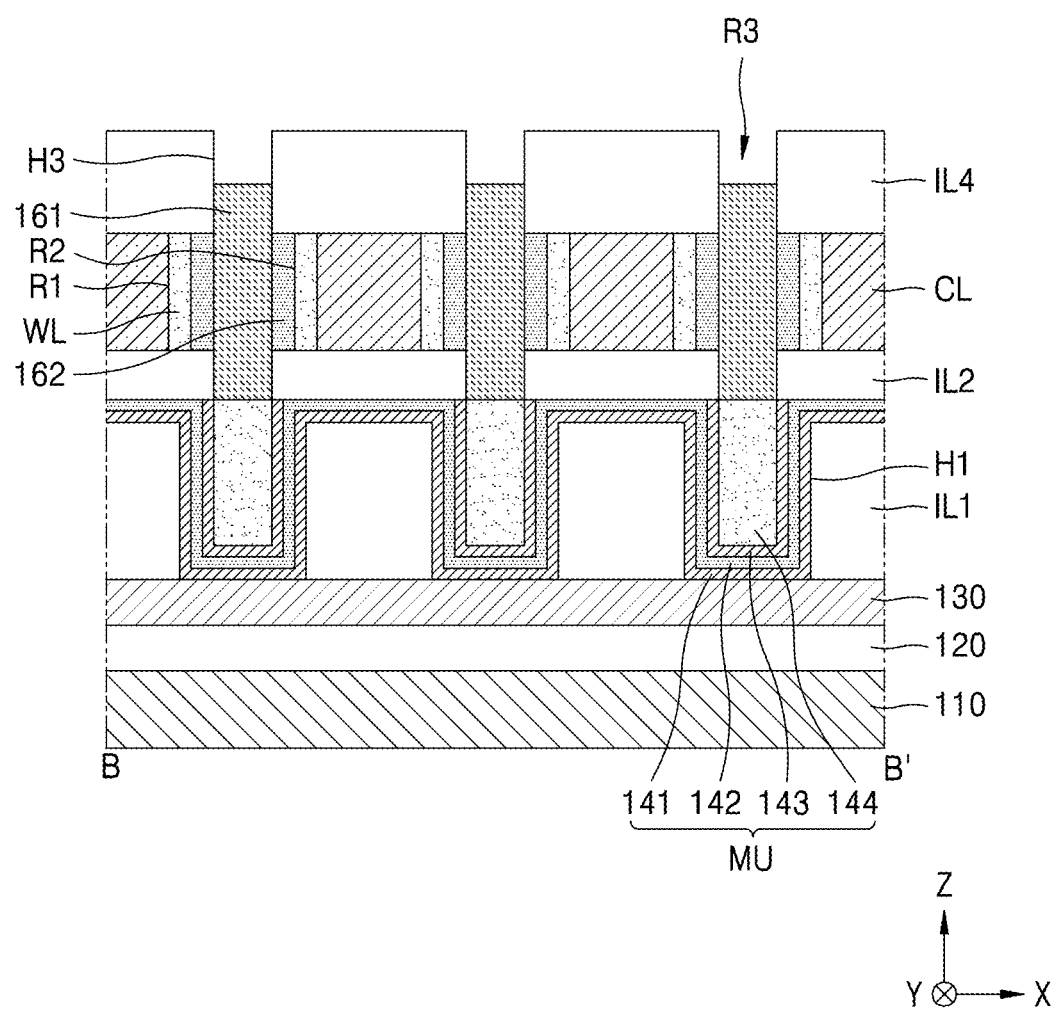
Figure 27C:
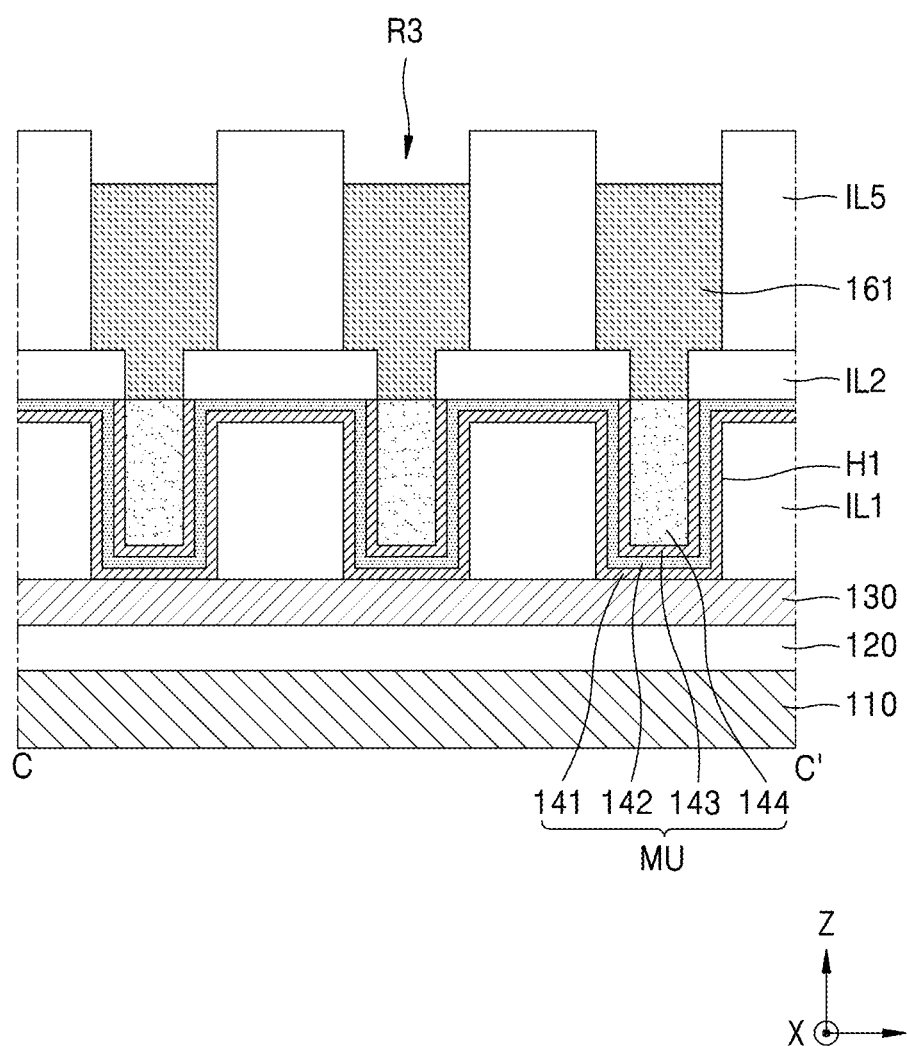

Referring to FIGS. 27A to 27C, by anisotropically etching the channel 161, a third recess R3, which is defined by the fourth interlayer insulating layer IL4, the fifth interlayer insulating layer IL5, and the channel 161, may be formed.

Referring to FIGS. 3A to 3E, a bit line BL may be formed on the channel 161 such that a contact portion BLb of the bit line BL fills the third recess R3 shown in FIGS. 27A to 27C. In addition, a sixth interlayer insulating layer IL6 contacting a line portion BLa of the bit line BL may be further formed. The memory device 103 shown in FIGS. 3A to 3E may be manufactured according to the manufacturing method described with reference to FIGS. 17A to 27C and 3A to 3E.

Figure 28A:
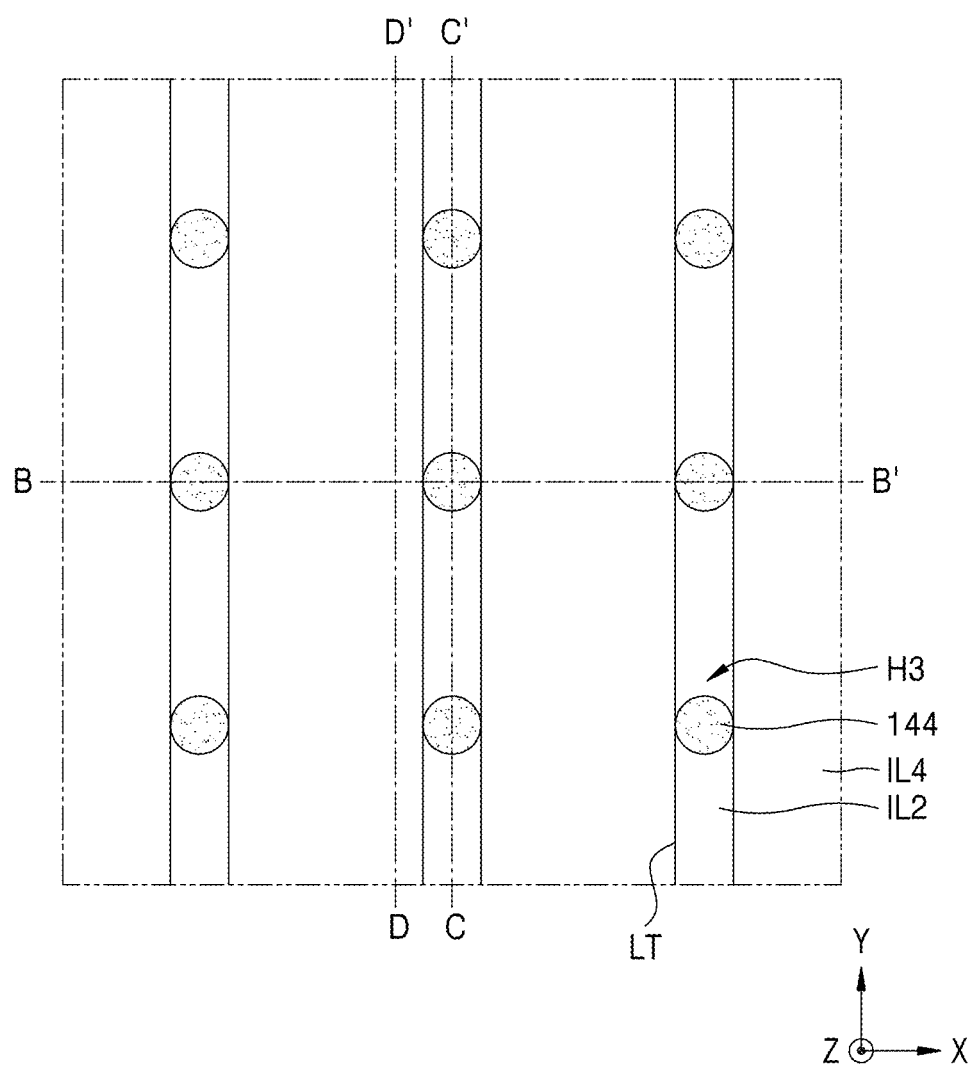
FIGS. 28A and 29A are plan views illustrating a method of manufacturing a memory device according to an example embodiment.
Figure 28B:
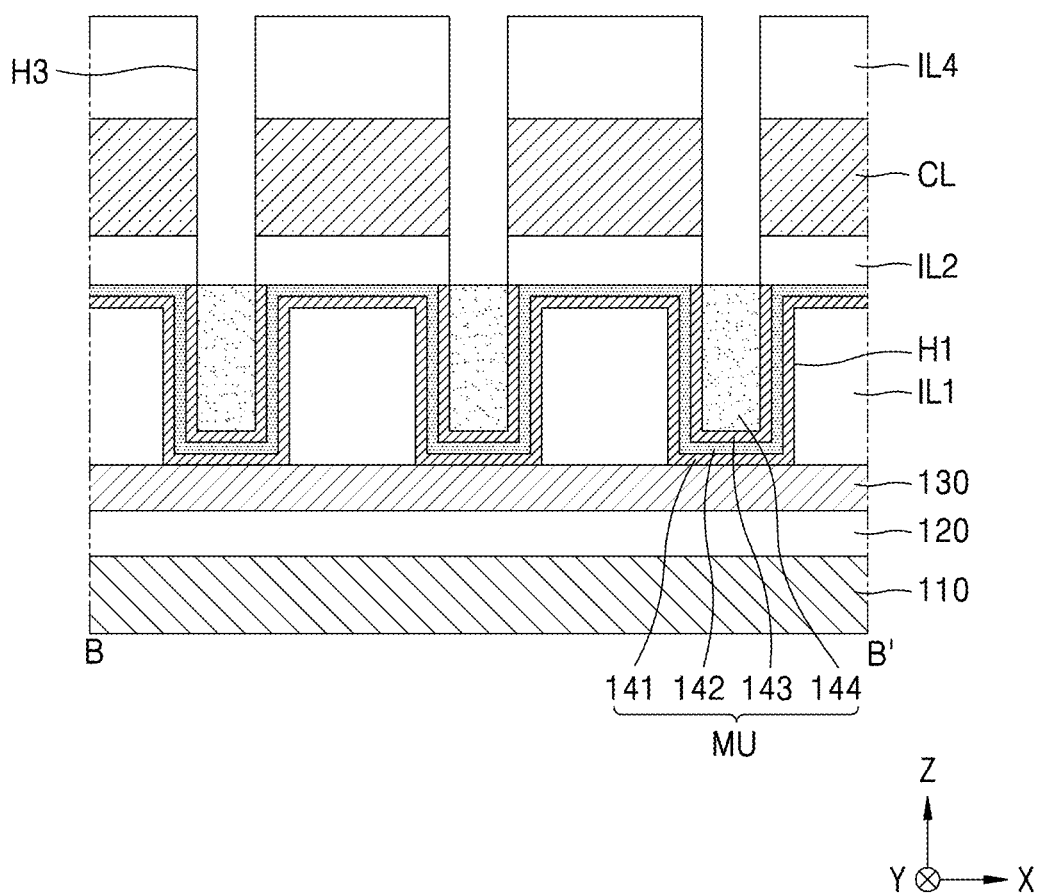
FIGS. 28B and 29B are cross-sectional views taken along line B-B' of FIGS. 28A and 29A, respectively.
Figure 28C:
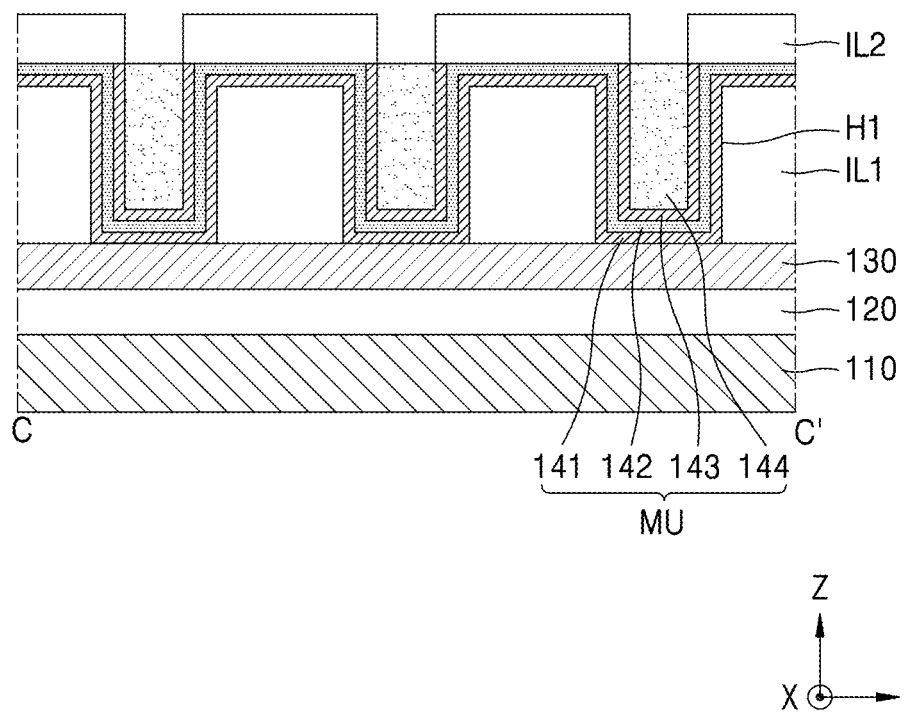
FIGS. 28C and 29C are cross-sectional views taken along line C-C' of FIGS. 28A and 29A, respectively.
Figure 28D:
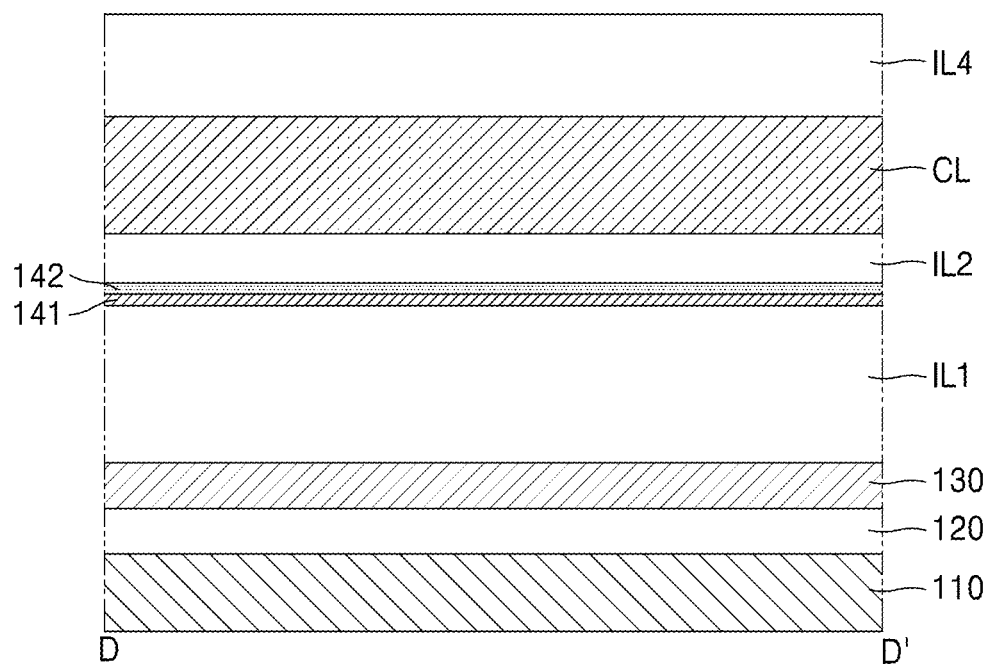
FIGS. 28D and 29D are cross-sectional views taken along line D-D' of FIGS. 28A and 29A, respectively.
Figure 28D:
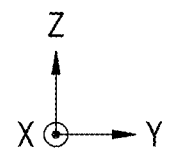
Figure 29A:
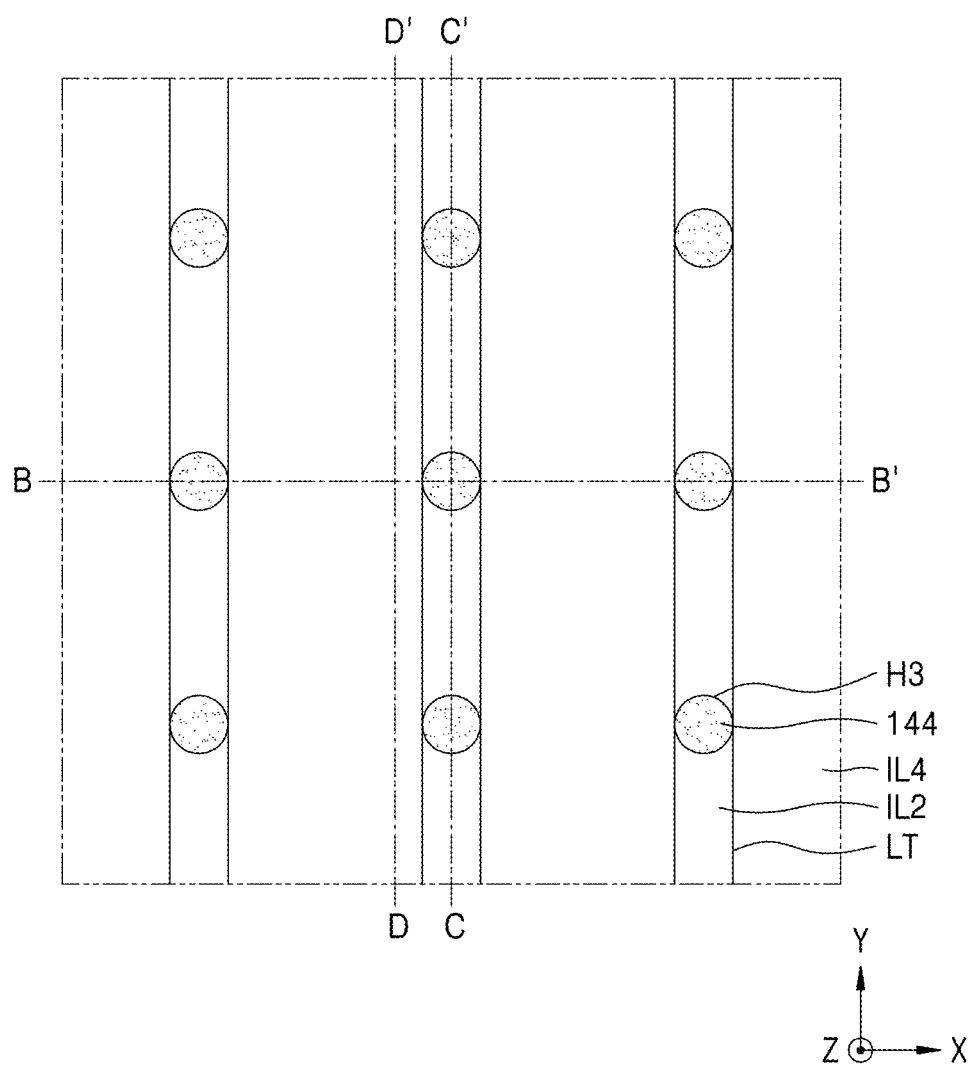
Figure 29B:
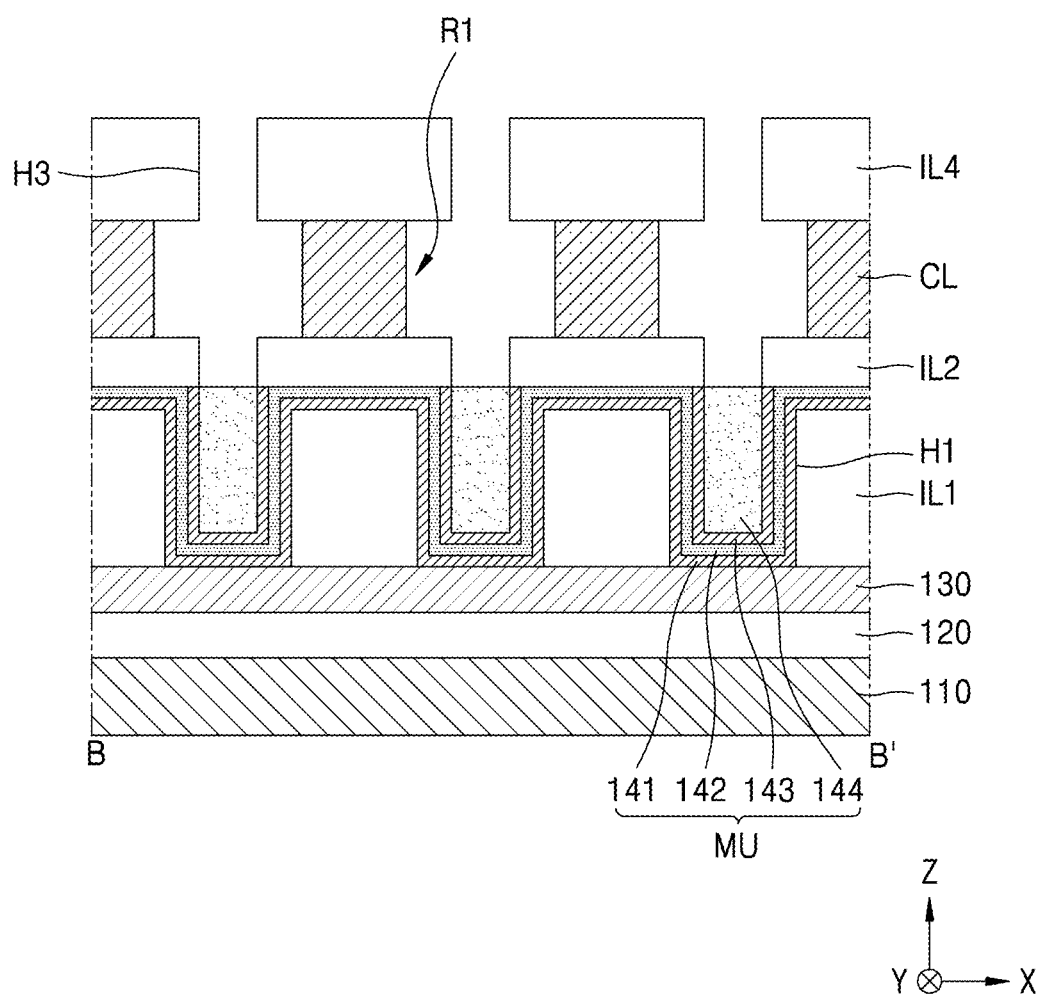
Figure 29C:
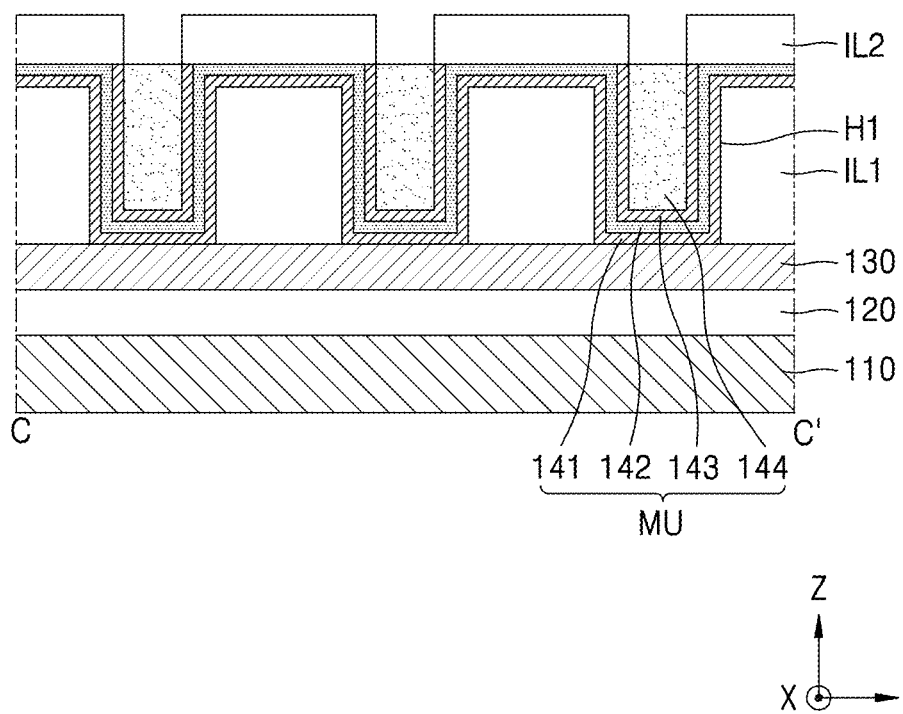
Figure 29D:
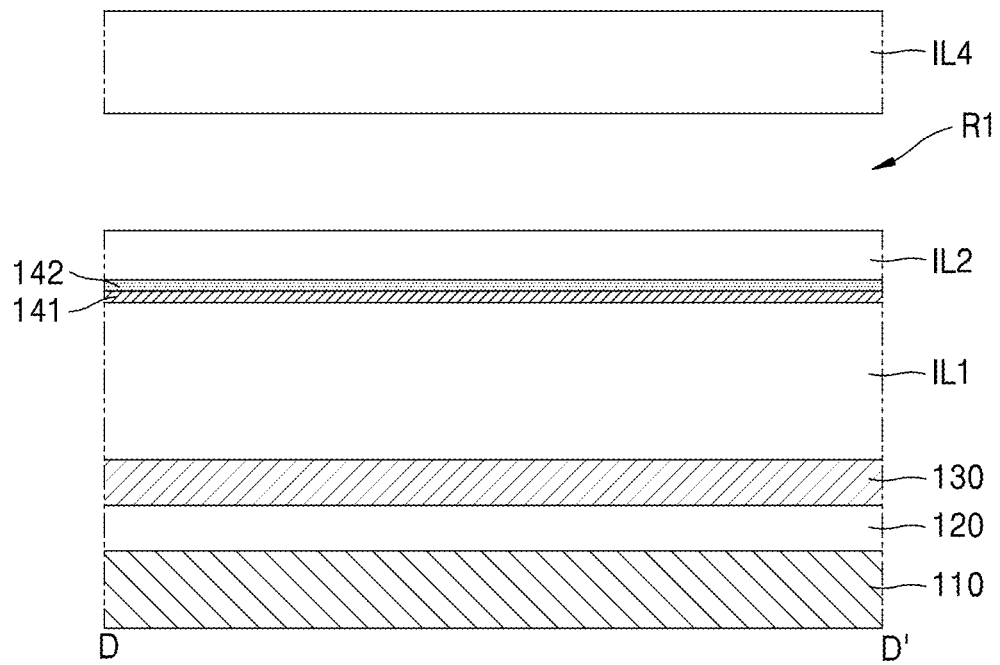

In some example embodiments, the forming of the third recess R3 described with reference to FIGS. 27A to 27C may be omitted. The sixth interlayer insulating layer IL6 may be formed on the fifth interlayer insulating layer IL5 and the fourth interlayer insulating layer IL4, and the bit line BL may be formed in the sixth interlayer insulating layer IL6. According to such a manufacturing method, the memory device 103a shown in FIG. 3F may be manufactured. That is, the contact portion BLb of the bit line BL may be formed in the sixth interlayer insulating layer IL6, not in the third recess R3. FIGS. 28A and 29A are plan views illustrating a method of manufacturing a memory device according to an example embodiment. FIGS. 28B and 29B are cross-sectional views taken along line B-B' of FIGS. 28A and 29A, respectively. FIGS. 28C and 29C are cross-sectional views taken along line C-C' of FIGS. 28A and 29A, respectively. FIGS. 28D and 29D are cross-sectional views taken along line D-D' of FIGS. 28A and 29A, respectively.

Referring to FIGS. 28A to 28D, a lower insulating layer 120, a ground plate 130, and a first interlayer insulating layer IL1 may be formed on the substrate 110, as described with reference to FIGS. 17A to 19B. Next, a lower electrode 141, a dielectric layer 142, and an upper barrier layer 143 may be formed on the first interlayer insulating layer ILL Next, portions of the upper barrier layer 143 may be separated. Next, a second interlayer insulating layer IL2, a capping layer CL, and a fourth interlayer insulating layer IL4 may be formed. Next, a line trench LT and a plurality of third holes H3 may be formed.

A plurality of upper electrodes 144 may be formed below the plurality of third holes H3, respectively. For example, the upper electrodes 144 may be formed to fill the plurality of third holes H3. By anisotropically etching upper portions of the upper electrodes 144, portions of the upper electrodes 144 filling lower portions of the third holes H3, respectively, may remain.

Referring to FIGS. 29A to 29D, a first recess R1 recessed into the capping layer CL from a side surface of each of the third holes H3 may be formed. The first recess R1 may be defined by the second interlayer insulating layer IL2, the capping layer CL, and the fourth interlayer insulating layer IL4.

Referring to FIGS. 22A to 22D, a word line WL may be formed in the first recess R1. For example, after the word line WL is formed to fill upper portions of the first recess R1 and the third holes H3, the word line WL may be anisotropically etched such that only a portion of the word line WL in the first recess R1 remains. In addition, the word line WL may be further etched to form a second recess R2. Thereafter, the memory device 103 shown in FIG. 3E may be manufactured according to the method described with reference to FIGS. 23A to 27C and 3A to 3E. When the memory device 103 shown in FIGS. 3A to 3E is manufactured according to the method described with reference to FIGS. 27A to 27D and 21A to 21D, because the word line WL and the upper electrode 144 are formed in different steps, the word line WL and the upper electrode 144 may include different materials.

Figure 30A:
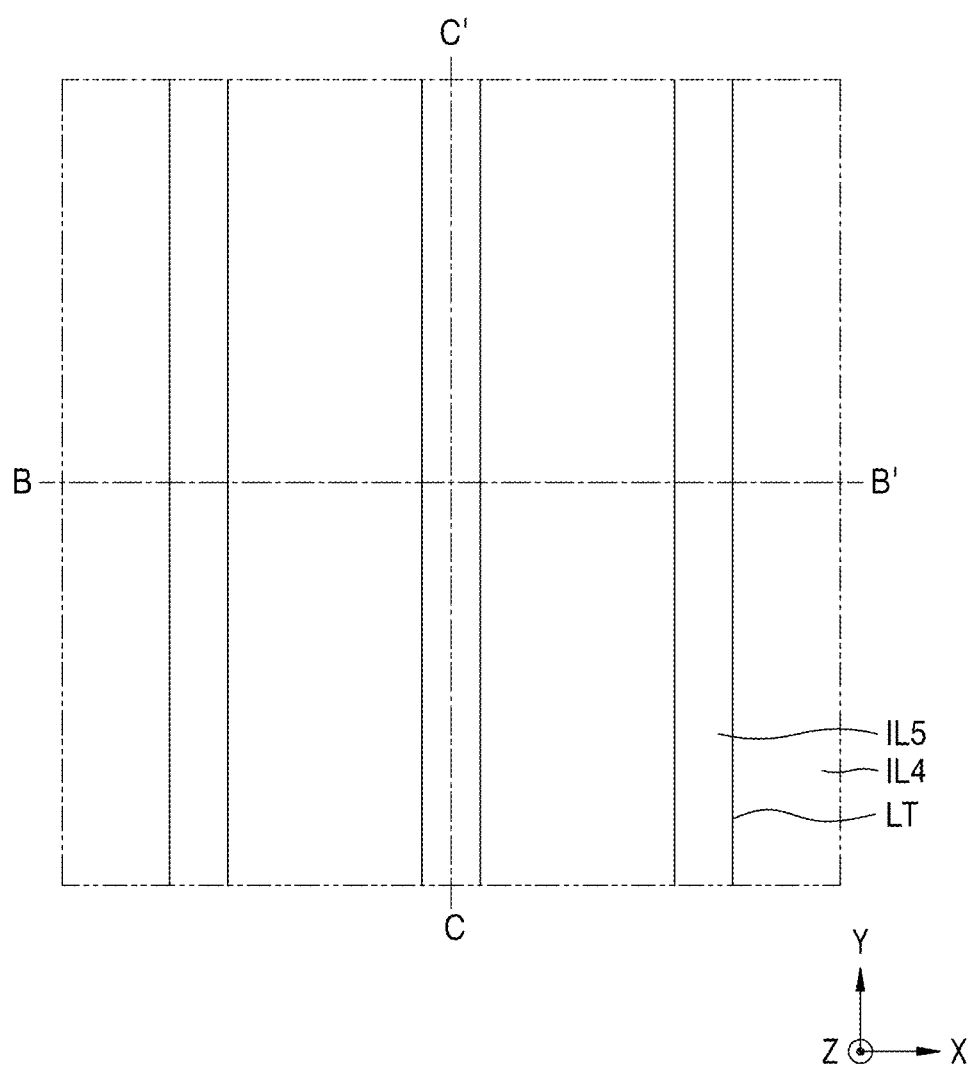
FIGS. 30A and 31A are plan views illustrating a method of manufacturing a memory device according to an example embodiment.
Figure 30B:
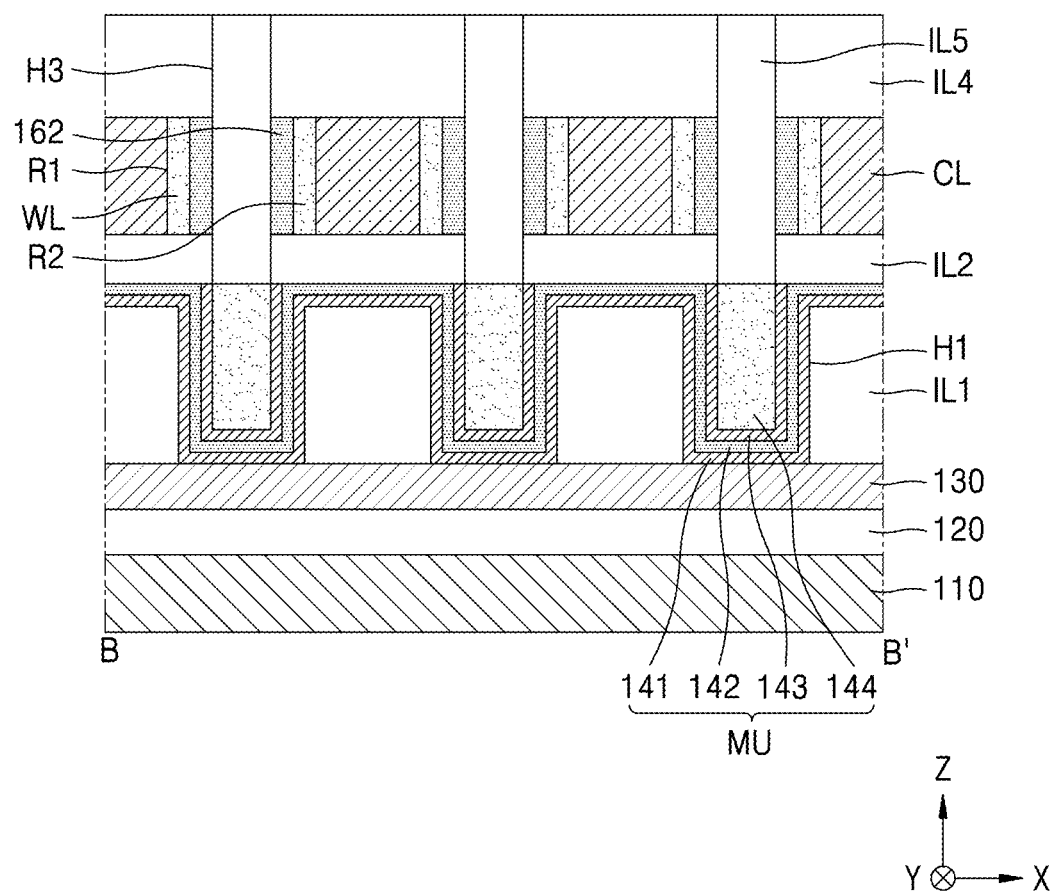
FIGS. 30B and 31B are cross-sectional views taken along line B-B' of FIGS. 30A and 31A, respectively.
Figure 30C:
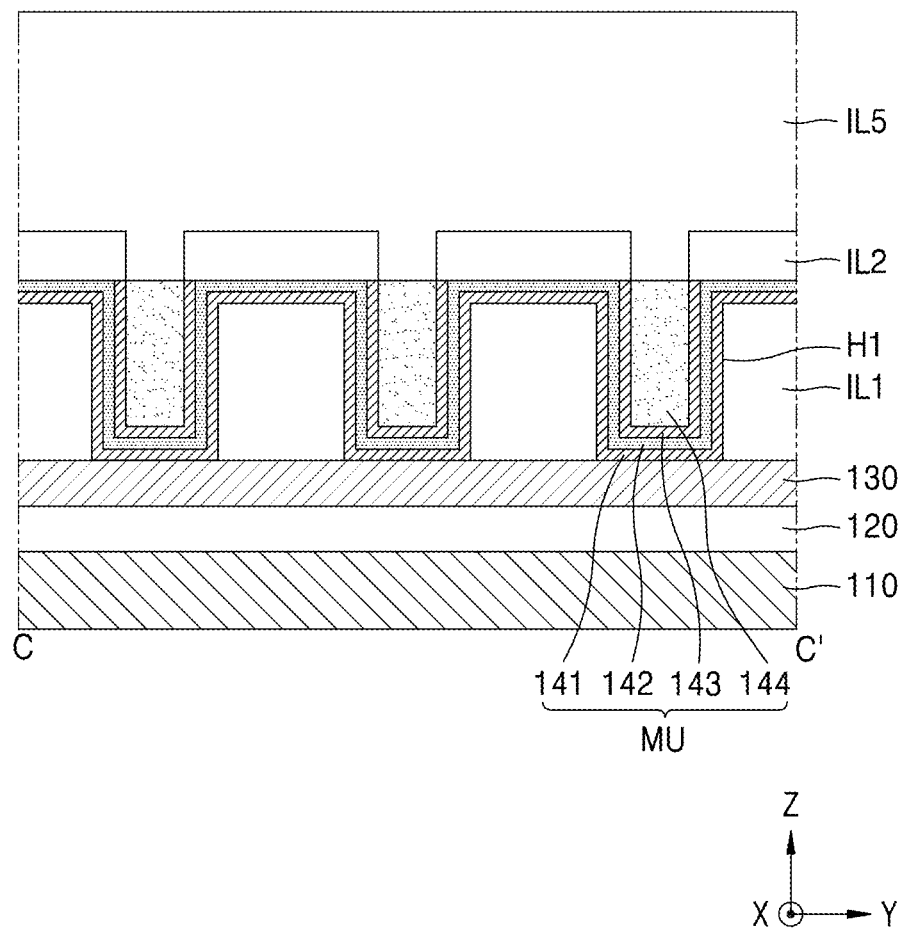
FIGS. 30C and 31C are cross-sectional views taken along line C-C' of FIGS. 30A and 31A, respectively.
Figure 31A:
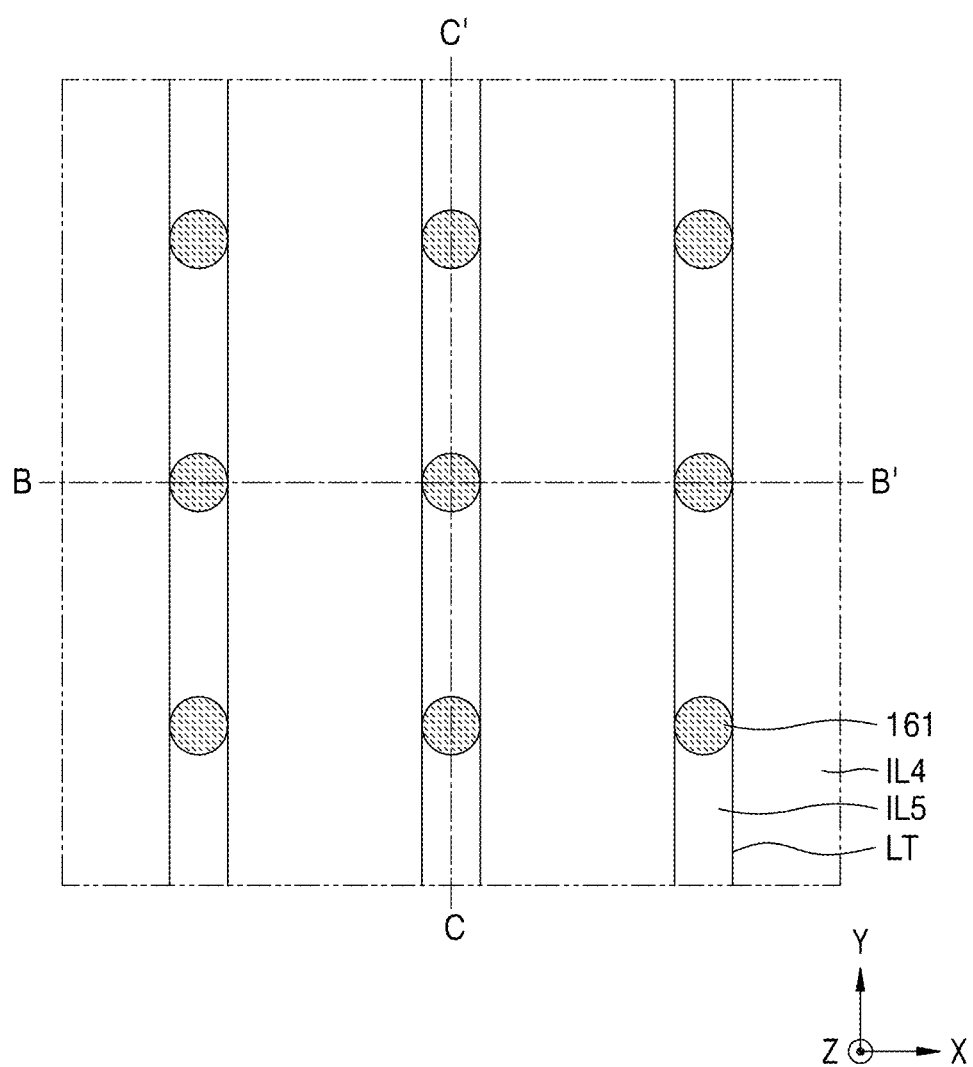
Figure 31B:
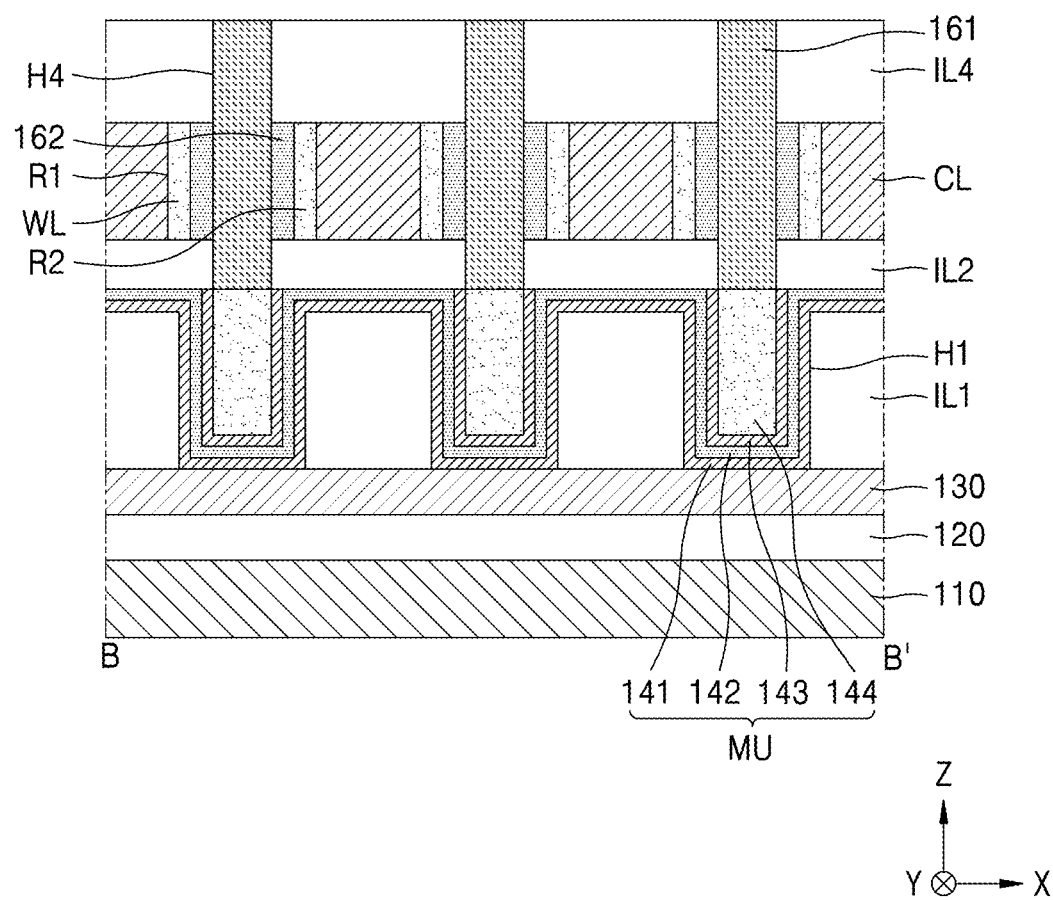
Figure 31C:
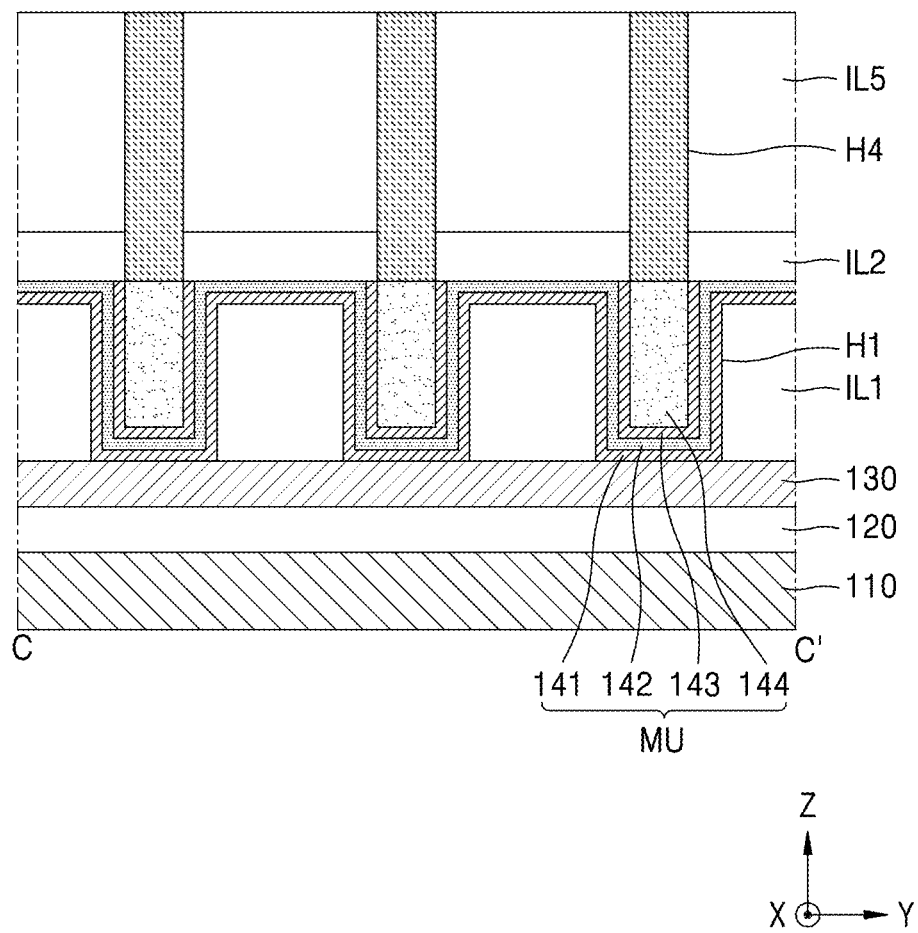

FIGS. 30A and 31A are plan views illustrating a method of manufacturing a memory device according to an example embodiment. FIGS. 30B and 31B are cross-sectional views taken along line B-B' of FIGS. 30A and 31A, respectively. FIGS. 30C and 31C are cross-sectional views taken along line C-C' of FIGS. 30A and 31A, respectively.

Referring to FIGS. 30A to 30C, the steps illustrated in FIGS. 17A to 23B may be performed before steps illustrated in FIGS. 30A to 30C. That is, a lower insulating layer 120, a ground plate 130, and a first interlayer insulating layer IL1 may be formed on the substrate 110. Next, a lower electrode 141, a dielectric layer 142, and an upper barrier layer 143 may be formed on the first interlayer insulating layer IL1. Next, portions of the upper barrier layer 143 may be separated. Next, a second interlayer insulating layer IL2, a capping layer CL, and a fourth interlayer insulating layer IL4 may be formed. Next, a line trench LT and a plurality of third holes H3 may be formed. Next, an upper electrode 144, a word line WL, and a gate insulating layer 162 may be formed. Next, as shown in FIGS. 30A to 30C, a fifth interlayer insulating layer IL5 may be formed on the second interlayer insulating layer IL2 and the upper electrode 144 to fill the line trench LT and the third holes H3.

Referring to FIGS. 31A to 31C, a fourth holes H4 penetrating through the fifth interlayer insulating layer IL5 and the second interlayer insulating layer IL2 may be formed. A channel 161 may be formed in the fourth holes H4.

Referring to FIG. 3G, the channel 161 may be recessed and a bit line BL may be formed such that a contact portion BLa of the bit line BL is formed in a recessed space. A sixth interlayer insulating layer IL6 may be formed in contact with a line portion BLb of the bit line
BL. As a result, the memory device 103b shown in FIG. 3G may be manufactured.

Figure 32:
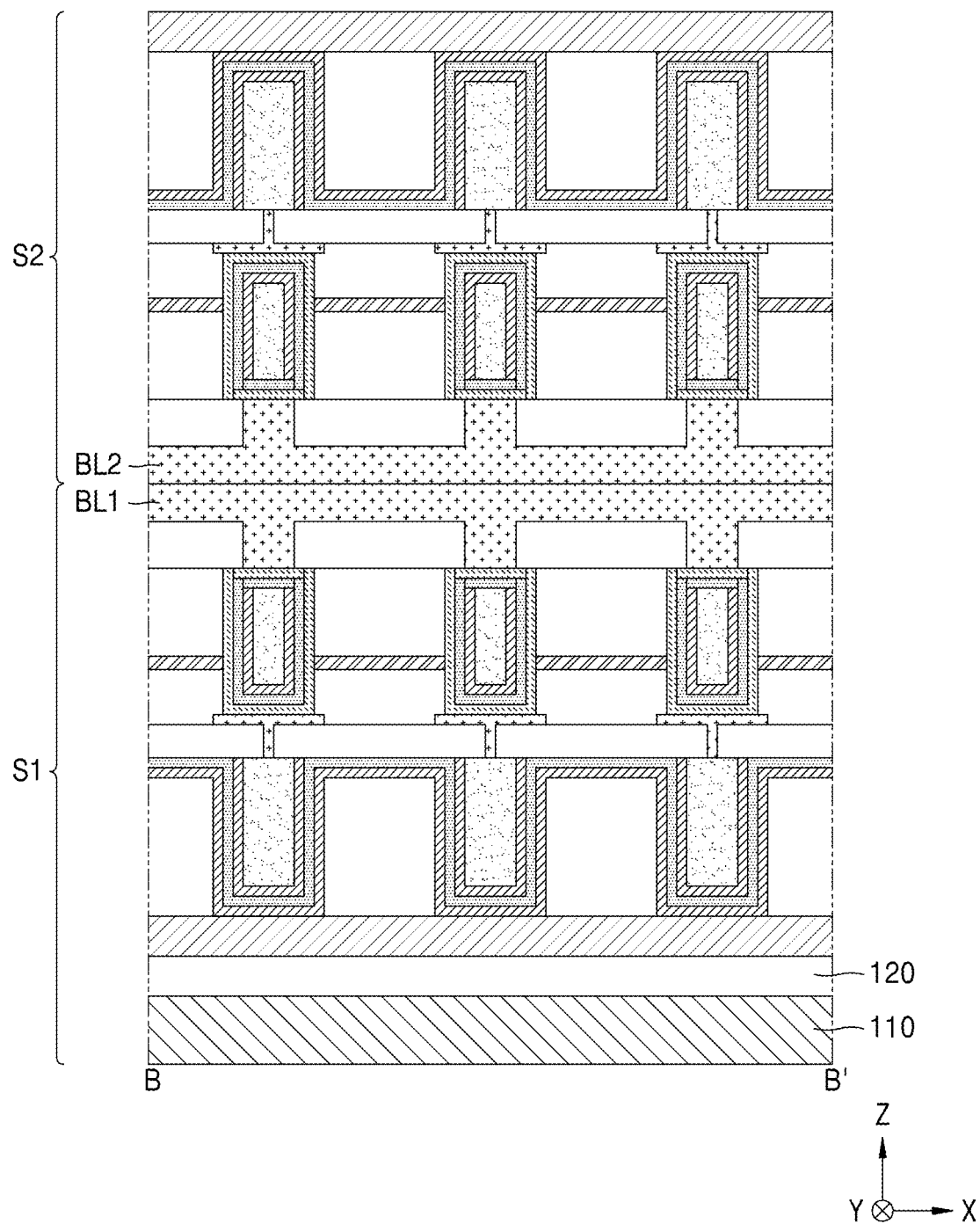
FIG. 32 is a cross-sectional view illustrating a memory device according to an example embodiment.
Figure 33:
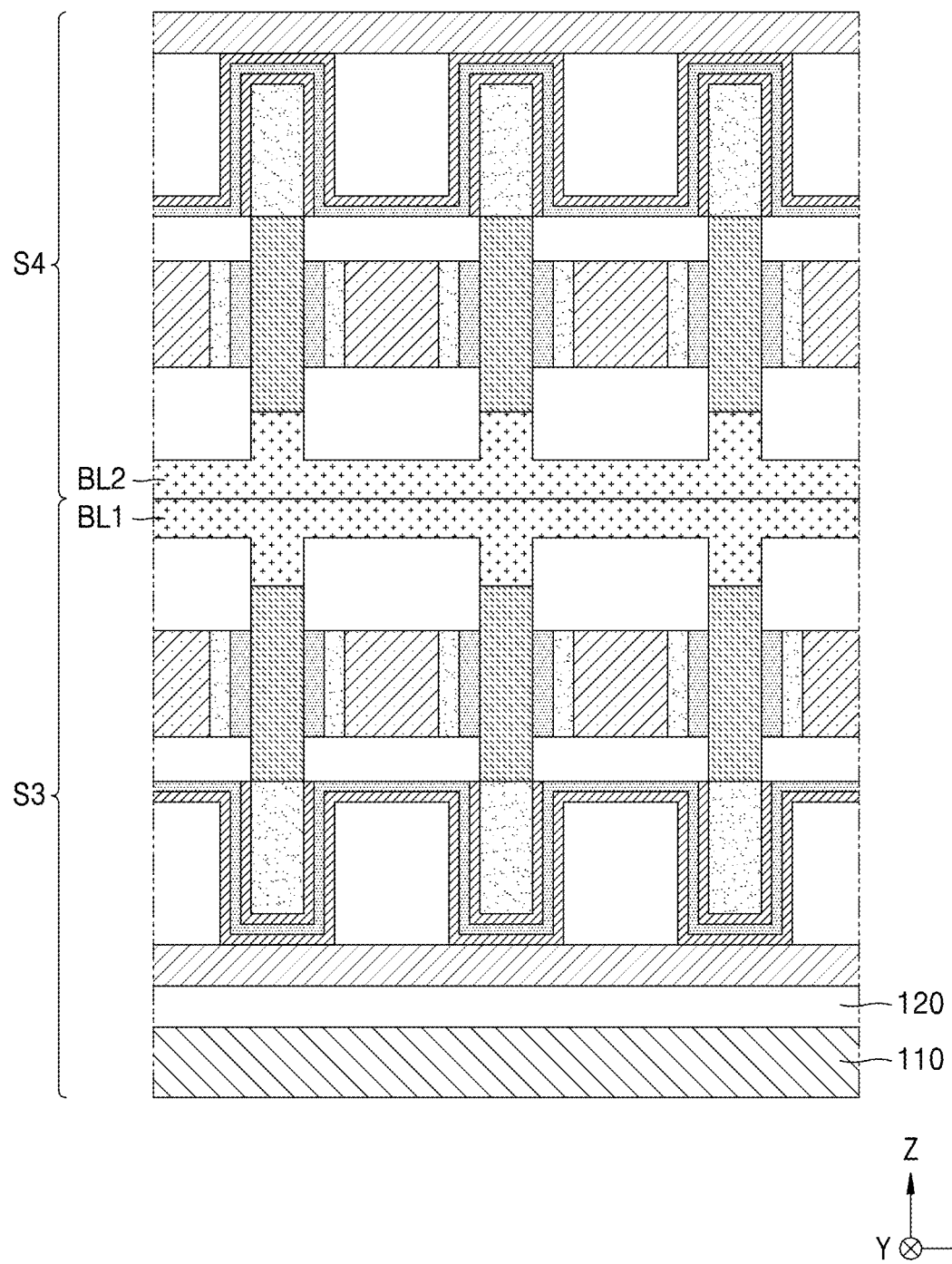
FIG. 33 is a cross-sectional view illustrating a memory device according to an example embodiment.

FIG. 32 is a cross-sectional view illustrating a memory device according to an example embodiment. FIG. 33 is a cross-sectional view illustrating a memory device according to an example embodiment.

Referring to FIG. 32, a second structure S2 may be stacked on a first structure S1. The first structure S1 may be the memory device 100 shown in FIGS. 2A to 2C. The second structure S2 may be a structure in which the substrate 110 and the lower insulating layer 120 may be removed from the memory device 100 illustrated in FIGS. 2A to 2C. The first structure S1 may be coupled to the second structure S2 such that a first bit line BL1 of the first structure S1 contacts a second bit line BL2 of the second structure S2. For example, two memory devices 100 may be manufactured according to the method described with reference to FIGS. 4A to 16C and FIGS. 2A to 2C, and the first structure S1 may be coupled to the second structure S2. The substrate 110 and/or the lower insulating layer 120 may then be removed from the second structure S2. By stacking the second structure S2 on the first structure S1, the degree of integration of the memory device may be improved.

FIG. 33 is a cross-sectional view illustrating a memory device according to an example embodiment.

Referring to FIG. 33, a fourth structure S4 may be stacked on a third structure S3. The third structure S3 may be one of the memory devices 103, 103a, and 103b described with reference to FIGS. 3A to 3G. The fourth structure S4 may be a structure in which the substrate 110 and the lower insulating layer 120 may be removed from the memory devices 103, 103a, and 103b described with reference to FIGS. 3A to 3G. The third structure S3 may be coupled to the fourth structure S4 such that a first bit line BL1 of the third structure S3 contacts a second bit line BL2 of the fourth structure S2. For example, two memory devices 103 may be manufactured according to the method described with reference to FIGS. 17A to 27C and FIGS. 3A to 3E, and the third structure S3 may be coupled to the fourth structure S4. The substrate 110 and/or the lower insulating layer 120 may then be removed from the fourth structure S4. By stacking the fourth structure S4 on the third structure S3, the degree of integration of the memory device may be improved.

While example embodiments have been described, it will be understood that various changes in form and details may be made therein without departing from the spirit and scope of the disclosure as set forth in the following claims.

What is claimed is:

1. A memory device comprising:
   a substrate;
   a memory unit provided on the substrate;
   a channel provided on the memory unit;
   a word line surrounded by the channel and extending in a first horizontal direction;
   a gate insulating layer interposed between the channel and the word line; and
   a bit line contacting an upper end of the channel and extending in a second horizontal direction that crosses the first horizontal direction.

2. The memory device of claim 1, wherein the channel comprises an oxide semiconductor.

3. The memory device of claim 2, wherein the channel comprises indium-gallium-zinc-oxide (IGZO).

4. The memory device of claim 1, further comprising a memory unit contact that electrically connects the memory unit to the channel.

5. The memory device of claim 1, wherein the channel comprises:
   a first portion provided on a first side of the word line;
   a second portion provided on a second side of the word line;
   a third portion provided on a lower surface of the word line; and
   a fourth portion on an upper surface of the word line.

6. The memory device of claim 1, wherein the memory unit comprises:
   a lower electrode;
   an upper electrode; and
   a dielectric layer interposed between the lower electrode and the upper electrode.

7. The memory device of claim 6, wherein the upper electrode has a column shape.

8. A memory device comprising:
   a substrate;
   a lower electrode provided on the substrate;
   an upper electrode provided on the lower electrode;
   a dielectric layer provided between the lower electrode and the upper electrode;
   a memory unit contact provided on the upper electrode;
   a channel comprising a first portion and a second portion, each of the first portion and the second portion extending from the memory unit contact in a vertical direction perpendicular to a first horizontal direction;
   a word line extending in the first horizontal direction and passing between the first portion and the second portion of the channel;
   a gate insulating layer interposed between the channel and the word line; and
   a bit line contacting upper ends of the first portion and the second portion of the channel and extending in a second horizontal direction perpendicular to the vertical direction.

9. The memory device of claim 8, wherein the channel further comprises:
   a third portion interposed between the memory unit contact and the word line; and
   a fourth portion between the bit line and the word line.

10. The memory device of claim 9, wherein the word line comprises:
    a line portion extending in the first horizontal direction; and
    a contact portion protruding from the line portion toward the third portion of the channel along the vertical direction.

11. A memory device comprising:
    a substrate;
    a lower electrode provided on the substrate;
    a dielectric layer provided on the lower electrode;
    a plurality of upper electrodes provided on the dielectric layer;

a plurality of channels respectively provided on the plurality of upper electrodes and extending in a vertical direction;

a plurality of word lines respectively provided on sides of the plurality of channels and extending in a first horizontal direction perpendicular to the vertical direction;

a plurality of gate insulating layers respectively interposed between the plurality of channels and the plurality of word lines; and a bit line contacting upper ends of the plurality of channels and extending in a second horizontal direction that crosses the first horizontal direction and is perpendicular to the vertical direction.

12. The memory device of claim 11, wherein the dielectric layer is provided on a side surface and a lower surface of each of the plurality of upper electrodes.

13. The memory device of claim 11, further comprising an interlayer insulating layer located on the substrate and having a plurality of holes,
wherein the lower electrode is provided on an upper surface of the interlayer insulating layer, and on a side and a bottom of each of the plurality of holes of the interlayer insulating layer, and
the plurality of upper electrodes are respectively provided in the plurality of holes of the interlayer insulating layer.

14. The memory device of claim 13, further comprising a ground plate interposed between the substrate and the interlayer insulating layer.

15. The memory device of claim 11, wherein each of the plurality of channels comprises:
a first portion provided on a first side of each of the plurality of word lines; and
a second portion provided on a second side of each of the plurality of word lines, wherein the second side is opposite the first side.

16. The memory device of claim 11, wherein each of the plurality of word lines comprises:
a first portion provided on a first side of each of the plurality of channels; and
a second portion provided on a second side of each of the plurality of channels, wherein the second side is opposite the first side.

17. The memory device of claim 11, wherein a dimension of each of the plurality of gate insulating layers in the vertical direction corresponds to a dimension of each of the plurality of word lines in the vertical direction.

18. The memory device of claim 11, further comprising a capping layer provided on a side of each of the plurality of word lines,
wherein a dimension of the capping layer in the vertical direction corresponds to a dimension of each of the plurality of word lines in the vertical direction.

19. The memory device of claim 11, wherein the bit line comprises:
a line portion extending in the second horizontal direction; and
a plurality of contact portions respectively protruding from the line portion along the vertical direction and respectively contacting the upper ends of the plurality of channels, and
wherein a dimension of each of the plurality of contact portions in the second horizontal direction corresponds to a dimension of each of the plurality of channels in the second horizontal direction.

20. The memory device of claim 11, wherein each of the plurality of word lines and each of the plurality of upper electrodes comprise a same material.

* * * * *